US009082602B2

(12) United States Patent
Shchepunov et al.

(10) Patent No.: US 9,082,602 B2
(45) Date of Patent: Jul. 14, 2015

(54) MASS ANALYSER PROVIDING 3D ELECTROSTATIC FIELD REGION, MASS SPECTROMETER AND METHODOLOGY

(71) Applicant: SHIMADZU CORPORATION, Nakagyo-chu, Kyoto (JP)

(72) Inventors: Vyacheslav Shchepunov, Manchester (GB); Roger Giles, Manchester (GB)

(73) Assignee: SHIMADZU CORPORATION, Kyoto (JP)

( * ) Notice: Subject to any disclaimer, the term of this patent is extended or adjusted under 35 U.S.C. 154(b) by 0 days.

(21) Appl. No.: 14/351,703

(22) PCT Filed: Oct. 19, 2012

(86) PCT No.: PCT/GB2012/052593

§ 371 (c)(1), (2) Date: Apr. 14, 2014

(87) PCT Pub. No.: WO2013/057505

PCT Pub. Date: Apr. 25, 2013

(65) Prior Publication Data

US 2014/0291503 A1 Oct. 2, 2014

(30) Foreign Application Priority Data

Oct. 21, 2011 (GB) .................................. 1118279.7

(51) Int. Cl.

*H01J 49/40* (2006.01)
*H01J 37/00* (2006.01)

(Continued)

(52) U.S. Cl.

CPC ............... *H01J 49/062* (2013.01); *H01J 49/40* (2013.01); *H01J 49/408* (2013.01); *H01J 49/4245* (2013.01)

(58) Field of Classification Search

CPC ..... H01J 49/40; H01J 49/4245; H01J 49/062; H01J 49/0031; H01J 49/004; H01J 49/025; H01J 49/282; H01J 49/38; H01J 49/406; H01J 49/408; H01J 49/425; H01J 37/3007; H01J 37/3171

USPC .............. 250/282, 287, 290, 396 R, 291, 294

See application file for complete search history.

(56) References Cited

U.S. PATENT DOCUMENTS

| | | | |
|---|---|---|---|
| 3,576,992 | A | 5/1971 | Moorman et al. |
| 6,300,625 | B1 | 10/2001 | Ishihara |

(Continued)

FOREIGN PATENT DOCUMENTS

| | | | |
|---|---|---|---|
| EP | 1 665 326 | B1 | 4/2010 |
| GB | 2 080 021 | A | 1/1982 |

(Continued)

OTHER PUBLICATIONS

Michisato Toyoda, et al., "Multi-turn time-of-flight mass spectrometers with electrostatic sectors", Journal of Mass Spectrometry, 2003, pp. 1125-1142, vol. 38.

(Continued)

*Primary Examiner* — David A Vanore

(74) *Attorney, Agent, or Firm* — Sughrue Mion, PLLC

(57) ABSTRACT

A mass analyzer for use in a mass spectrometer. The mass analyzer has a set of electrodes including electrodes arranged to form at least one electrostatic sector, the set of electrodes being spatially arranged to be capable of providing an electrostatic field in a reference plane suitable for guiding ions along a closed orbit in the reference plane, wherein the set of electrodes extend along a drift path that is locally orthogonal to the reference plane and that curves around a reference axis so that, in use, the set of electrodes provide a 3D electrostatic field region. The mass analyzer is configured so that, in use, the 3D electrostatic field region provided by the set of electrodes guides ions having different initial coordinates and velocities along a single predetermined 3D reference trajectory that curves around the reference axis.

22 Claims, 32 Drawing Sheets

(51) Int. Cl.
*H01J 49/06* (2006.01)
*H01J 49/42* (2006.01)

(56) References Cited

U.S. PATENT DOCUMENTS

| | | | | |
|---|---|---|---|---|
| 7,196,324 | B2 * | 3/2007 | Verentchikov | 250/287 |
| 7,385,187 | B2 | 6/2008 | Verentchikov et al. | |
| 7,425,699 | B2 | 9/2008 | Makarov et al. | |
| 7,728,290 | B2 * | 6/2010 | Makarov | 250/297 |
| 7,928,372 | B2 * | 4/2011 | Yamaguchi et al. | 250/291 |
| 7,932,487 | B2 | 4/2011 | Kovtoun et al. | |
| 8,637,815 | B2 * | 1/2014 | Makarov et al. | 250/290 |
| 8,658,984 | B2 * | 2/2014 | Makarov et al. | 250/396 R |
| 8,841,631 | B1 * | 9/2014 | Sinclair et al. | 250/396 R |
| 2005/0242279 | A1 | 11/2005 | Verentchikov | |
| 2006/0076484 | A1 * | 4/2006 | Brown et al. | 250/290 |
| 2006/0214100 | A1 * | 9/2006 | Verentchikov et al. | 250/287 |
| 2007/0194223 | A1 | 8/2007 | Sato et al. | |
| 2009/0314934 | A1 | 12/2009 | Brown | |
| 2010/0148061 | A1 | 6/2010 | Yamaguchi et al. | |
| 2011/0133073 | A1 * | 6/2011 | Sato et al. | 250/282 |
| 2013/0068942 | A1 * | 3/2013 | Verenchikov | 250/282 |
| 2014/0061458 | A1 * | 3/2014 | Baykut | 250/282 |
| 2014/0175274 | A1 * | 6/2014 | Makarov et al. | 250/282 |
| 2014/0291503 | A1 * | 10/2014 | Shchepunov et al. | 250/282 |

FOREIGN PATENT DOCUMENTS

| | | | |
|---|---|---|---|
| GB | 2 455 977 | A | 7/2009 |
| GB | 2476964 | A | 7/2011 |
| GB | 2477007 | A | 7/2011 |
| SU | 1725289 | A1 | 4/1992 |
| WO | 2004/008481 | A1 | 1/2004 |
| WO | 2005/001878 | A2 | 1/2005 |
| WO | 2006/102430 | A2 | 9/2006 |
| WO | 2008/047891 | A2 | 4/2008 |
| WO | 2009/081143 | A2 | 7/2009 |
| WO | 2010/008386 | A1 | 1/2010 |
| WO | 2011/086430 | A1 | 7/2011 |
| WO | 2011/135477 | A1 | 11/2011 |

OTHER PUBLICATIONS

H. Wollnik, "Mass separators", Nuclear Instruments and Methods in Physics Research, 1987, pp. 289-296, A258.

H. Wollnik, et al., "An energy-isochronous multi-pass time-of-flight mass spectrometer consisting of two coaxial electrostatic mirrors", International Journal of Mass Spectrometry, 2003, pp. 217-222, vol. 227.

Vyacheslav Shchepunov, "Doughnut Multi-reflecting Time-of-Flight Mass Spectrometer", Shimadzu, Jun. 18, 2010, 1 page.

S. G. Alikhanov, "A New Impulse Technique for Ion Mass Measurements", J. Exptl. Theoret. Phys. (U.S.S.R.), Sep. 1956, pp. 517-518, vol. 31.

B. A. Mamyrin, et al., "The mass-reflectron, a new nonmagnetic time-of-flight mass spectrometer with high resolution", Sov. Phys. JETP, Jul. 1973, pp. 45-48, vol. 37, No. 1.

A. Casares, et al., "Multipass time-of-flight mass spectrometers with high resoloving powers", International Journal Mass Spectrometry, 2001, pp. 267-273, vol. 206.

Ching-Shen Su, "Multiple reflection type time-of-flight mass spectrometer with two sets of parallel-plate electrostatic fields", International Journal Mass Spectrometry and Ion Processes, 1989, pp. 21-28, vol. 88.

W. P. Poschenrieder, "Multiple-focusing time-of-flight mass spectrometers part II. TOFMS with equal energy acceleration", International Journal of Mass Spectrometry and Ion Physics, 1972, pp. 357-373, vol. 9.

H. Matsuda, et al., "Particle flight times through electrostatic and magnetic sector fields and quadrupoles to second order", International Journal of Mass Spectrometry and Ion Physics, 1982, pp. 157-168, vol. 42.

T. Sakurai, et al., "Ion optics for time-of-flight mass spectrometers with multiple symmetry", International Journal of Mass Spectrometry and Ion Processes, 1985, pp. 273-287, vol. 63.

T. Sakurai, et al., "A new time-of-flight mass spectrometer", International Journal of Mass Spectrometry and Ion Processes, 1985, pp. 283-290, vol. 66.

T. Sakurai, et al, "A new multi-passage time-of-flight mass spectrometer at JAIST", Nuclear Instruments and Methods in Physics Research, 1999, pp. 182-186, vol. 427, Section A.

Michisato Toyoda, et al, "Construction of a new multi-turn time-of-flight mass spectrometer" Journal of Mass Spectrometer, 2000, pp. 163-167, vol. 35.

Daisuke Okumura, et al., "A Simple Multi-Turn Time of Flight Mass Spectrometer 'MULTUM II'", J. Mass Spectrom. Soc. Jpn., 2003, pp. 349-353, vol. 51, No. 2.

Hisashi Matsuda, "Electrostatic Analyzer with Variable Focal Length", Review of Scientific Instruments, 1961, pp. 850-852, vol. 32.

Morio Ishihara, et al., "Perfect space and time focusing ion optics for multiturn time of flight mass spectrometers", International Journal of Mass Spectrometry, 2000, pp. 179-189, vol. 197.

N. S. Oakey, et al., "An electrostatic particle guide for high resolution charged particle spectrometry in intense reactor fluxes", Nuclear Instruments and Methods, 1967, pp. 220-228, vol. 49.

Hisashi Matsuda, "Spiral Orbit Time of Flight Mass Spectrometer", J. Mass. Spectrom. Soc. Jpn., 2000, pp. 303-305, vol. 48, No. 5.

Takaya Satoh, et al., "Development of a High-Performance MALDI-TOF Mass Spectrometer Utilizing a Spiral Ion Trajectory", J. Am. Soc. Mass Spectrom., 2007, pp. 1318-1323, vol. 18.

Toru Sakurai, et al., "Ion optics of a high resolution multipassage mass spectrometer with electrostatic ion mirrors", Nuclear Instruments and Methods in Physics Research, 1995, pp. 473-476, vol. A363, Section A.

Lisheng Yang, et al., "Confinement of injected beam ions in a Kingdon trap", Nuclear Instruments & Methods in Physics Research B, May 1991, pp. 1185-1187, vol. I, Part II.

J. M. B. Bakker, "The Spiratron", Adv. Mass Spectrom., 1971, pp. 278-282, vol. 5.

* cited by examiner

Multi-pass TOF spectrometer (T. Sakurai, et al, 1999)

Multi-turn TOF spectrometers (M. Ishihara, 2001)

Left, MULTUM Linear plus (M. Toyoda, et al, 2000).
Right, MULTUM II (D. Okumara, et al, 2003)

The Spiratron (Bakker, 1999).

MALDI-TOF mass spectrometer utilizing a spiral ion trajectory (Satoh, et al, 2007)

MASS ANALYSER PROVIDING 3D ELECTROSTATIC FIELD REGION, MASS SPECTROMETER AND METHODOLOGY

This invention relates to a mass analyser for use in a mass spectrometer, to a mass spectrometer including such a mass analyser, and to associated methods.

BACKGROUND

Time-of-flight mass spectrometers (TOF MS) are widely used in modern mass spectrometry due to their high sensitivity, mass resolving power and mass accuracy. Achieving mass resolving power in the order of 100,000 or higher at ion charge throughput >$10^9$ ions per sec and infinite mass range are typical requirements to modern TOF MS instruments. Mass resolving power of early TOF MS instruments was generally of the order of only a few hundred due to short flight times and large time spreads caused by initial spatial and velocity spreads of ions. Impressive progress in TOF mass spectrometry over the last 50+ years has at least in part been due to development of pulsed ion sources capable of generating very short ion bunches with small transverse emittances, employing elongated ion trajectories (folded between ion mirrors or multi-turn in sector fields) allowing much higher flight times and hence mass resolving power at acceptable instrument size and inventing advanced electrode geometries providing electrostatic fields with improved isochronous properties minimizing time spreads caused by optical aberrations. Simultaneously, progress in accuracy of electrode mechanical designs and particularly in development of stabilized high voltage power supplies has been useful for achieving mass accuracy of TOF MS at or under part-per-million level.

Electrostatic TOF MS instruments can in general be divided into two groups. The first group, which is the most widely used, generally employs ion mirrors to provide folded ion trajectories due to multi-reflections (MR) or a single reflection. Those are usually referred to as, respectively, MR-TOF MSs or reflectrons. The second group, which is usually noticeably smaller than the first one, generally uses electrostatic sector fields to provide single-turn or multi-turn (MT) isochronous motion of ions. In the latter case, such mass spectrometers can be referred to as MT-TOF MSs. The popularity of ion mirrors can be explained by their simpler, compared to sector fields, mechanical designs and smaller time spreads introduced by optical aberrations. Apart from purely mirror or purely sector field TOF MS's some authors have proposed hybrid instruments that include both mirrors and sector fields. Compared to purely sector field TOF MSs optical aberrations in hybrid instruments can often be minimized more efficiently.

The use of a coaxial ion mirror for compensation of energy dependency of the flight time was first proposed by Alikhanov [Alikhanov, S. G. Sov. Phys. JETP, 1956, 4, 452-453]. He also proposed to use multi-reflections to elongate the overall flight path of ions. The proposed mirror was later realized by Mamyrin in reflectron TOF MS [Mamyrin, B. A. et al. Sov. Phys. JETP, 1973, 37, 45]. Practical implementation of the idea of multi-reflections was achieved recently [Casares, A. et al. Int. J. Mass Spectrom. 206(3), 267-273] using the analyser with coaxial ion mirrors and closed reference trajectory [Wollnik, H. and Casares, A. Int. J. Mass Spectrom. 227(2), 217-222]. The idea of forming an open jig-saw trajectory folded between mirrors [Wollnik, H. UK patent GB2080021, 1981] was later applied to TOF MS systems with planar mirrors employing grids [Shing-Shen, Su. Int. J. Mass Spectrom. Ion Processes 88, 21-28, 1989] or gridless [Nazarenko, L. M. et al. USSR Patent SU1725289, 1992]. The proposed planar systems did not provide focusing in the drift direction. The drift focusing problem was solved by adding a set of focusing lenses in the drift space between mirrors [Verentchikov, A. N., et al. Patent WO2005001878] or, alternatively, providing periodic field variation in the drift direction inside planar mirrors [Verentchikov, A. N. and Yavor, M. I. Patent WO 2010/008386].

An energy isochronous TOF mass spectrometer using an electrostatic sector instead of an ion mirror was proposed by Moorman and Parmater [U.S. Pat. No. 3,576,992, 1971]. Poschenrieder considered several energy isochronous TOF MS systems using electrostatic sector fields. He also proposed to close ion trajectories into loops in a MT-TOF MS consisting of electrostatic sector fields [Poschenrieder, W. P. Int. J. Mass Spectrom. Ion Phys., 9, 357-373, 1972]. Matsuda studied TOF properties of sector fields and quadrupoles including $2^{nd}$ order aberrations [Matsuda, H. et al. Int. J. Mass Spectrom. Ion Phys., 42, 157-168, 1982]. Sacurai further proposed several geometries of TOF MS systems possessing symmetry [Sacurai, T et al. Int. J. Mass Spectrom. Ion Phys., 63, 273-287, 1985] and a TOF mass spectrometer built with four cylindrical sectors [Sacurai, T. et al. Int J. Mass Spectrom. Ion Phys., 66, 283-290, 1985] Later Sakurai et al. designed and constructed a large MT-TOF MS "OVAL" consisting of six electrostatic sectors forming an elliptical closed orbit of 7.4 m [Sakurai, et al, Nucl. Instrum. & Meth. A, 427, 182-186, 1999]. Almost simultaneously, a compact MT-TOF MS "MULTUM linear plus" consisting of four cylindrical electrostatic sectors and 16 electrostatic quadrupole lenses was developed [Toyoda, M. et al, J. Mass Spectrom., 35, 163-167, 2000]. The figure-eight-shaped dosed ion orbit had a flight path length of 1.308 m per turn. A high mass resolving power of 350,000 was reported for 501.5 turns of m/z=28 ions. In the next version of the spectrometer called "MULTUM II" [Okumura, D. et al J. Mass Spectrom. Soc. Jpn., 51, 349-353, 2003] the structure was simplified by replacing cylindrical electrostatic sectors with toroidal ones having Matsuda plates [Matsuda, H. Rev. Sci. Instrum., 32, 850-852, 1961] and eliminating quadrupole lenses. The design of both the "MULTUMs" was based on the ideas of 'perfect space and energy focusing' [Ishihara, M. et al. Int. J. Mass Spectrom., 197, 179-189, 2000; Toyoda, M. et al. J. Mass Spectrom., 38, 1125-1142, 2003]. Several other MT-TOF MS instruments with dosed orbits were proposed by M. Ishihara [U.S. Pat. No. 6,300,625, 2001], Sh. Yamaguchi, et al [U.S. Pat. No. 7,928,372, 2011] and V. Kovtoun, et al [U.S. Pat. No. 7,932,487, 2011].

All MT-TOF mass spectrometers with closed orbits have a common drawback. After a certain number of turns ions with mass/charge ratio $m_1/z_1$ are overtaken by faster ions with $m_2/z_2<m_1/z_1$, which have passed more turns as compared to the ions of the first group, the effect called "overtaking". Unambiguous identification of masses from TOF spectra in the presence of overtaking is a complicate problem. There are three main ways of solving the problem, (i) by limiting the mass range of injected ions inversely proportionally to the number of turns, (ii) by deciphering TOF spectra in the presence of overtaking and (iii) designing MT-TOF MS with an open reference trajectory (orbit). While the first approach results in very undesirable mass range limitation and the second approach has mass identification problems, the third approach of building an instrument with open trajectories does not have such problems.

The first proposal of a MT-TOF MS based on an open spiral like trajectory was put forward by Bakker in Spiratron [Bakker, J. M. B. Ph.D. Thesis, University of Warwick, 1969]. Two years earlier a simple TOF mass spectrometer with spiral trajectories was reported by Oakey and MacFarlane [Oakey, N. S., and MacFarlane, R. D. Nucl. Instr. & Meth., 49, 220-228, 1967]. In 2000 Matsuda proposed two types of TOF mass spectrometers with a corkscrew type and a mosquito-coil type open trajectories. [Matsuda, H. J. Mass Spectrom. Soc. Jpn. 2000, 48(5), 303-305, 2000]. Recently, Satoh, et al developed and built a MT-TOF MS instrument with open spiral like trajectories [Satoh, et al. J. Am. Soc. Mass Spectrom. 18, 1318-1323, 2007]. It comprises fifteen "MULTUM II" units, each having four toroidal sectors, passed by ions consecutively along a 17 m long reference orbit. Each unit is based on ion optics of "MULTUM II" with the "perfect space and energy focusing". Mass resolving power up to 80,000 was reported. Later, an updated version of the spiral MT-TOF MS was disclosed by Satoh, et al in Patent US2011/0133073 A1. The idea of consecutive passage of ions through several isochronous units built with sector fields was also used in other proposed MT-TOF MS embodiments [Brown, J. M. Patent US 2009/0314934 and Yamaguchi, Sh. and Nishiguchi, M. Patent US 2010/0148061].

Hybrid multi-pass mass spectrometers (MP-TOF MS) including both electrostatic ion mirrors and sector fields were also proposed by some authors. Sakurai considered a MP-TOF MS with closed orbit, which additionally comprises a dipole magnet, in [Sakurai, T. and Baril, M. Nucl. Instr. and Meth. A363, 473-476, 1995]. Verentchikov and Yavor proposed a planar system with open trajectories consisting of a planar mirror and spatially isochronous sector fields [Patent WO 2006/102430]. Most recently a wider class of hybrid mass spectrometers was proposed by Verenchikov [Patent WO 2011/086430].

To provide high mass resolving power a TOF mass analyser must generally be "isochronous", i.e. be configured to provide "isochronicity" for ions travelling along a given trajectory. The given trajectory may be open or closed.

Herein, "isochronicity" for ions travelling along a given trajectory is preferably understood as meaning that the flight time for ions travelling between two points on the trajectory is substantially independent of at least one spatial coordinate/velocity component of the ions. By substantially, it is preferably understood that mathematically the flight time is independent of said coordinates to at least the first order terms of a Taylor expansion, see below for further explanation.

Two distinct types of isochronicity are considered herein. "Spatial isochronicity" for ions travelling along a given trajectory is preferably understood as meaning that the flight time for ions travelling between two points, e.g. a start (initial) point and an end (final) point, on the trajectory is substantially independent of all the initial coordinates and velocities of the ions in a plane orthogonal to the trajectory (e.g. coordinates $\delta y_0$, $\delta z_0$ and velocities $v_{y0}$, $v_{z0}$ in FIG. 4C (Right)), unless otherwise indicated. "Energy isochronicity" for ions travelling along a given trajectory is preferably understood as meaning that the flight time for ions travelling between two points on the trajectory is substantially independent of the initial energy/velocity of the ions in the direction of the trajectory (e.g. energy=$K_{x0}$=$mv_{x0}/2$ in FIG. 4C (Right)).

"Isochronicity" may exist only between two specific points on the trajectory, or may be "periodic". "Periodic" (spatial and/or energy) isochronicity is preferably understood as meaning that the isochronicity repeats at regular (i.e. periodic) intervals on the given trajectory Isochronicity may be achieved by adjusting (e.g. voltage settings of) electrodes based on theory, preferably calculated to at least first order terms of a Taylor expansion of the flight time with respect to initial coordinates and velocities, and possibly calculated to a second order terms of a Taylor expansion. However, once calculated theoretically, further adjustments to (e.g. voltage settings of) electrodes may be made based e.g. on empirical evidence, e.g. so as to further minimise bunch widths in the flight direction at isochronous points and/or improve the mass resolving power of the mass analyser.

FIG. 1A-FIG. 1C, FIG. 2A and FIG. 2B give examples of known mass analysers, in which ions' oscillations around the planar closed orbit are spatially and energy isochronous. Extension of the planar motion in the third direction, realized in the spiral MT-TOF MS (FIG. 2B) to retain infinite mass range, transforms the figure-of-eight dosed orbit (FIG. 1C, right) into the 3-dimensional open reference trajectory. Isochronous properties are preserved in this system.

Herein, an electrostatic sector (which can also be referred to as an "electric sector") is preferably defined as an arrangement of at least two sheet electrodes curved in one or more directions and configured to have different potentials applied thereto so as to provide an electrostatic field therebetween for guiding ions along one or more planar or three-dimensional trajectories.

The present invention has been devised in light of the above considerations.

SUMMARY OF INVENTION

In general, some aspects of the invention relates to a mass analyser for use in a mass spectrometer, the mass analyser having a set of electrodes spatially arranged to be capable of providing an electrostatic field in a reference plane suitable for guiding ions along a closed orbit in the reference plane, wherein the set of electrodes extend along a drift path that is locally orthogonal to the reference plane and that curves around a reference axis so that, in use, the set of electrodes provide a 3D (three-dimensional) electrostatic field region.

As was realised by the present inventors, a more compact packing of ion trajectories in a drift direction is achievable if the electrodes extend along a curved drift path (see discussion below). In particular, more turns of an open trajectory and longer flight times can be achieved per a characteristic size L of an MT TOF MS mass analyser in which electrodes extend along a curve drift path compared with a system in which electrodes extend along a straight drift path (compare FIG. 5, Left and FIG. 5, Right). The overall length of the open trajectory per characteristic size L can be as large as 50-150 or larger, for example.

In a first aspect of the invention, a mass analyser is configured so that, in use, a 3D electrostatic field region provided by a set of electrodes guides ions having different initial coordinates and velocities along a single predetermined 3D (three-dimensional) reference trajectory that curves around a reference axis.

Accordingly, a first aspect of the invention may provide:

a mass analyser for use in a mass spectrometer, the mass analyser having:

a set of electrodes including electrodes arranged to form at least one electrostatic sector, the set of electrodes being spatially arranged to be capable of providing an electrostatic field in a reference plane suitable for guiding ions along a dosed orbit in the reference plane, wherein the set of electrodes extend along a drift path that is locally orthogonal to the reference plane and that curves around a reference axis so that, in use, the set of electrodes provide a 3D electrostatic field region;

wherein the mass analyser is configured so that, in use, the 3D electrostatic field region provided by the set of electrodes guides ions having different initial coordinates and velocities along a single predetermined 3D reference trajectory that curves around the reference axis.

By configuring the mass analyser to guide ions having different initial coordinates and velocities along a single predetermined 3D reference trajectory that curves around the reference axis, the reference trajectory is able to be more compactly packed than with more conventional electrode arrangements (compare FIG. 5, Left with FIG. 5, Right), thereby allowing the mass analyser to use a smaller volume of evacuated space, thereby allowing the size and weight of the mass analyser to be reduced.

To obtain a large improvement in the packing of the reference trajectory, the electrodes preferably extend along a drift path that curves substantially around the reference axis, preferably meaning that curvature in the drift direction is comparable with curvature in the reference plane (see for example FIG. 4E).

Here, it is to be understood that whilst ions having different initial coordinates and velocities should all be guided along a single predetermined 3D reference trajectory, the ions may in reality deviate slightly from that trajectory e.g. due to small variations in their initial position or velocity.

Also, it is to be understood that the predetermined 3D reference trajectory may have one or more straight (i.e. uncurved) portions, e.g. in which the set of electrodes does not curve the path of ions travelling along the predetermined 3D reference trajectory.

Configuring the mass analyser so that, in use, the 3D electrostatic field region provided by the set of electrodes guides ions having different initial coordinates and velocities along a single predetermined 3D reference trajectory that curves around the reference axis may be achieved by configuring the set of electrodes and/or an injection interface (if present, see below) so that, in use, the 3D electrostatic field region provided by the set of electrodes guides ions having different initial coordinates and velocities along a single predetermined 3D reference trajectory that curves around the reference axis. For example, an injection interface (if present, see below) may be configured to guide ions produced by an ion source to a location within the 3D electrostatic field region that is offset from the reference plane such that the ions are subsequently guided by the 3D electrostatic field region along the predetermined 3D reference trajectory (see e.g. the discussion relating to FIG. 4D below). Preferably, the set of electrodes include electrodes configured to provide drift focussing (e.g. as discussed in more detail below), as this can help to keep ions close to the predetermined 3D reference trajectory and/or to achieve full isochronicity increasing mass resolving power (see discussion below).

Whilst the set of electrodes is spatially arranged to be capable of providing an electrostatic field in a reference plane suitable for deflecting ions around a closed orbit in the reference plane, this does not mean that the set of electrodes actually has (e.g. voltage settings that have) been adjusted optimally for this purpose. This is because, e.g. configuring the mass analyser so that, in use, the 3D electrostatic field region is optimised to guide ions having different initial coordinates and velocities along a predetermined 3D reference trajectory that curves around the reference axis (e.g. optimised to provide isochronicity for such ions), will in general result in the electrostatic field region being not optimised to guide ions along a closed orbit in the reference plane (e.g. isochronicity may be lost for ions having such an orbit).

Also, whilst the set of electrodes is spatially arranged to be capable of providing an electrostatic field in a reference plane suitable for deflecting ions around a dosed orbit in the reference plane, this does not preclude the possibility of obstacles being placed in the path of the planar orbit so as to prevent ions from actually travelling along that closed orbit.

The 3D reference trajectory may be defined as extending between a start point and an end point. The start point of the 3D reference trajectory may be defined as a location at or inside the ion source. This point would typically be outside the ion source (if present) and outside of the mass analyser. The end point of the 3D reference trajectory may be defined as a location at or close to an ion detector for detecting ions that have been guided along the predetermined reference trajectory. This point may be outside or inside the mass analyser. Of course, both the start point and/or end point may be inside the mass analyser, e.g. if an ion source and/or ion detector are located inside the mass analyser.

Preferably, the set of electrodes is configured to provide isochronicity for ions travelling along the 3D reference trajectory between a start point of the 3D reference trajectory and an end point of the 3D reference trajectory. The isochronicity provided may be spatial isochronicity or energy isochronicity, but it is highly preferable for both spatial and energy isochronicity to be provided. The isochronicity provided may be periodic e.g. due to periodicity of ions motion inside the mass analyser.

The set of electrodes may be configured to provide spatial and/or energy isochronicity to at least the first order terms (perhaps even some or all of the second order terms) of a Taylor expansion for ions travelling between a start point of the 3D reference trajectory and an end point of the 3D reference trajectory.

Using the definition of "isochronicity" already provided, configuring the set of electrodes to provide isochronicity for ions travelling along the 3D reference trajectory between a start point of the 3D reference trajectory and an end point of the 3D reference trajectory can be understood as configuring the set of electrodes so that the flight time of ions travelling along the 3D reference trajectory between a start point of the 3D reference trajectory and an end point of the 3D reference trajectory is substantially independent of at least one spatial coordinate/velocity component of the ions at the start point of the 3D reference trajectory. As already noted above, spatial isochronicity is preferably understood as flight time being substantially independent of all the initial coordinates and velocities of the ions in a plane orthogonal to the 3D reference trajectory, unless otherwise indicated. As already noted above, energy isochronicity is preferably understood as flight time being substantially independent of the initial energy of the ions in the direction of the 3D reference trajectory.

In general, perfect isochronicity (flight time of ions travelling along a given trajectory being completely independent of all initial coordinates and velocities of the ions) for a given mass analyser cannot be achieved in practice. However, by carefully configuring the electrodes, it is normally possible to obtain isochronicity to a desired level. The level of isochronicity provided by a given mass analyser cannot in general be measured directly, but can be characterised, for example, by the mass resolving power (or time spread of ion bunches) of the mass analyser. Here, it should be noted that although the level of isochronicity may be characterised by a mass resolving power of a mass analyser, the mass resolving power will in general depend on other factors such as the size of the mass analyser, initial beam parameters, space charge forces between ions, etc.

Preferably, a mass analyser according to the first aspect of the invention provides a level of isochronicity such that the mass resolving power provided by the mass analyser is 40,000 or higher, more preferably 100,000 or higher. Here, it is to be recognised that the actual mass resolving power of a given mass analyser would not just be dependent on the level of isochronicity achieved, but also on other parameters such as the size of the mass analyser, initial beam parameters, space charge forces between ions, etc. Mass resolving powers of 200,000 and higher have been obtained in simulations with the mass analyser geometries disclosed herein, for example.

The set of electrodes preferably include electrodes configured to provide drift focussing (e.g. as discussed in more detail below), as this can help to achieve isochronicity (see discussion below).

The set of electrodes may be configured to provide isochronicity for ions travelling along the 3D reference trajectory between a start point of the 3D reference trajectory and an end point of the 3D reference trajectory according to the following method:

- adjusting the set of electrodes to provide isochronicity for ions travelling along a dosed orbit in the reference plane; and
- further adjusting the set of electrodes to provide isochronicity for ions travelling along the 3D reference trajectory between a start point of the 3D reference trajectory and an end point of the 3D reference trajectory.

The initial adjustment of the set of electrodes to provide isochronicity, preferably periodic isochronicity, for ions travelling along the dosed orbit in the reference plane may, for example, involve adjusting (e.g. voltage settings of) the set of electrodes to provide periodic spatial and/or energy isochronicity (preferably both) for ions travelling along a closed orbit in the plane (e.g. as calculated to at least first order terms of a Taylor expansion).

The further adjustment of the set of electrodes to provide isochronicity for ions travelling along the 3D reference trajectory between a start point of the 3D reference trajectory and an end point of the 3D reference trajectory may, for example, include adjusting (e.g. voltage settings of) the set of electrodes to provide spatial isochronicity for ions travelling along the 3D reference trajectory (e.g. as calculated to at least first order terms of a Taylor expansion), and then further adjusting (e.g. voltage settings of) the set of electrodes to additionally provide energy isochronicity for ions travelling along the 3D reference trajectory between a start point of the 3D reference trajectory and an end point of the 3D reference trajectory (e.g. as calculated to at least first order terms of a Taylor expansion), preferably in a manner that maintains the periodic spatial isochronicity.

Note that the further adjustment of the set of electrodes to provide isochronicity for ions travelling along the 3D reference trajectory disrupts the isochronicity for ions travelling along a closed orbit in the reference plane achieved by the initial adjustment of the set of electrodes.

Note also that whilst (e.g. voltage settings of) the set of electrodes may be adjusted based on theory (e.g. as calculated to at least first order terms of a Taylor expansion), further adjustments are preferably subsequently made to the electrodes based e.g. on empirical evidence, e.g. so as to further improve the mass resolving power of the mass analyser.

Preferably, the set of electrodes includes electrodes configured to provide drift focussing, e.g. to focus ions in a drift direction (which may be defined as a local direction of rotation about the reference axis, see below) at one or more locations along the predetermined 3D reference trajectory. Preferably, the focussing of ions is toward the 3D reference trajectory at the one or more locations along the 3D reference trajectory. This can help to keep ions close to the predetermined 3D reference trajectory (see e.g. FIG. 14B) and can also help to achieve isochronicity.

Preferably, the electrodes are configured to provide drift focussing by producing an electrostatic field whose potential has a non-zero (preferably positive) second order derivative and/or higher order derivatives producing focusing in a drift direction defined as a local direction of rotation about the reference axis.

The electrodes configured to provide drift focussing may for example include any one or more of:

- focussing lenses;
- a set of periodic or non-periodic lenses incorporated into or between electrodes of at least one electrostatic sector;
- a set of electrodes (which are preferably electrode segments) positioned periodically or non-periodically in a drift direction defined as a local direction of rotation about the reference axis;
- a pair of rotationally symmetric electrodes split into a number of small segments in a drift direction defined as a local direction of rotation about the reference axis; and/or
- a means of producing an electrostatic field whose potential has a non-zero (preferably positive) second order derivative and/or higher order derivatives producing focusing in a drift direction (preferably defined as a local direction of rotation about the reference axis).

As discussed above, having electrodes configured to provide drift focussing can be useful in guiding ions having different initial coordinates and velocities along a single predetermined 3D reference trajectory and can also be useful in providing isochronicity for ions travelling along the 3D reference trajectory between a start point of the 3D reference trajectory and an end point of the 3D reference trajectory. Some examples of electrodes configured to provide drift focussing are discussed below in more detail. As will become apparent from the examples discussed below, the mass analyser and predetermined 3D trajectory may take a number of different forms and geometries.

The geometry of the mass analyser can be defined with reference to the closed orbit in the reference plane, along which ions can be guided by the set of electrodes, which, as noted above, preferably include electrodes arranged to form at least one electrostatic sector, spatially arranged to be capable of providing an electrostatic field suitable for guiding ions along the closed orbit in the reference plane.

The closed orbit in the reference plane could be defined with its relationship to the reference axis, e.g. the closed orbit in the reference plane may:

- cross the reference axis at a single point;
- cross the reference axis at two points; or
- cross the reference axis at three or more points.

As another example, the closed orbit in the reference plane might not cross the reference axis (at any point).

A preferred geometry for the set of electrodes involves electrodes being configured such that the closed orbit in the reference plane is O-shaped, with the dosed orbit crossing the reference axis at two points. Note that the dosed orbit does not have to be a circle in order to be O-shaped, see e.g. FIG. 4B and FIG. 9A. This geometry would typically involve the set of electrodes including O-shaped electrodes arranged to form two coaxial shells, see e.g. FIG. 4A, FIG. 4B and FIG. 9B. This geometry is preferred because it is compact and simple to implement practically.

Accordingly, the set of electrodes preferably includes (e.g. O-shaped) electrodes arranged to form two coaxial shells.

Preferably, the set of electrodes is arranged to provide a continuous 3D electrostatic field region, i.e. such that the 3D electrostatic field region does not include two or more separate electrostatic field regions separated by a field free space (as taught by WO2011/086430, for example). Preferably, the set of electrodes does not include two parallel sets of electrodes separated by a field-free space (as taught by WO2011/086430, for example).

Preferably, the set of electrodes and voltage settings of the set of electrodes has mirror symmetry with respect to a mid-plane orthogonal to the reference axis. Preferably, the set of electrodes include electrodes arranged to form at least one electrostatic sector that crosses the mid-plane. These features may help in attaining spatial isochronicity and simplify mechanical design of the electrodes.

The set of electrodes preferably extend along a drift path that curves around the reference axis at a constant radius of curvature. Preferably, therefore, the set of electrodes and/or voltage settings of the set of electrodes have rotational symmetry about the reference axis. These features are preferred to avoid very complicated electrode shapes that might be required in absence of such symmetry. Because the reference axis may be an axis of rotational symmetry for the electrodes, the reference axis may be referred to as a "common" axis of rotational symmetry, or more simply as a "common" axis.

In some embodiments, the set of electrodes may extend completely (i.e. 3600) around the reference axis, e.g. so as to maximise the length of the predetermined 3D trajectory (see e.g. FIGS. 11A-C). In other embodiments, the set of electrodes may not extend completely (i.e. 3600) around the reference axis, e.g. occupying only a limited sector area around the reference axis (see e.g. FIG. 12). In the latter case, the free space occupied by the trajectories in the drift direction can be used e.g. for placing elements for ion injection and extraction, wires, auxiliary mechanical and vacuum elements etc.

The geometry of the mass analyser can be further defined with reference to the predetermined 3D reference trajectory.

The 3D reference trajectory may be an open trajectory or a closed trajectory. In this context, a "closed" 3D reference trajectory preferably refers to a trajectory along which a reference ion moving along the 3D reference trajectory returns to substantially the same point at substantially the same velocity. Conversely, an "open" 3D reference trajectory preferably refers to a trajectory along which a reference ion moving along the 3D reference trajectory does not return to substantially the same point at substantially the same velocity.

The 3D reference trajectory may include multiple turns, in which case the mass analyser may be viewed as a "multi turn" mass analyser. A turn may be considered as a portion of the 3D reference trajectory that corresponds to a single closed orbit in the reference plane, were it not for curvature of the 3D reference trajectory around the reference axis.

The packing of turns of the predetermined 3D reference trajectory may be characterised by a drift angle ($\alpha$). The drift angle ($\alpha$) may be defined with reference to a drift plane that is orthogonal to the reference axis, as being the angle between the projection of the 3D reference trajectory on the drift plane at two points of the reference trajectory separated by half a turn.

The drift angle ($\alpha$) may be chosen to make the 3D reference trajectory either open or dosed.

The packing of turns may also be characterised by a drift speed of ions, the drift speed being the component of the velocity of ions in the drift direction. Preferably, the drift speed is substantially smaller than the speed of the ions in the direction of the predetermined 3D reference trajectory, e.g. so that the turns of the predetermined 3D reference trajectory are closely packed, e.g. so that the drift angle ($\alpha$) is small (e.g. 10° or less).

The mass analyser may be configured as a TOF mass analyser and/or an E-Trap mass analyser. A TOF mass analyser may be viewed as a mass analyser for separating ions according to their mass-to-charge ratios due to dependency of their times of flight through the mass analyser on their mass-to-charge ratios. An E-Trap mass analyser may be viewed as a mass analyser for trapping ions in one or more orbits. In an E-Trap mass spectrometer, the mass-to-charge ratios of ions can be measured using an image current detection technique.

In the case of the mass analyser being configured as a TOF mass analyser, the predetermined 3D reference trajectory may be open or closed. Having a closed predetermined reference trajectory may be advantageous to extend the path length ions travel in the TOF mass analyser.

The mass analyser may be configured to have a "multi pass" mode of operation in which ions are guided along a predetermined 3D reference trajectory, which has a dosed portion, with the ions repeating the closed portion of the predetermined 3D reference trajectory multiple times, thereby increasing the overall flight time (see e.g. FIG. 11A-B). Here, each repeated closed portion of the 3D reference trajectory can be viewed as a "pass".

The mass analyser may (alternatively or additionally) be configured to have a "quasi multi pass" mode in which ions are guided along an open predetermined 3D reference trajectory, with the ions repeating a portion of the open predetermined 3D reference trajectory multiple times, with each repeated portion being rotated by a small angle (e.g. 5° or less) around the reference axis with respect to a previous and/or next repeated portion (see e.g. FIG. 10C). Here, each repeated portion of the 3D reference trajectory can be viewed as a "quasi pass". Note that in the "quasi multi pass" mode, the 3D reference trajectory is open, such that a reference ion moving along the 3D reference trajectory does not return to substantially the same point.

In a "multi pass" or "quasi multi pass" mode, an extraction interface (if present, see below) is preferably for guiding ions from the mass analyser to the ion detector, after the ions have completed a predetermined number of "passes" or "quasi passes" within the TOF mass analyser.

In the case of the mass analyser being configured as an E-Trap mass analyser, the predetermined 3D reference trajectory is preferably closed, preferably with the mass analyser operating in a "multi-pass" mode (see above).

The mass analyser may have one or more deflectors configured to, in use, reverse the drift of the ions around the reference axis, e.g. from clockwise to anticlockwise. This may help to extend the predetermined 3D reference trajectory. Some example implementations are described below (see e.g. FIG. 16B).

The mass analyser preferably has at least one fringe field corrector configured to compensate for electrostatic field distortions caused by termination of the set of one or more electrodes (e.g. in a drift direction) in an area where ions enter and/or leave the mass analyser. The or each fringe field corrector may respectively be included in the injection interface and/or extraction interface (described below), for example.

The or each fringe field corrector may e.g. include:

a set of wire tracks on a printed circuit board, each track having a respective Individual potential, e.g. with the distribution of potentials over the wire tracks being defined by a resistor chain dividing potential difference between two electrodes of an electrostatic sector whose electrostatic field is to be corrected; or a high resistance (e.g. $10^{10}\Omega$ or higher) conductive material electrically connected to two main electrodes of an electrostatic sector whose electrostatic field is to be corrected.

The mass analyser may be included in a mass spectrometer. Accordingly, the first aspect of the invention may provide:

a mass spectrometer having:

an ion source for producing ions having different initial coordinates and velocities;

optionally, an injection interface for guiding ions produced by the ion source into the mass analyser, a mass analyser, e.g. as described herein;

optionally, an extraction interface for guiding ions from the mass analyser to an ion detector;

an ion detector for detecting ions produced by the ion source after they have travelled along the single predetermined 3D reference trajectory.

The ion source may be located within an envelope defined by the spatially arranged set of electrodes, in which case the optional injection interface may be omitted.

The ion detector may be located within an envelope defined by the spatially arranged set of electrodes, in which case the optional extraction interface may be omitted.

Preferably, the mass spectrometer has an injection interface for guiding ions produced by an ion source (e.g. at a start point of the 3D reference trajectory) into the mass analyser. The injection interface may be curved, preferably with the mass spectrometer being configured to provide isochronicity for ions guided by the injection interface. The injection interface may be uncurved, preferably with the mass spectrometer being configured to provide isochronicity for ions guided by the injection interface. The injection interface may include any one or more of: multipole lenses; focussing lenses; and deflectors; for focussing, deflecting, and/or shifting ions produced by the ion source. Some examples are discussed below in more detail.

Preferably, the mass spectrometer has an extraction interface for guiding ions from the mass analyser to an ion detector (e.g. at an end point of the 3D reference trajectory). The extraction interface may be curved, preferably with the mass spectrometer being configured to provide isochronicity for ions guided by the extraction interface. The extraction interface may be uncurved, preferably with the mass spectrometer being configured to provide isochronicity for ions guided by the extraction interface. The extraction interface may include any one or more of: multipole lenses; focussing lenses; and deflectors; for focussing, deflecting, and/or shifting ions produced by the ion source. Some examples are discussed below in more detail.

An injection interface and extraction interface could be useful e.g. if the ion source and ion detector are located outside of the mass analyser. However, the ion source and/or ion detector may be located inside an outer boundary of the mass analyser (e.g. as shown in FIG. 12), in which case an injection interface and/or extraction interface may not be required.

The mass spectrometer may have a processing apparatus for acquiring mass spectrum data representative of the mass/charge ratio of ions produced by the ion source based on an output of the ion detector.

The ion source may include a vacuum ionisation source or an atmospheric pressure ion source.

Preferably, the ion source is configured to produce ions having different initial coordinates and velocities in short bunches, e.g. with each bunch of ions being produced in a short period of time, e.g. within a period of 1 nanosecond (or less). Such bunches can be produced using a pulsed ion source, e.g. a MALDI ion source, or an Orthogonal TOF ion source, a 2D or 3D ion trap devices.

Ion bunches may be selected using any one of; an orthogonal gate, a MALDI ion source, an RF ion guide, an RF ion trap.

The ion detector may include a time of flight ion detector for producing an output representative of the time of flight (through the mass analyser) of ions produced by the ion source and/or an image current ion detector for producing an output representative of an image current caused by ions produced by the ion source.

If the mass analyser is configured as a TOF mass analyser (see above), the processing apparatus is preferably for acquiring mass spectrum data representative of the mass/charge ratio of ions produced by the ion source based on an output of the TOF ion detector. Methods for acquiring data in this manner are well known in the art.

If the mass analyser is configured as an E-Trap mass analyser (see above), the processing apparatus is preferably for acquiring mass spectrum data representative of the mass/charge ratio of ions produced by the ion source based on an analysis, e.g. a Fourier analysis, of the output representative of an image current caused by ions produced by the ion source. Methods for acquiring data in this manner are well known in the art.

An example high resistance conductive material is conductive glass.

The first aspect of the invention may also provide a method of configuring a mass analyser (or mass spectrometer) according to the first aspect of the invention.

For example, the first aspect of the invention may provide:

a method of configuring a mass analyser having:

a set of electrodes including electrodes arranged to form at least one electrostatic sector, the set of electrodes being spatially arranged to be capable of providing an electrostatic field in a reference plane suitable for guiding ions along a closed orbit in the reference plane, wherein the set of electrodes extend along a drift path that is locally orthogonal to the reference plane and that curves around a reference axis so that, in use, the set of electrodes provide a 3D electrostatic field region;

wherein the method includes:

configuring the mass analyser so that, in use, the 3D electrostatic field region provided by the set of electrodes guides ions having different initial coordinates and velocities along a single predetermined 3D reference trajectory that curves around the reference axis.

The method may include any method step implementing or corresponding to any apparatus feature described in connection with any above aspect of the invention.

For example, the method may include configuring the set of electrodes and/or an injection interface (if present) so that, in use, the 3D electrostatic field region provided by the set of electrodes guides ions having different initial coordinates and velocities along a single predetermined 3D reference trajectory that curves around the reference axis, e.g. in a manner described above.

For example, the method may include configuring the set of electrodes to provide (e.g. spatial and/or energy) isochronicity for ions travelling along the 3D reference trajectory between a start point of the 3D reference trajectory and an end point of the 3D reference trajectory, e.g. in a manner described above, e.g. by:

adjusting the set of electrodes to provide isochronicity for ions travelling along a closed orbit in the reference plane; and further adjusting the set of electrodes to provide isochronicity for ions travelling along the 3D reference trajectory between a start point of the 3D reference trajectory and an end point of the 3D reference trajectory.

The first aspect of the invention may also provide a method corresponding to using a mass analyser (or mass spectrometer) according to the first aspect of the invention.

For example, the first aspect of the invention may provide:

A method of operating a mass analyser, the method including:

providing a 3D electrostatic field region using a set of electrodes including electrodes arranged to form at least one electrostatic sector, the set of electrodes being spatially arranged to be capable of providing an electrostatic field in a reference plane suitable for guiding ions along a closed orbit in the reference plane, wherein the set of electrodes extend along a drift path that is locally orthogonal to the reference plane and that curves around a reference axis;

guiding ions having different initial coordinates and velocities along a single predetermined 3D reference trajectory that curves around the reference axis.

The method may include any method step implementing or corresponding to any apparatus feature described in connection with the first aspect of the invention.

For example, the method may include any one or more of the following steps:

producing ions having different mass to charge ratios, e.g. using an ion source;

guiding the ions produced by the ion source into the mass analyser, e.g. using an injection interface;

guiding the ions from the mass analyser to an ion detector, e.g. using an extraction interface;

acquiring mass spectrum data representative of the mass/charge ratio of ions produced by the ion source based on an output of the ion detector.

The first aspect of the invention may provide a computer-readable medium having computer-executable instructions configured to cause a processing apparatus (e.g. including a computer) to perform a method described herein.

A second aspect of the invention relates to a mass analyser according to the first aspect of the invention, but without the mass analyser being configured so that, in use, the 3D electrostatic field region provided by the set of electrodes guides ions having different initial coordinates and velocities along a single predetermined 3D reference trajectory that curves around the reference axis.

The second aspect of the invention may therefore provide:

A mass analyser for use in a mass spectrometer, the mass analyser having:

a set of electrodes including electrodes arranged to form at least one electrostatic sector, the set of electrodes being spatially arranged to be capable of providing an electrostatic field in a reference plane suitable for guiding ions along a dosed orbit in the reference plane, wherein the set of electrodes extend along a drift path that is locally orthogonal to the reference plane and that curves around a reference axis so that, in use, the set of electrodes provide a 3D electrostatic field region.

As in the first aspect of the invention, the set of electrodes preferably include electrodes arranged to form at least one electrostatic sector, the set of electrodes being spatially arranged to be capable of providing an electrostatic field in the reference plane suitable for guiding ions along a closed orbit in the reference plane.

Instead of the mass analyser being configured so that, in use, the 3D electrostatic field region provided by the set of electrodes guides ions having different initial coordinates and velocities along a single predetermined 3D reference trajectory that curves around the reference axis, the (e.g. set of electrodes of) the mass analyser may instead be configured so that, in use, the 3D electrostatic field region provided by the set of electrodes guides ions having different initial coordinates and velocities along different 3D trajectories that curve around the reference axis. Such a configuration may be useful if the mass analyser is configured as an E-Trap mass analyser, for example.

Preferably, the set of electrodes are configured to provide at least partial (e.g. partial spatial and/or energy, preferably partial spatial and energy) isochronicity for ions travelling along different trajectories that curve around the reference axis. Isochronicity (preferably partial spatial and energy isochronicity) is highly preferable as it helps to achieve a good mass resolving power.

The second aspect of the invention may provide a mass analyser having any feature or combination of features described in connection with the first aspect of the invention, but without the mass analyser being configured so that, in use, the 3D electrostatic field region provided by the set of electrodes guides ions having different initial coordinates and velocities along a single predetermined 3D reference trajectory that curves around the reference axis.

For example, the electrodes may be configured such that the closed orbit in the reference plane is O-shaped, with the closed orbit crossing the reference axis at two points, e.g. with the set of electrodes including O-shaped electrodes arranged to form two coaxial shells.

For example, the set of electrodes may be arranged to provide a continuous 3D electrostatic field region, i.e. such that the 3D electrostatic field region does not include two or more separate electrostatic field regions separated by a field free space (in contrast to the teaching of WO2011/086430, for example). For example, the set of electrodes might not include two parallel sets of electrodes separated by a field-free space (in contrast to the teaching of WO2011/086430, for example).

The second aspect of the invention may also provide a method of configuring a mass analyser according to the second aspect of the invention. For example, the second aspect of the invention may provide:

a method of configuring a mass analyser having:

a set of electrodes including electrodes arranged to form at least one electrostatic sector, the set of electrodes being spatially arranged to be capable of providing an electrostatic field in a reference plane suitable for guiding ions along a closed orbit in the reference plane, wherein the set of electrodes extend along a drift path that is locally orthogonal to the reference plane and that curves around a reference axis so that, in use, the set of electrodes provide a 3D electrostatic field region;

wherein the method optionally includes:

configuring the mass analyser so that, in use, the 3D electrostatic field region provided by the set of electrodes guides ions having different initial coordinates and velocities along 3D trajectories that curve around the reference axis, that are different for ions having different initial coordinates and velocities.

Preferably, the method may include configuring the set of electrodes to provide at least partial (e.g. partial spatial and/or energy, preferably both) isochronicity for ions travelling along different trajectories that curve around the reference axis. Isochronicity (preferably partial spatial and energy isochronicity) is highly preferable as it helps to achieve a good mass resolving power.

The method may include any method step implementing or corresponding to any apparatus feature described in connection with any above aspect of the invention.

The second aspect of the invention may also provide a method corresponding to an apparatus according to the first aspect of the invention. For example, the second aspect of the invention may provide:

a method of operating a mass analyser, the method including:

providing a 3D electrostatic field region using a set of electrodes including electrodes arranged to form at least one electrostatic sector, the set of electrodes being spatially arranged to be capable of providing an electrostatic field in a reference plane suitable for guiding ions along a closed orbit in the reference plane, wherein the set of electrodes extend along a drift path that is locally orthogonal to the reference plane and that curves around a reference axis;

any operational steps described with reference to any aspect of the invention.

The method may include any method step implementing or corresponding to any apparatus feature described in connection with the first aspect of the invention.

A third aspect of the invention relates to a mass analyser including at least one fringe field corrector configured to compensate for electrostatic field distortions caused by termination of a set of one or more electrodes of the mass analyser in an area where ions enter and/or leave the mass analyser.

Accordingly, the third aspect of the invention may provide:

a mass analyser for use in a mass spectrometer the mass analyser having:

a set of electrodes including electrodes arranged to form at least one electrostatic sector, the set of electrodes being configured so that, in use, an electrostatic field region provided by the set of electrodes guides ions having different initial coordinates and velocities along a single (optionally closed) predetermined reference trajectory:

at least one fringe field corrector configured to compensate for electrostatic field distortions caused by termination of the set of one or more electrodes in an area where ions enter and/or leave the mass analyser.

Note that if the predetermined reference trajectory is dosed, the mass analyser can be considered to be a “multi pass” mass analyser.

The set of electrodes may be configured as described in connection with the first and second aspects of the invention, but this need not be the case. The mass analyser may have any feature or combination of features described in connection with the first or second aspects of the invention, but without necessarily using the same configuration of electrodes.

For example, the or each fringe field corrector may e.g. Include:

a set of wire tracks on a printed circuit board, each track having a respective individual potential, e.g. with the distribution of potentials over the wire tracks being defined by a resistor chain dividing potential difference between two electrodes of an electrostatic sector whose electrostatic field is to be corrected; or a high resistance (e.g. $10^{10}\Omega$ or higher) conductive material electrically connected to two main electrodes of an electrostatic sector whose electrostatic field is to be corrected.

An example high resistance conductive material is conductive glass.

The third aspect of the invention may also provide a method corresponding to the above described mass analyser.

A fourth aspect of the invention relates to a mass analyser including electrodes configured to provide drift focussing.

Accordingly, the fourth aspect of the invention may provide:

a mass analyser for use in a mass spectrometer, the mass analyser having:

a set of electrodes including electrodes arranged to form at least one electrostatic sector, the set of electrodes being spatially arranged to be capable of providing an electrostatic field in a reference plane suitable for guiding ions along a closed orbit in the reference plane, wherein the set of electrodes extend along a drift path that is locally orthogonal to the reference plane (and that optionally curves around a reference axis) so that, in use, the set of electrodes provide a 3D electrostatic field region;

wherein the mass analyser is configured so that, in use, the 3D electrostatic field region provided by the set of electrodes guides ions having different initial coordinates and velocities along a single (preferably closed) predetermined 3D reference trajectory (that optionally curves around the reference axis);

wherein the set of electrodes preferably include electrodes configured to provide drift focussing.

Note that the predetermined reference trajectory is closed, so the mass analyser can be considered to be a “multi pass” mass analyser.

The set of electrodes may be configured as described in connection with the first, second or third aspects of the invention, but this need not be the case. The mass analyser may have any feature or combination of features described in connection with the first or second aspects of the invention, but without necessarily using the same configuration of electrodes.

For example, the electrodes configured to provide drift focussing may for example include any one or more of:

focussing lenses;

a set of periodic or non-periodic lenses incorporated into or between electrodes of at least one electrostatic sector a set of electrodes (which are preferably electrode segments) positioned periodically or non-periodically in a drift direction defined as a local direction of rotation about the reference axis;

a pair electrodes, extended in a drift direction defined as a local direction of the drift path, split into a number of small segments in a drift direction defined as a local direction of rotation about the reference axis; and/or a means of producing an electrostatic field whose potential has a non-zero (preferably positive) second order derivative and/or higher order derivatives producing focusing in a drift direction defined as a local direction of rotation about the reference axis.

The fourth aspect of the invention may also provide a method corresponding to the above described mass analyser.

The invention also includes any combination of the aspects and preferred features described except where such a combination is clearly impermissible or expressly avoided. Any of the following examples may be combined with any aforementioned aspect of the invention. A method of configuring or a method corresponding to any of the following examples may also be provided.

As an example combination of the aspects mentioned above, the invention may provide:

a TOF mass spectrometer having:

an ion source for producing ions having different initial coordinates and velocities;

optionally, an injection interface for guiding ions produced by the ion source into the mass analyser;

a mass analyser having a set of electrodes including electrodes arranged to form at least one electrostatic sector, the set of electrodes being spatially arranged to be capable of providing an electrostatic field in a reference plane suitable for guiding ions along a dosed orbit in the reference plane, wherein the set of electrodes extend along a drift path that is locally orthogonal to the reference plane and that curves around a reference axis so that, in use, the set of electrodes provide a 3D electrostatic field region, wherein the mass analyser is configured so that, in use, the 3D electrostatic field region provided by the set of electrodes guides ions having different initial coordinates and velocities along a single predetermined 3D reference trajectory that curves around the reference axis;

optionally, an extraction interface for guiding ions from the mass analyser to an ion detector;

a time of flight ion detector for producing an output representative of the time of flight through the mass analyser of ions produced by the ion source;

a processing apparatus for acquiring mass spectrum data representative of the mass/charge ratio of ions produced by the ion source based on an output of the time of flight ion detector.

As another example, the invention may provide:

an E-Trap mass spectrometer having:

an ion source for producing ions having different initial coordinates and velocities;

optionally, an injection interface for guiding ions produced by the ion source into the mass analyser;

a mass analyser having a set of electrodes including electrodes arranged to form at least one electrostatic sector, the set of electrodes being spatially arranged to be capable of providing an electrostatic field in a reference plane suitable for guiding ions along a dosed orbit in the reference plane, wherein the set of electrodes extend along a drift path that is locally orthogonal to the reference plane and that curves around a reference axis so that, in use, the set of electrodes provide a 3D electrostatic field region;

optionally, an extraction interface for guiding ions from the mass analyser to an ion detector;

an image current ion detector for producing an output representative of an image current caused by ions produced by the ion source:

wherein the mass analyser is configured so that, in use, the 3D electrostatic field region provided by the set of electrodes guides ions having different initial coordinates and velocities along a single predetermined 3D reference trajectory that curves around the reference axis.

As another example, the invention may provide:

an E-Trap mass spectrometer having:

an ion source for producing ions having different initial coordinates and velocities;

optionally, an injection interface for guiding ions produced by the ion source into the mass analyser;

a mass analyser having a set of electrodes including electrodes arranged to form at least one electrostatic sector, the set of electrodes being spatially arranged to be capable of providing an electrostatic field in a reference plane suitable for guiding ions along a closed orbit in the reference plane, wherein the set of electrodes extend along a drift path that is locally orthogonal to the reference plane and that curves around a reference axis so that, in use, the set of electrodes provide a 3D electrostatic field region;

an image current ion detector for producing an output representative of an image current caused by ions produced by the ion source;

wherein the mass analyser is configured so that, in use, an electrostatic field region providing by the set of electrodes guides ions having different initial coordinates and velocities along different 3D trajectories that curve around the reference axis.

In this example, an extraction interface is not preferred, since it is difficult to extract ions that do not follow a predetermined trajectory.

In the case of an E-Trap mass spectrometer, the E-trap mass spectrometer preferably includes a processing apparatus for acquiring mass spectrum data representative of the mass/charge ratio of ions produced by the ion source based on an analysis of the output representative of an image current caused by ions produced by the ion source.

The mass analyser of an above-described E-Trap mass spectrometer may e.g. be configured to have a multi pass and/or a quasi multi pass mode.

DRAWINGS

Examples of our proposals are discussed below, with reference to the accompanying drawings in which:

FIG. 1A-FIG. 1C show examples of known mass analysers.

FIG. 2A and FIG. 2B also show examples of known mass analysers.

Figure 4A:
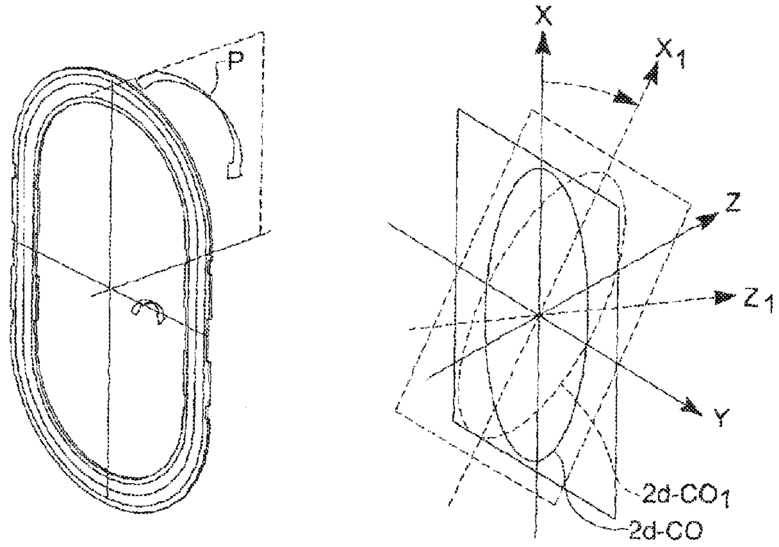
FIG. 4A shows O-shaped planar electrodes extending along a drift path that curves around a reference axis.
Figure 4B:
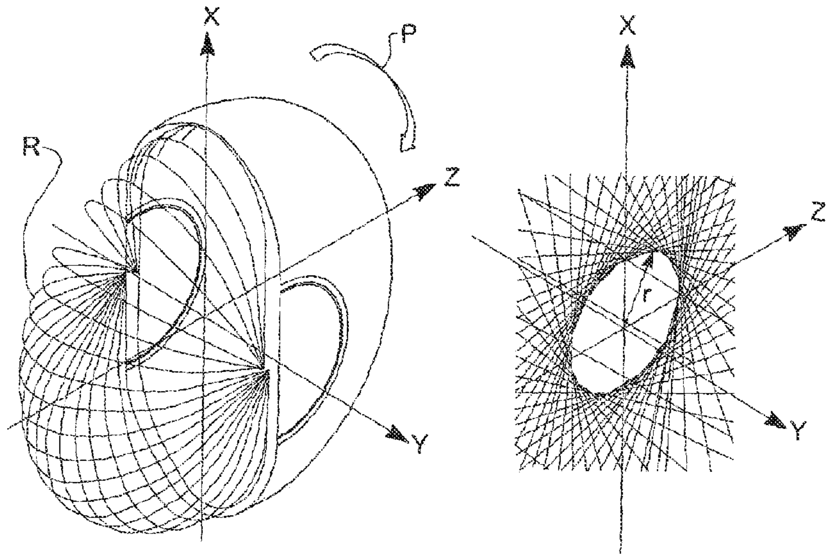
FIG. 4B shows O-shaped electrodes that are rotationally symmetric around a reference axis with a predetermined open 3D reference trajectory (3D cut view, Left) and a predetermined 3D reference trajectory near a reference axis (Right).
Figure 4C:
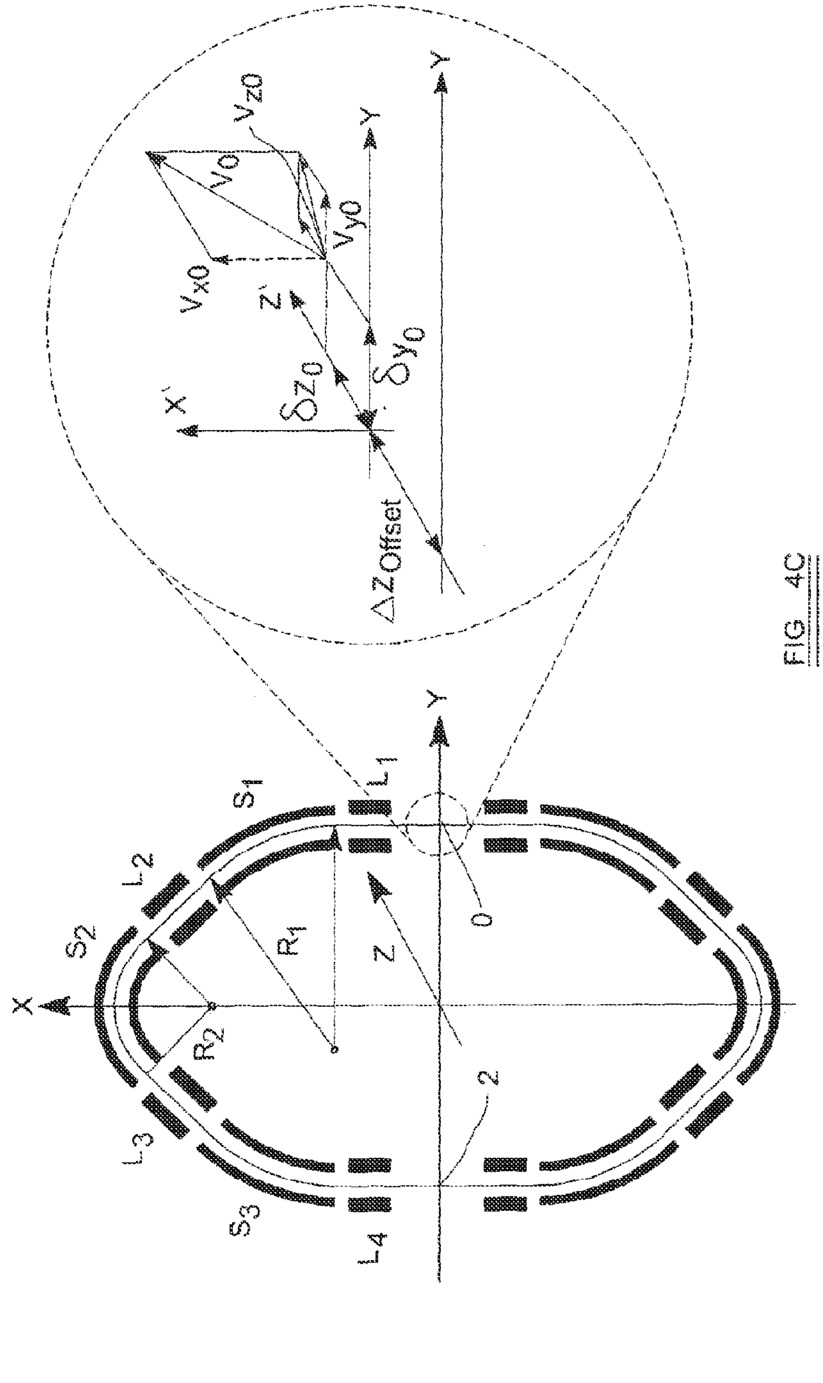

FIG. 4C schematically shows an example of an O-shaped isochronous planar closed orbit.

Figure 4D:
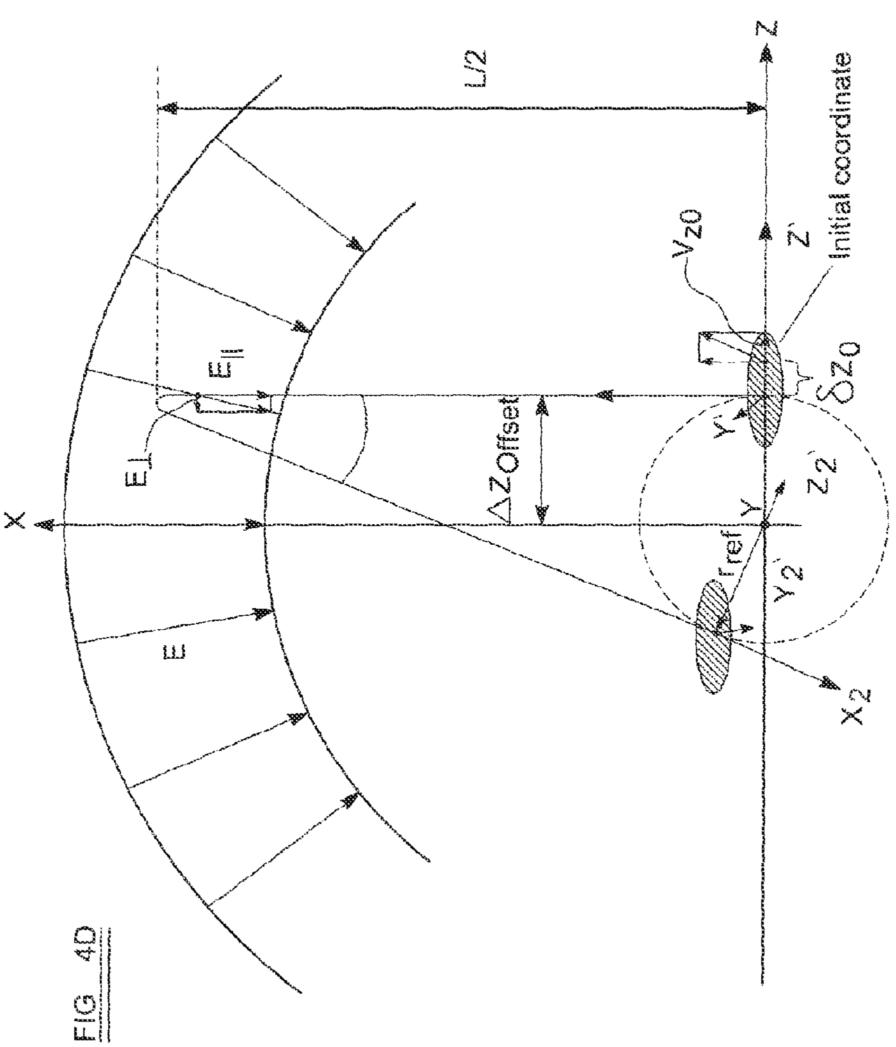

FIG. 4D schematically shows a predetermined open 3D reference trajectory (a half-turn) projected on a drift plane for an O-shaped planar orbit.

Figure 4E:
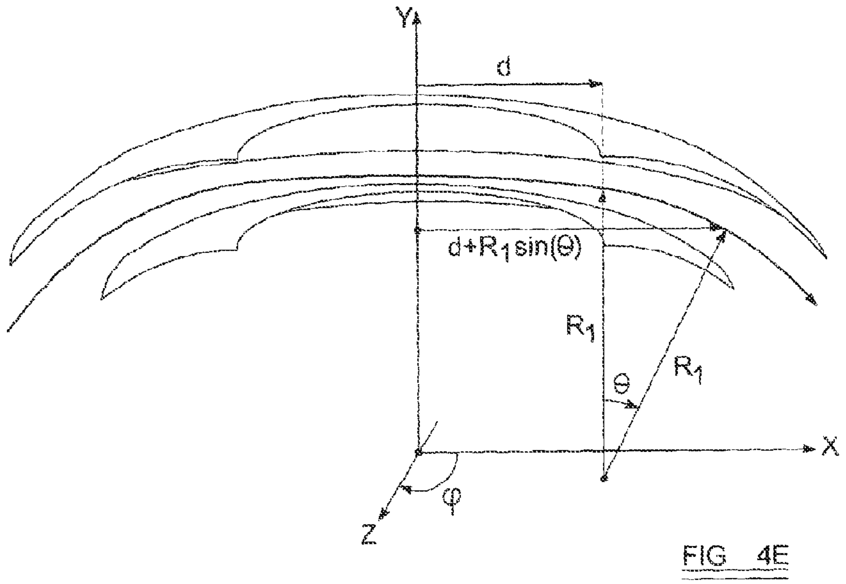

FIG. 4E shows electrodes of sectors $S_1$ ($S_3$) from FIG. 4C with a planar closed orbit.

Figure 4F:
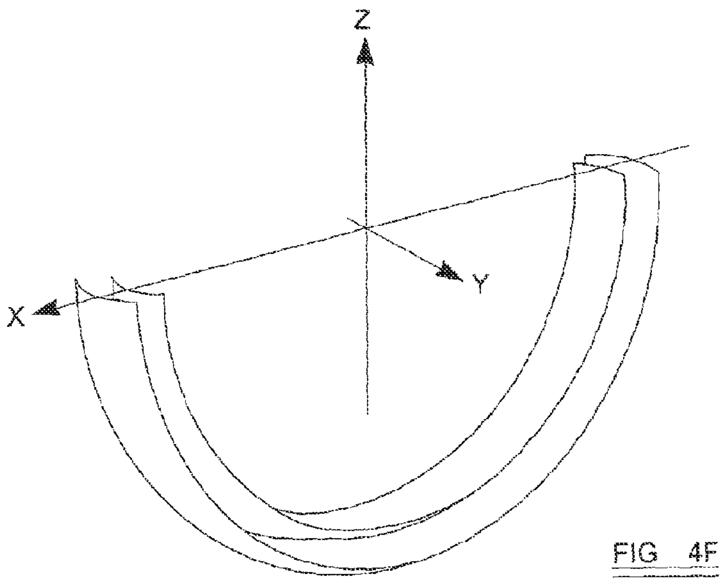

FIG. 4F is a 3D cutaway view of the electrodes of the sector $S_2$ in FIG. 4C.

Figure 4G:
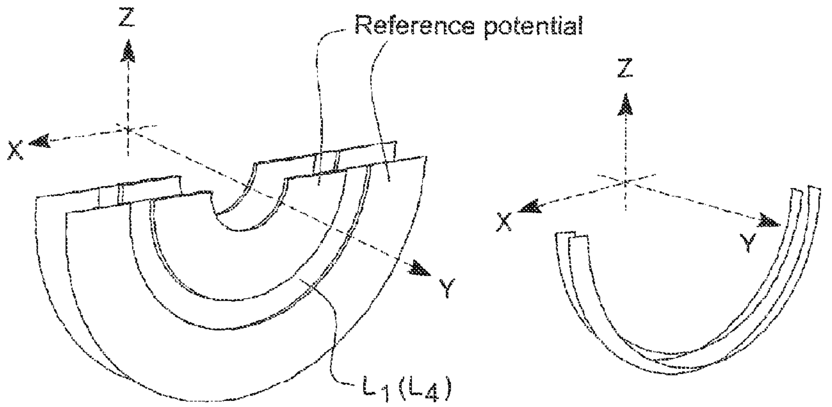

FIG. 4G is a 3D cutaway view of the $L_1$ ($L_4$) electrodes of the lenses in FIG. 4C (Left) and of the $L_2$ ($L_3$) electrodes of the lenses in FIG. 4C (Right).

Figure 4H:
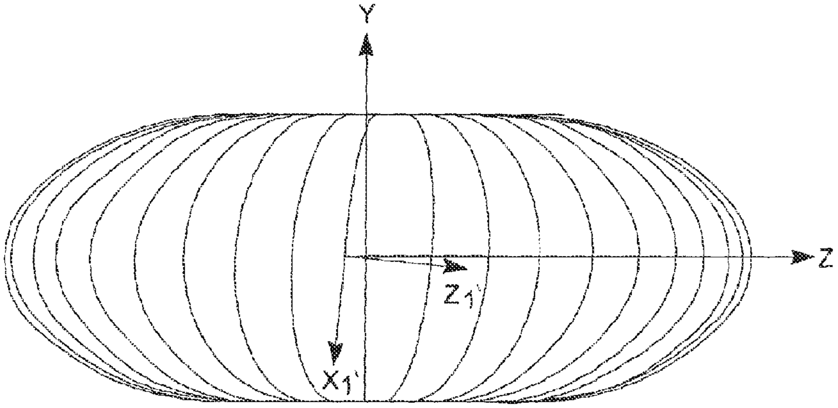

FIG. 4H shows the predetermined 3D reference trajectory for the electrodes shown in FIG. 4B.

Figure 5:
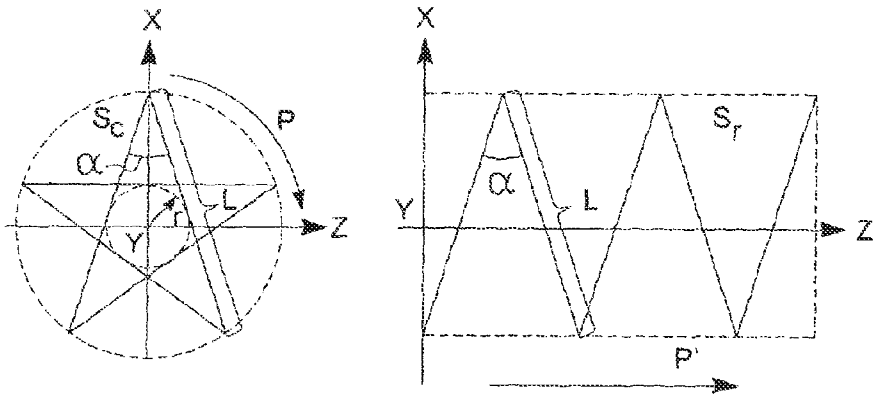

FIG. 5 is a projection of a predetermined 3D reference trajectory on a drift plane for rotationally symmetric electrodes that extend along a drift path that curves around a reference axis at a constant radius of curvature (Left) and electrodes that extend along a linear drift path (Right).

Figure 6:
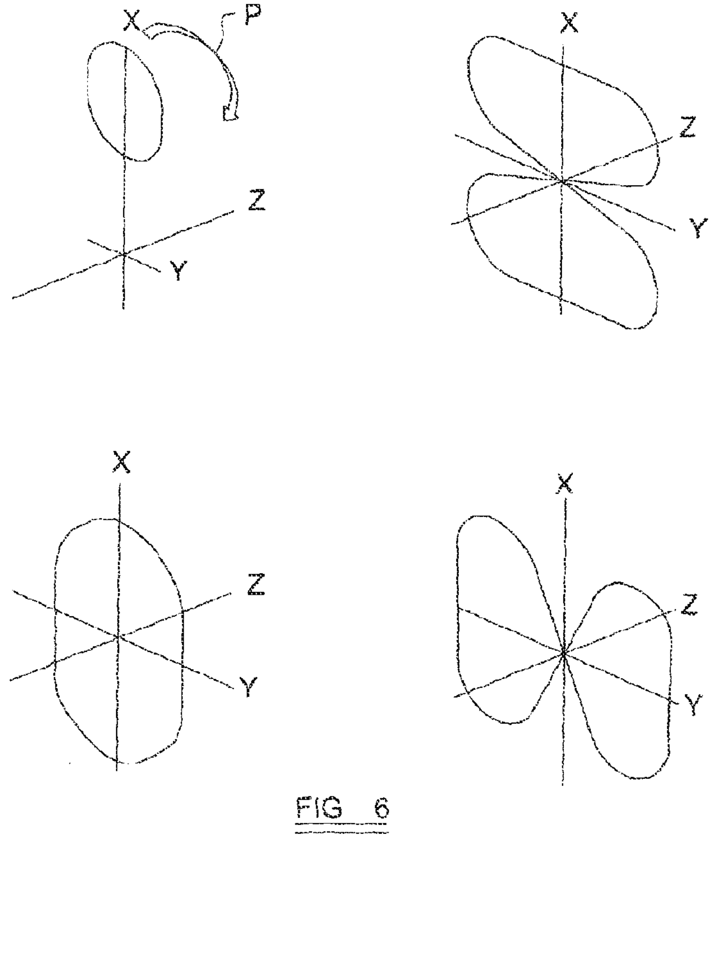

FIG. 6 shows shapes of different closed orbits in a reference plane and their positioning with respect to a reference axis.

Figure 7A:
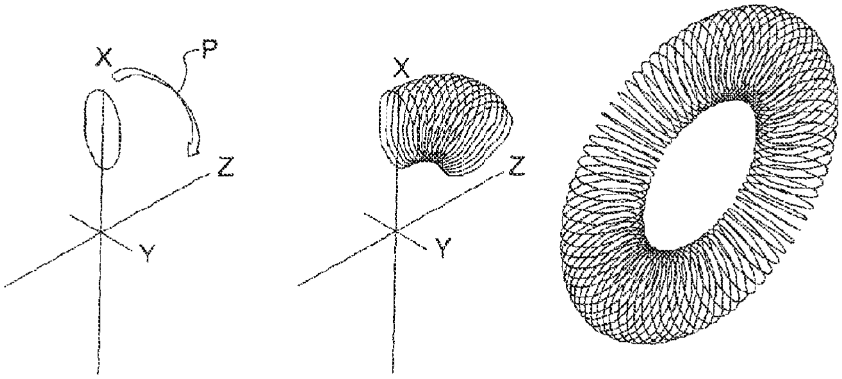

FIG. 7A shows a predetermined 3D reference trajectory in case of an O-shaped planar closed orbit (Centre, Right) positioned so as not to cross a reference axis (Left).

Figure 7B:
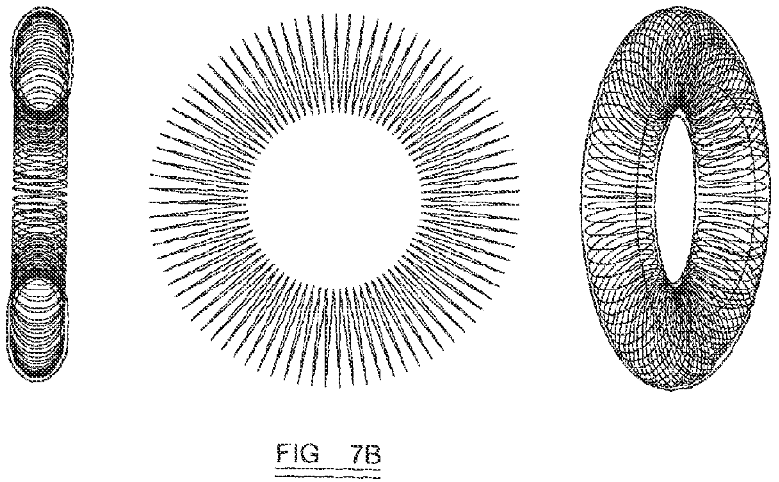

FIG. 7B shows toroidal electrodes for, and a simulated 3D reference trajectory as in, FIG. 7A.

Figure 8A:
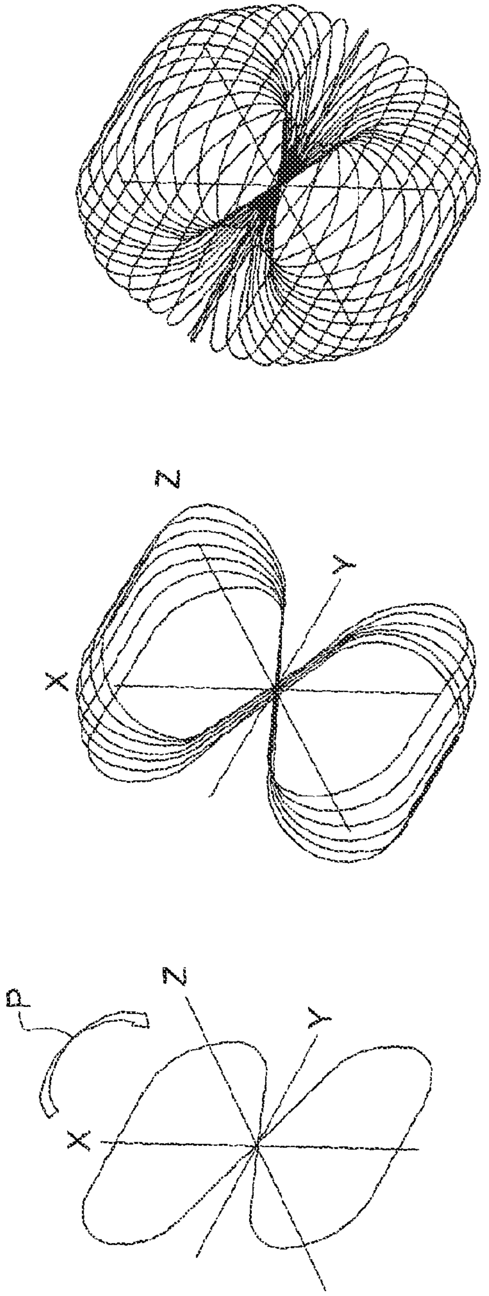

FIG. 8A shows a predetermined 3D reference trajectory in case of an 8-shaped planar closed orbit (Centre, Right) positioned so as to cross a reference axis at a single point (Left).

Figure 8B:
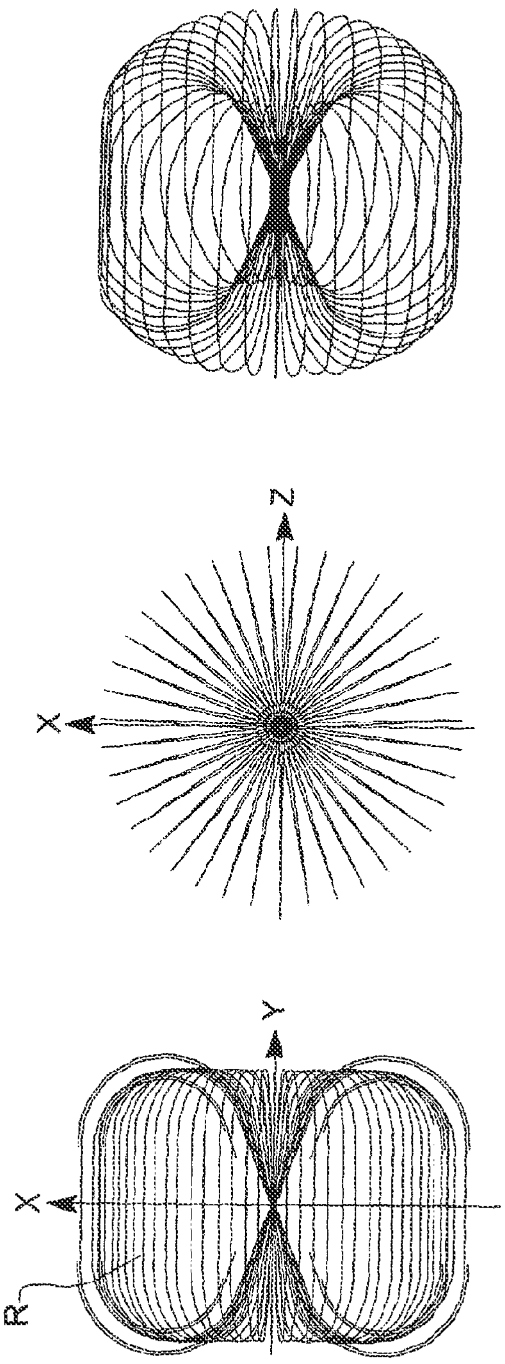

FIG. 8B shows electrodes for, and a simulated 3D reference trajectory as in, FIG. 8A.

Figure 9A:
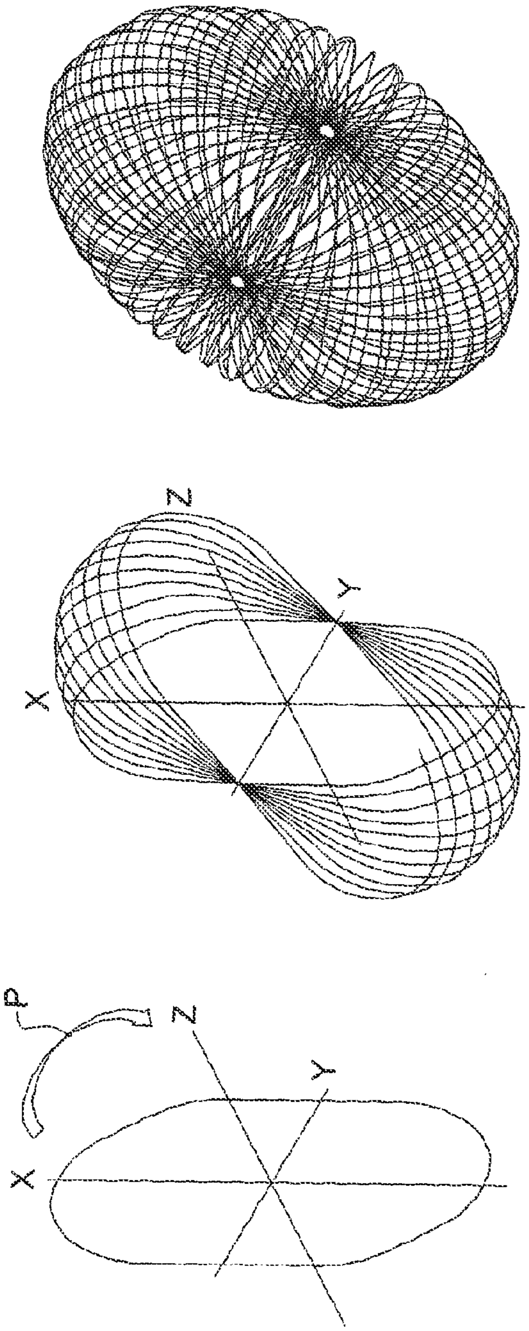

FIG. 9A shows a predetermined 3D reference trajectory in case of an O-shaped planar closed orbit (Centre, Right) positioned so as to cross a reference axis at two points (Left).

Figure 9B:
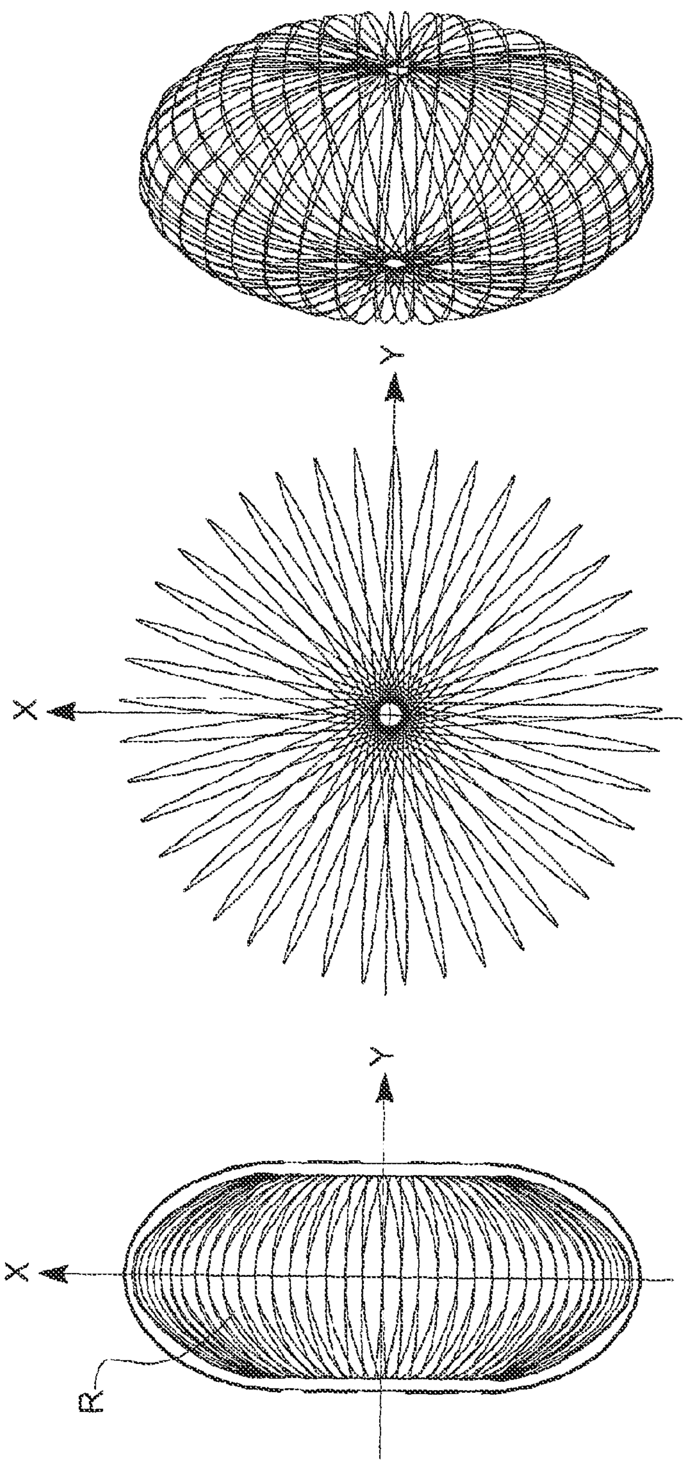

FIG. 9B shows electrodes for, and a simulated 3D reference trajectory as in, FIG. 9A.

Figure 9C:
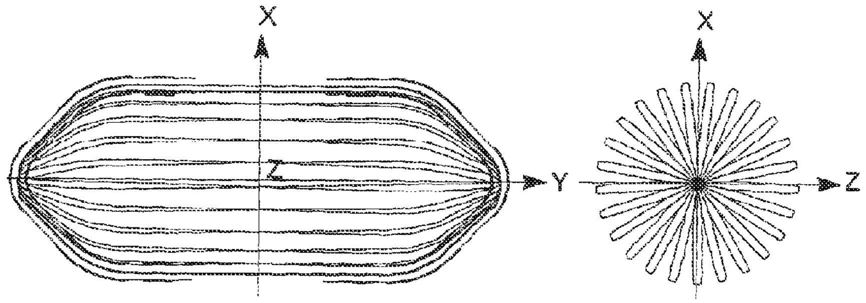

FIG. 9C shows a predetermined 3D reference trajectory in case of an O-shaped planar dosed orbit positioned so as to cross a reference axis at 2 points.

Figure 9D:
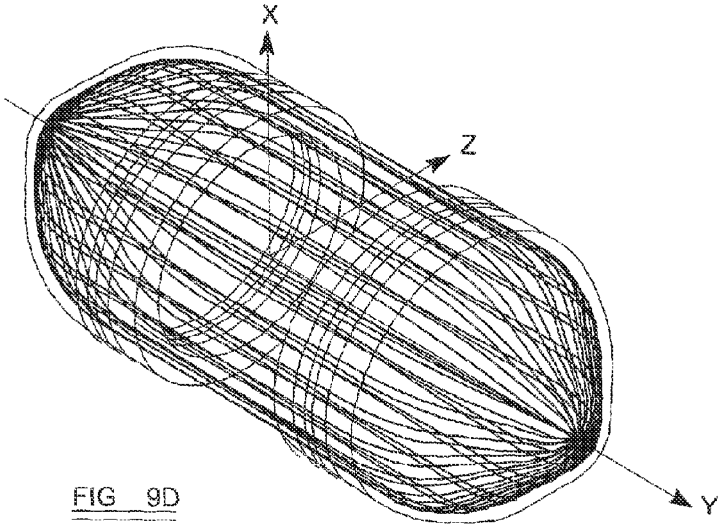

FIG. 9D shows electrodes for, and a simulated 3D reference trajectory as in, FIG. 9C.

Figure 10A:
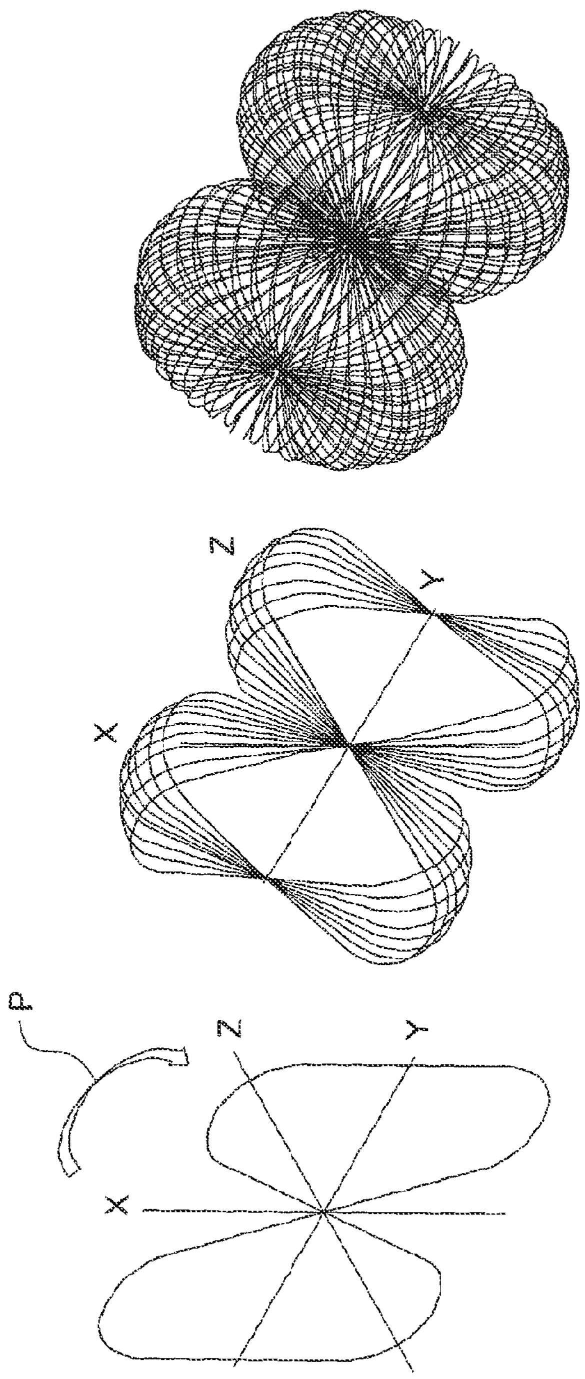

FIG. 10A shows a predetermined 3D reference trajectory in case of an 8-shaped planar dosed orbit (Centre, Right) positioned so as to cross a reference axis at three points (Left).

Figure 10B:
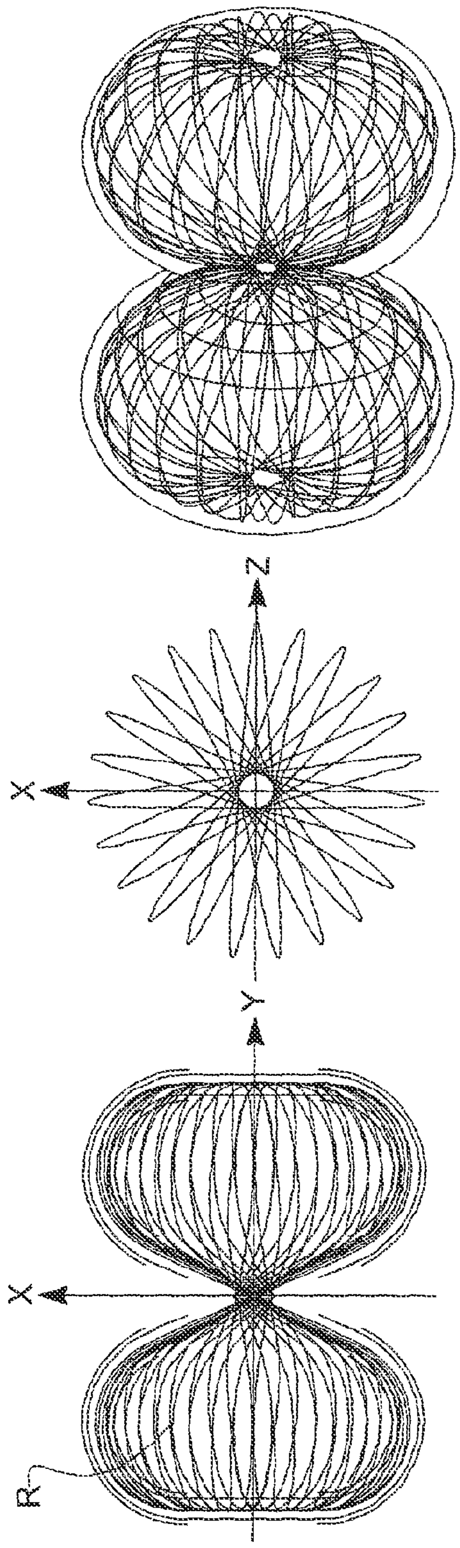

FIG. 10B shows electrodes for, and a simulated 3D reference trajectory as in, FIG. 10A.

Figure 11A:
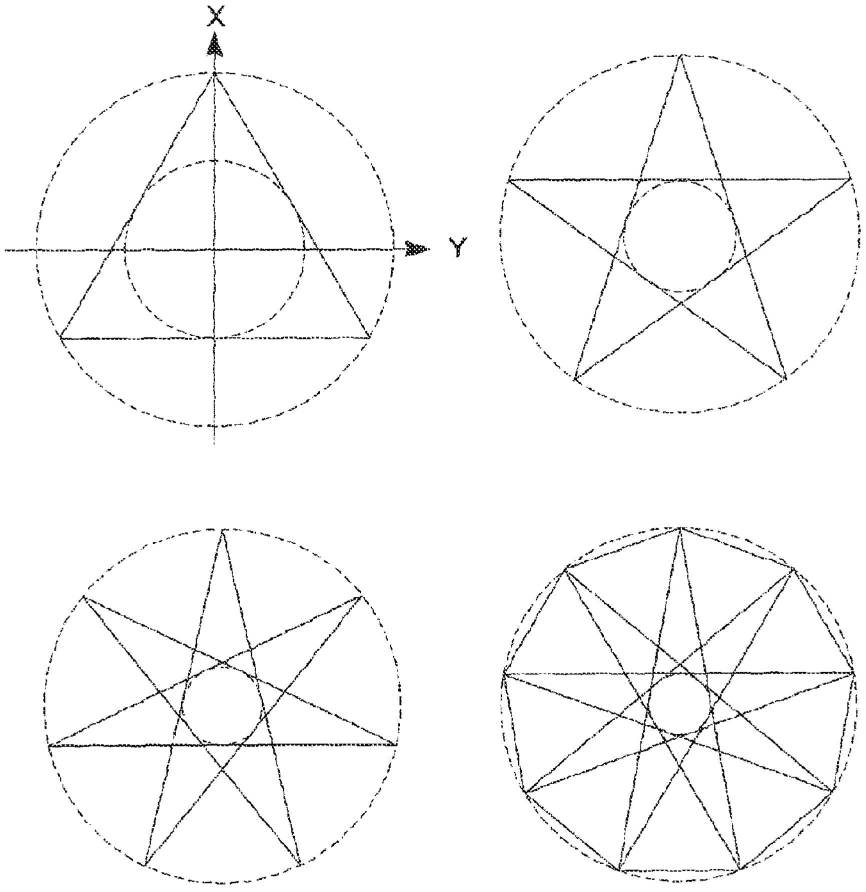

FIG. 11A shows schematic projections of a predetermined 3D reference trajectory on a drift plane in case of 1.5, 2.5, 3.5 and 4.5 turns.

Figure 11B:
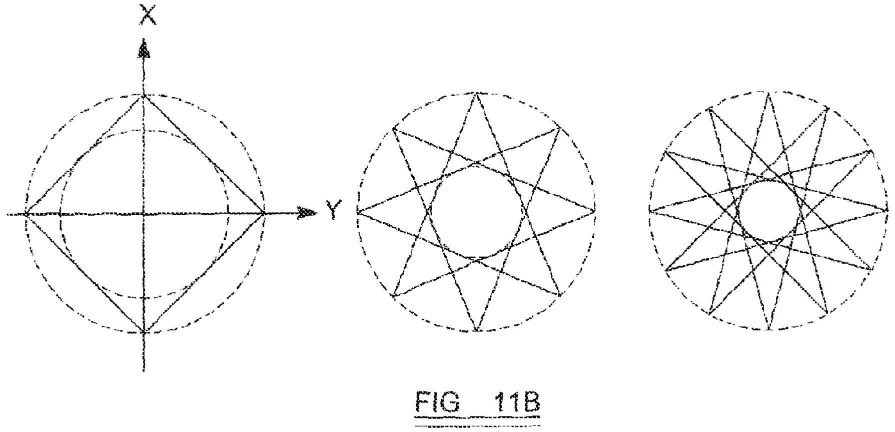

FIG. 11B shows schematic projections of a predetermined 3D reference trajectory on a drift plane in case of 2, 4 and 6 turns.

Figure 11C:
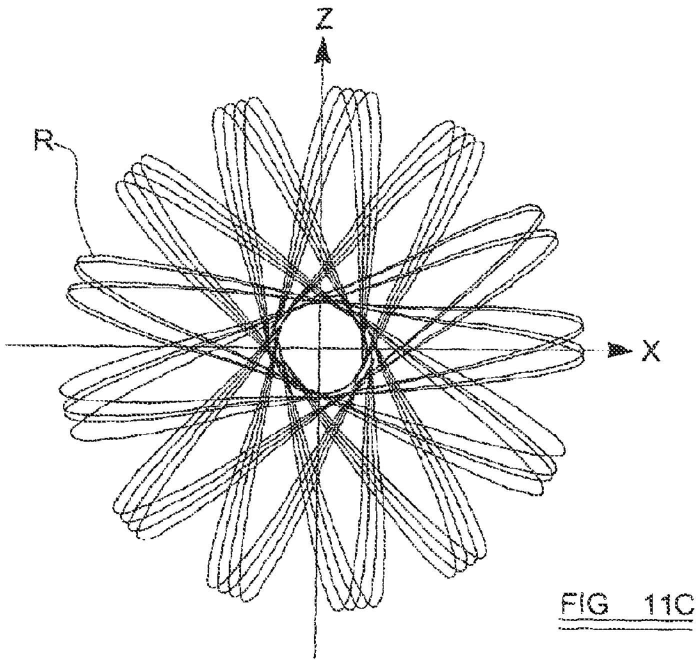

FIG. 11C shows a schematic projection of a predetermined 3D reference trajectory on a drift plane in the case of 4 passes in the drift plane.

Figure 12:
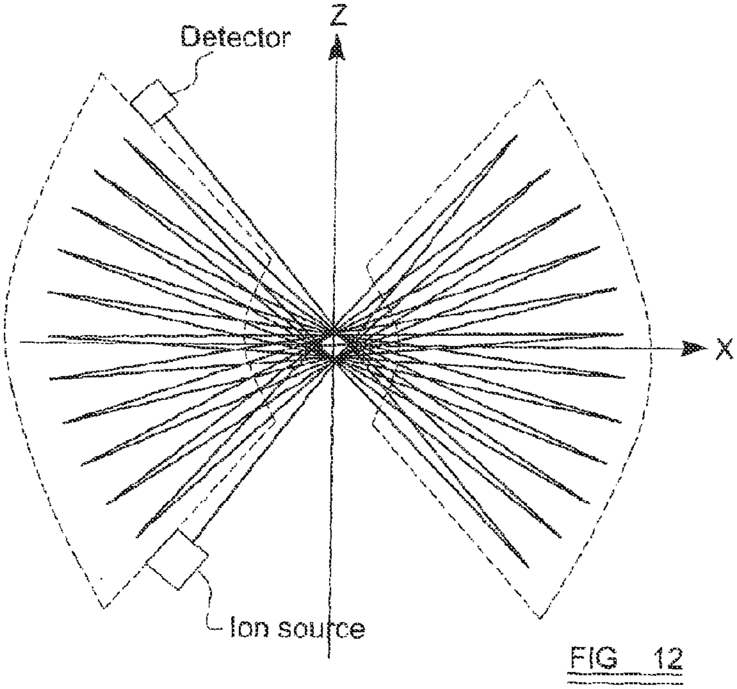

FIG. 12 shows a schematic projection of a predetermined 3D reference trajectory on a drift plane in the case of a trajectory that occupies only a limited sector area.

Figure 13A:
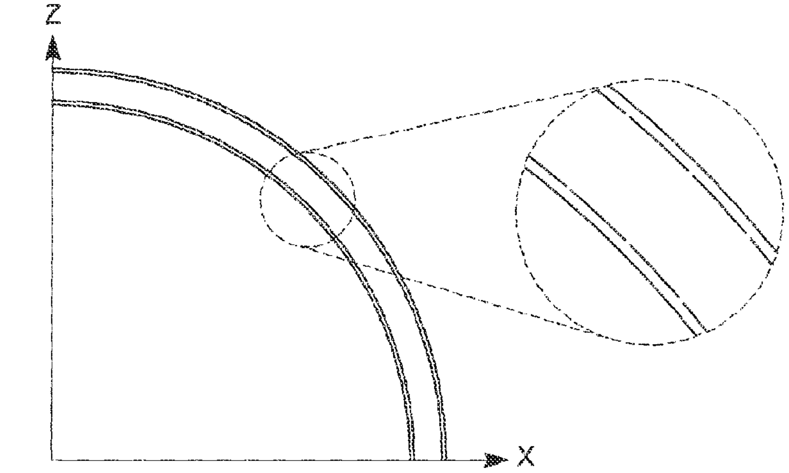
Figure 13B:
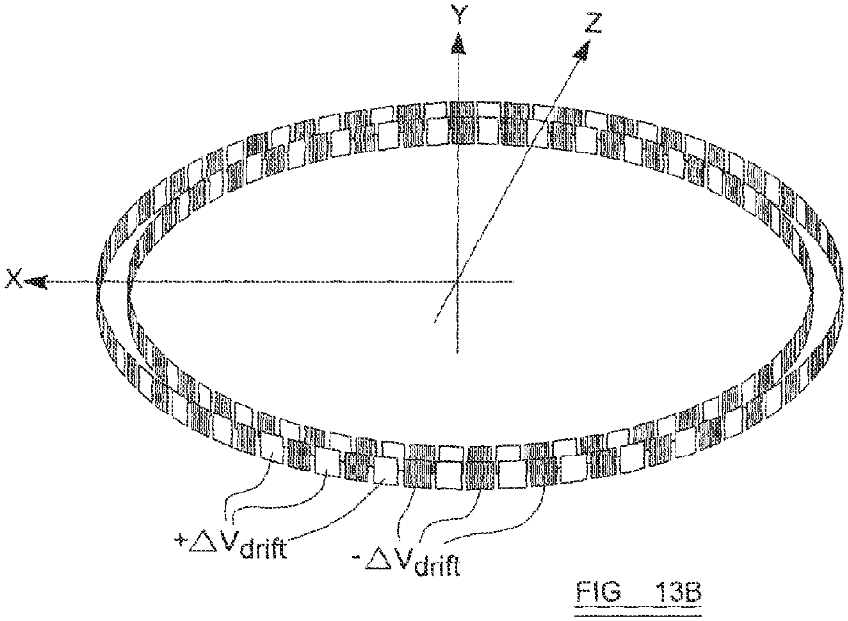

FIG. 13A and FIG. 13B show electrodes segmented in a drift plane X-Z to create field variation in a drift direction.

Figure 13C:
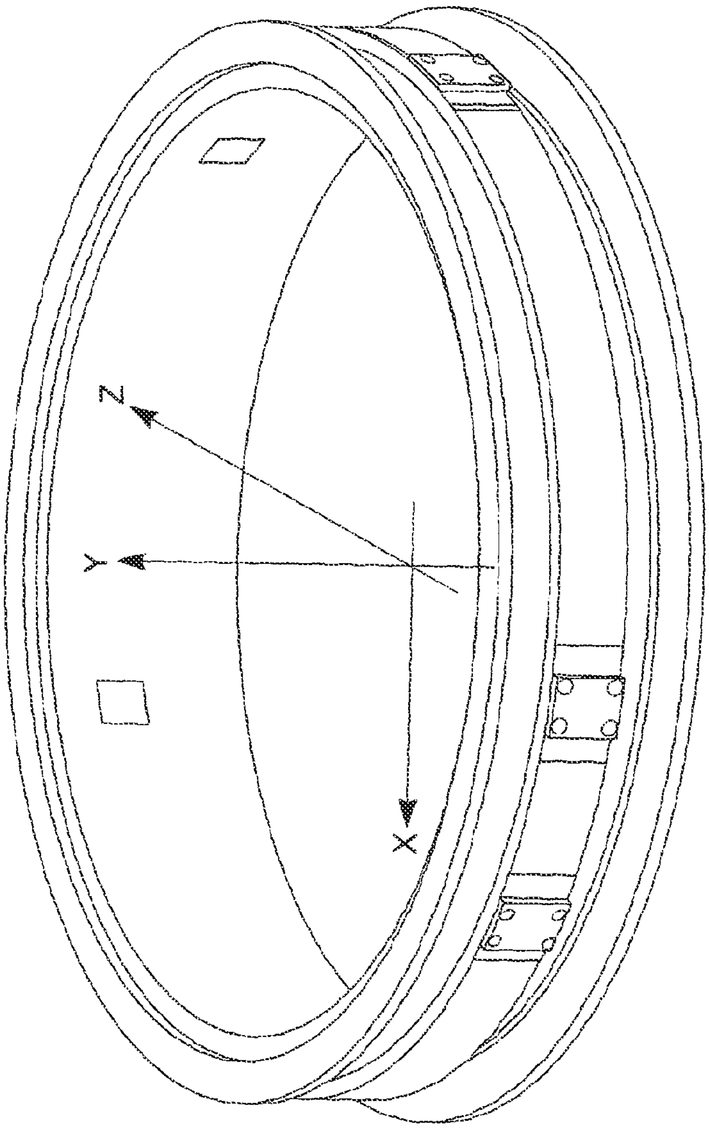

FIG. 13C shows several small electrodes (electrode segments) positioned non-periodically in a drift plane X-Z to create field variation in a drift direction.

Figure 14A:
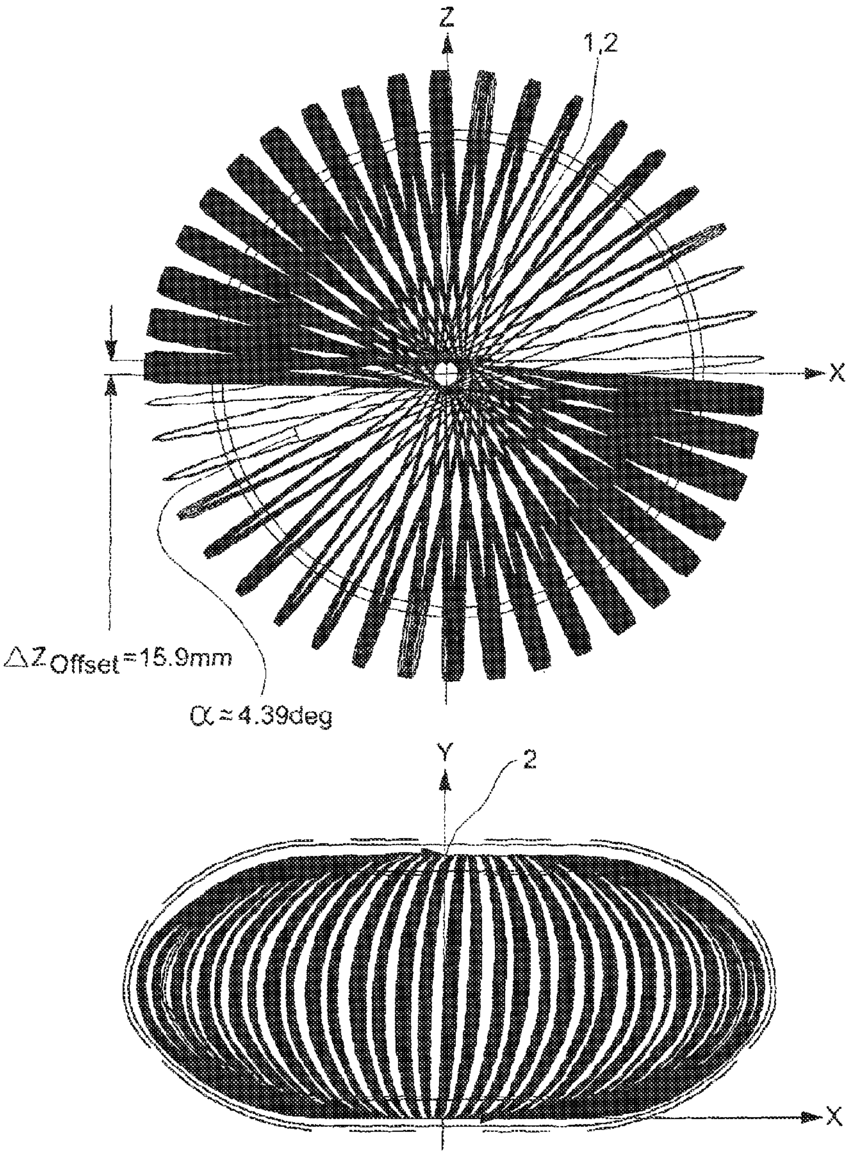

FIG. 14A shows simulated ion trajectories in case 2 from Table 2 involving 20.5 turns from 1 to 2. $\sigma z_0$=0.5 mm at the start point 1.

Figure 14B:
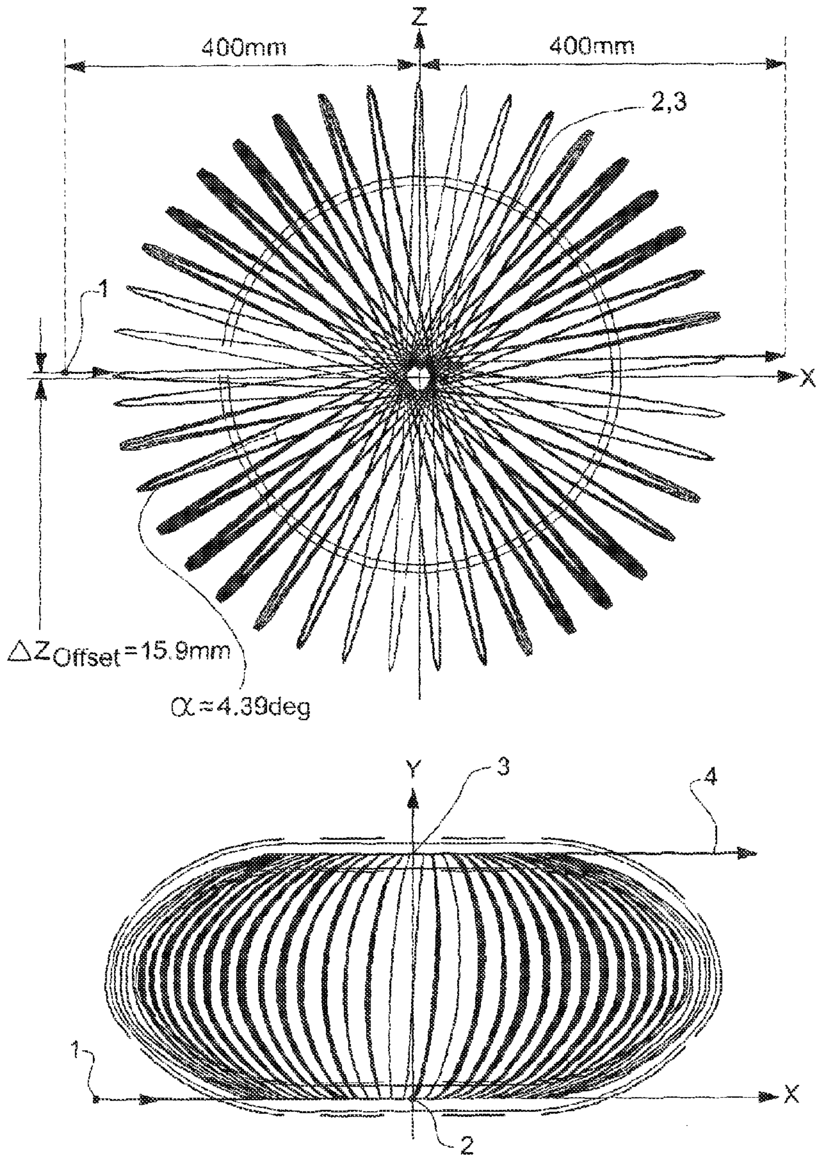

FIG. 14B shows simulated ion trajectories in case 4 Table 2 involving an injection path from point 1 to point 2, 20.5 turns from point 2 to point 3, and an extraction path is from point 3 to point 4.

Figure 15A:
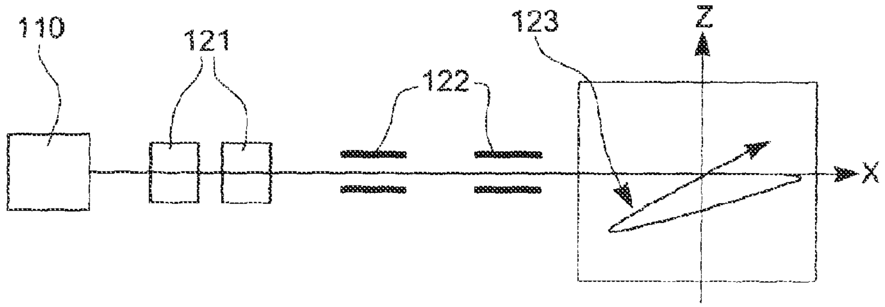

FIG. 15A is a schematic diagram of a straight injection interface.

Figure 15B:
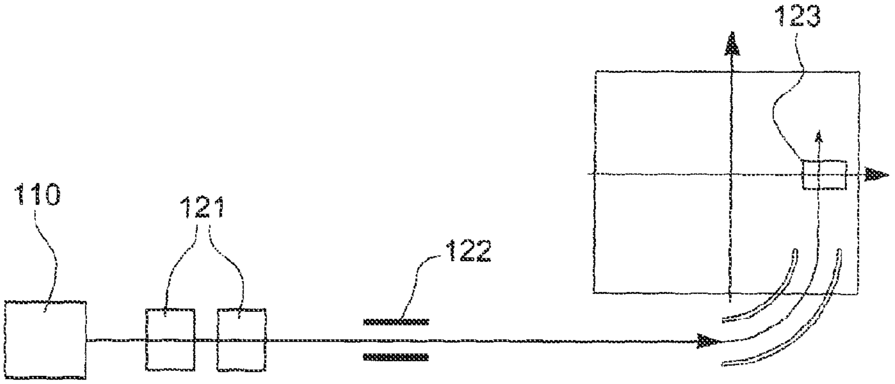
Figure 15C:
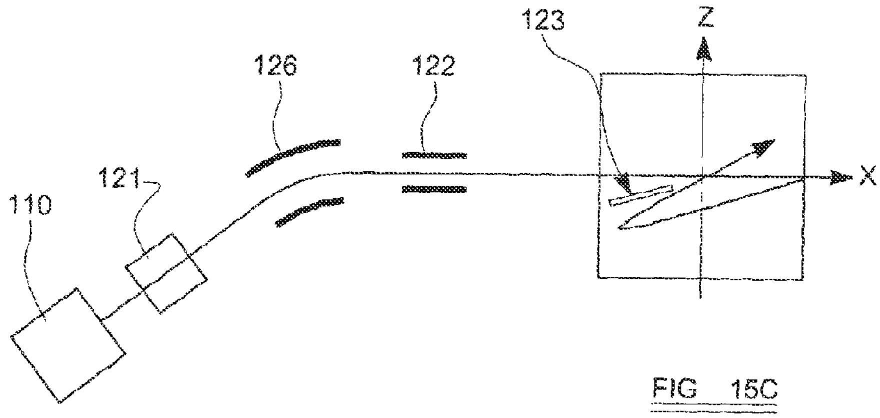

FIG. 15B and FIG. 15C are schematic diagrams of respective curved injection interfaces.

Figure 15D:
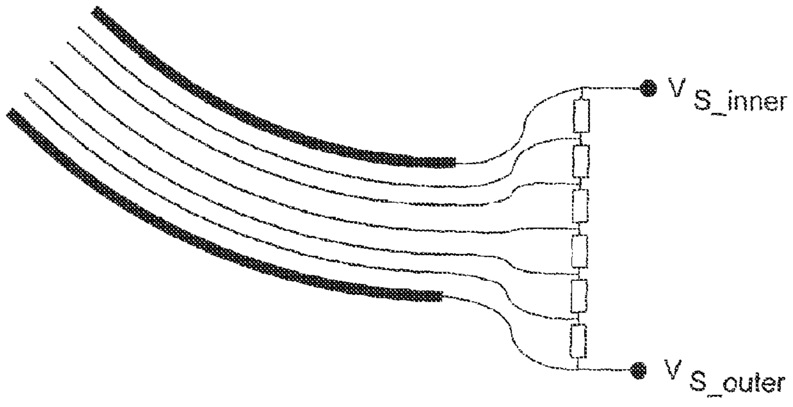

FIG. 15D schematically shows a fringe field corrector with wire tracks on a PCB with potentials compensating field distortion near termination of the sector field electrodes in an azimuthal direction.

Figure 15E:
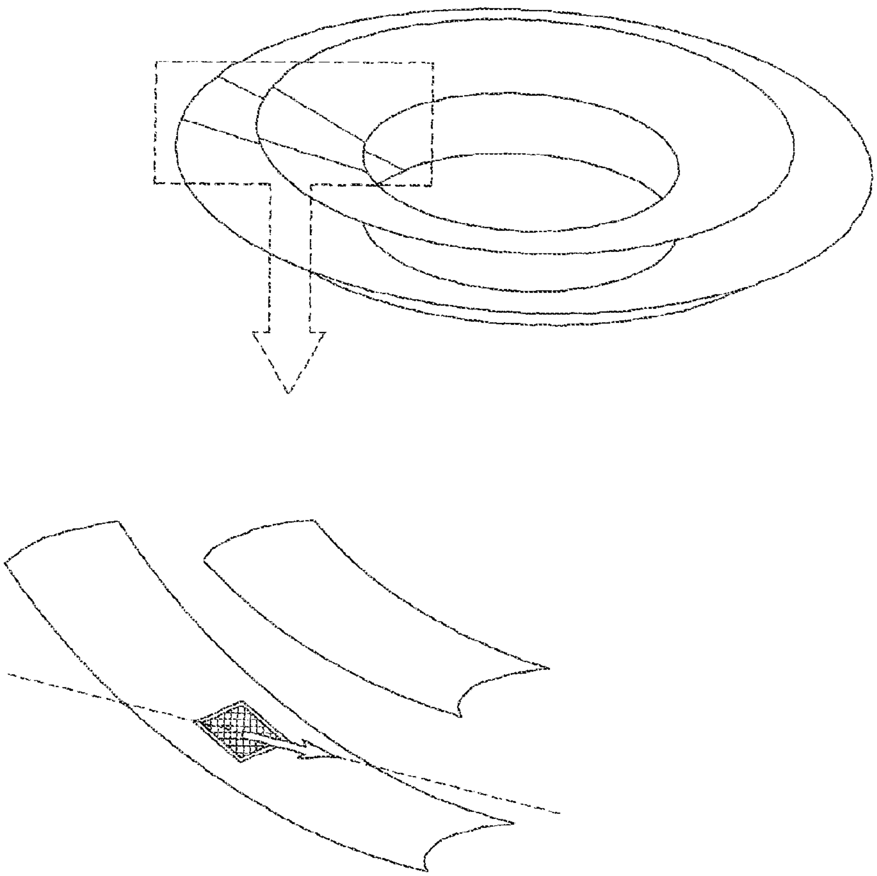

FIG. 15E shows a switchable injection part of sector field electrodes which are electrically independent from ("main") electrodes used to inject (and, similarly, extract) ions.

Figure 16A:
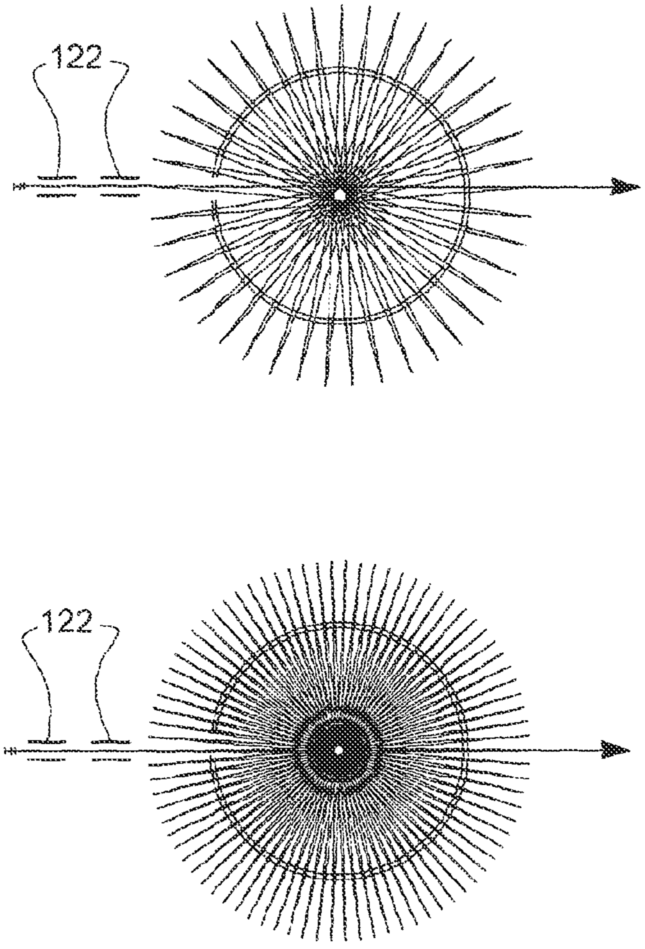

FIG. 16A shows simulated ion trajectories for 20.5 turns (Top) and 40.5 turns (Bottom) in which the number of turns is varied by changing the offset of injected ions with beam steering elements.

Figure 16B:
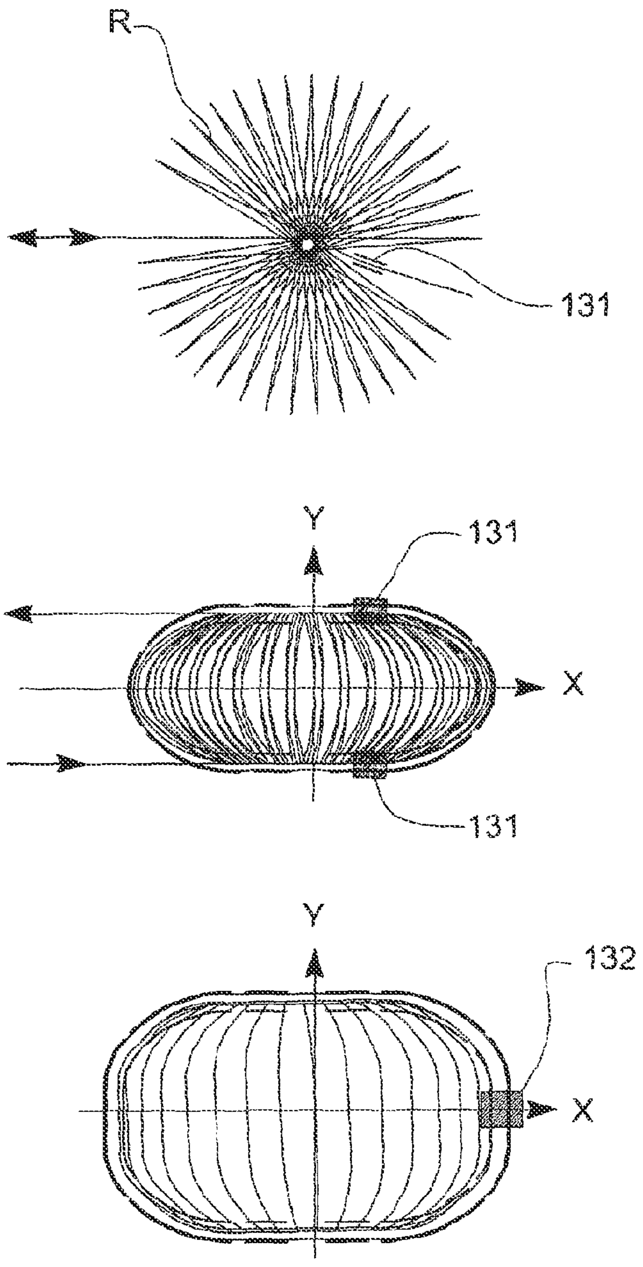

FIG. 16B shows simulated ion trajectories for two cases of positioning 'reversing' deflectors in the case of two top and bottom deflectors (Left) and one deflector in a mid-plane (Right).

Figure 17:
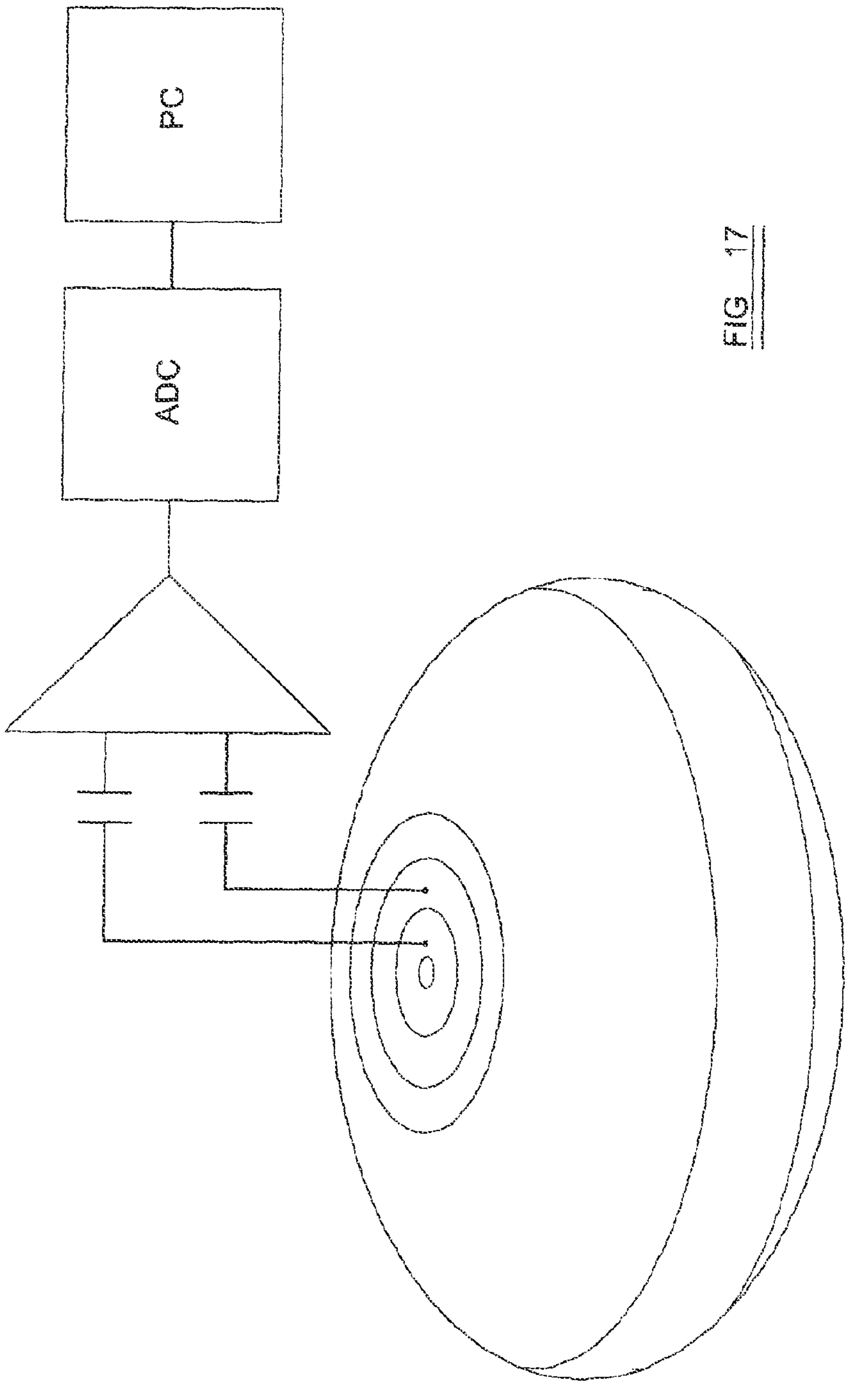

FIG. 17 is a schematic example of using the preferred mass analyser of FIG. 9B as an E-Trap mass analyser with image current detection.

DETAILED DESCRIPTION

In general, the following discussion describes examples of our proposals that relate mainly to the field of the time-of-flight (TOF) mass spectrometry, and also to electrostatic trap mass spectrometers with image current detection and e.g. Fourier analysis.

Figure 3A:
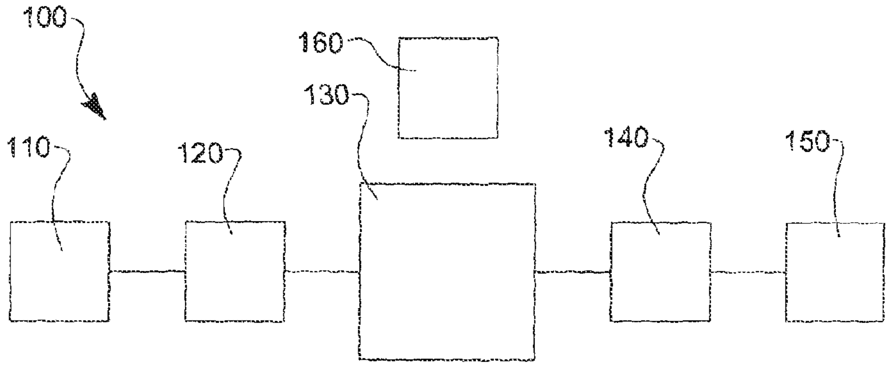
FIG. 3A is a simplified diagram of a TOF mass spectrometer.

FIG. 3A is a simplified diagram of a TOF mass spectrometer 100.

The TOF mass spectrometer 100 preferably includes an ion source 110 for producing ions having different initial coordinates and velocities. Preferably, the ion source 110 is configured to produce ions having different mass to charge ratios in short bunches, e.g. with each bunch of ions being produced in a short period of time, e.g. within a period of ~1 nanosecond. Such bunches can be produced using a pulsed ion source, e.g. a MALDI ion source.

The TOF mass spectrometer 100 preferably includes an injection interface 120 produced by the ion source 110 into a mass analyser 130.

The mass analyser 130 is preferably configured as a TOF mass analyser for separating ions according to their mass-to-charge ratios due to dependency of their times of flight through the mass analyser on their mass-to-charge ratios. To this end, the mass analyser 130 preferably has a set of electrodes (not shown) configured so that, in use, an electrostatic field region providing by the set of electrodes guides ions having different initial coordinates and velocities along a single predetermined reference trajectory.

The set of electrodes preferably includes electrodes arranged to form at least one electrostatic sector, the set of electrodes preferably being spatially arranged to be capable of providing an electrostatic field in a reference plane suitable for guiding ions along a closed orbit in the reference plane. Further, the set of electrodes preferably extend along a drift path that is locally orthogonal to the reference plane and that curves around a reference axis so that, in use, the set of electrodes provide a 3D electrostatic field region. The mass analyser 130 is preferably configured so that, in use, the 3D electrostatic field region provided by the set of electrodes guides ions having different initial coordinates and velocities along a single predetermined 3D reference trajectory that curves around the reference axis. Examples of how this can be achieved are discussed in detail below.

The predetermined 3D reference trajectory may be open or closed. An open predetermined 3D reference trajectory is generally preferred for a TOF mass spectrometer.

However, having a 3D closed predetermined reference trajectory may sometimes be advantageous to extend the path length ions travel in the mass analyser 130.

If the predetermined 3D reference trajectory is closed, the mass analyser 130 may be configured to have a "multi pass" mode of operation in which ions are guided along a predetermined 3D reference trajectory, which has a closed portion, with the ions repeating the closed portion of the predetermined 3D reference trajectory multiple times, thereby increasing the overall flight time (see e.g. FIG. 11A-B). Here, each repeated closed portion of the 3D reference trajectory can be viewed as a "pass".

The mass analyser 130 may (alternatively or additionally) be configured to have a "quasi multi pass" mode in which ions are guided along an open predetermined 3D reference trajectory, with the ions repeating a portion of the open predetermined 3D reference trajectory multiple times, with each repeated portion being rotated by a small angle (e.g. 5° or less) around the reference axis with respect to a previous and/or next repeated portion (see e.g. FIG. 10C). Here, each almost repeated portion of the 3D reference trajectory can be viewed as a "quasi pass". Note that in the "quasi multi pass" mode, the 3D reference trajectory is open, such that a reference ion moving along the 3D reference trajectory does not return to substantially the same point.

The TOF mass spectrometer 100 preferably further has an extraction interface 140 for guiding ions from the mass analyser 130 to a TOF ion detector 150 for producing an output representative of the time of flight (through the mass analyser 130) of ions produced by the ion source.

In a "multi pass" or "quasi multi pass" mode, the extraction interface 140 is preferably for guiding ions from the mass analyser 130 to the ion detector 150, after the ions have completed a predetermined number of "passes" or "quasi passes" within the TOF mass analyser.

The TOF mass spectrometer 100 preferably further has a processing apparatus 160 for acquiring mass spectrum data representative of the mass/charge ratio of ions produced by the ion source based on an output of the TOF ion detector 150, e.g. according to a conventional method.

Figure 3B:
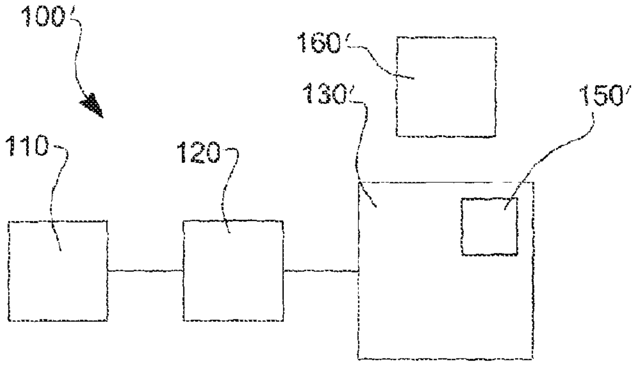
FIG. 3B is a simplified diagram of an E-Trap mass spectrometer.

FIG. 3B is a simplified diagram of an electrostatic trap (E-Trap) mass spectrometer 100'.

Some features of the E-Trap mass spectrometer 100' are similar to those of the TOF mass spectrometer. Alike features have therefore been given corresponding reference numerals, and need not be discussed in further details.

Unlike the TOF mass spectrometer 100, the E-Trap mass spectrometer 100' has an E-Trap mass analyser 130' and an image current ion detector 150' for producing an output representative of an image current caused by ions produced by the ion source.

The E-Trap mass analyser preferably has a set of electrodes configured so that, in use, an electrostatic field region providing by the set of electrodes guides ions having different initial coordinates and velocities along a single predetermined dosed 3D reference trajectory. Typically, more than 1000 turns may be required to gain sufficient output form an image current detector, so the mass analyser 130' preferably has a multi pass mode as described above.

However, owing to the nature of E-Trap mass spectrometry, the E-Trap mass analyser 130' is also able to work if the (e.g. set of electrodes of) the E-Trap mass analyser 130' is configured so that, in use, an electrostatic field region providing by the set of electrodes guides ions having different initial coordinates and velocities along different 3D trajectories that curve around the reference axis.

As with the TOF mass analyser 130, the set of electrodes preferably includes electrodes arranged to form at least one electrostatic sector, the set of electrodes preferably being spatially arranged to be capable of providing an electrostatic field in a reference plane suitable for guiding ions along a closed orbit in the reference plane. Further, the set of electrodes preferably extend along a drift path that is locally orthogonal to the reference plane and that curves around a reference axis so that, in use, the set of electrodes provide a 3D electrostatic field region.

The image current ion detector 150' of the E-Trap mass spectrometer is preferably located in the E-Trap mass analyser 130', and so an extraction interface 140 may not be required.

The processing apparatus 160' of the E-Trap mass spectrometer 100' is preferably for acquiring mass spectrum data representative of the mass/charge ratio of ions produced by the ion source based on an analysis of the output of the image current ion detector 150', e.g. based on a Fourier analysis of the output of the image current ion detector 150', e.g. according to a conventional method.

Figure 3C:
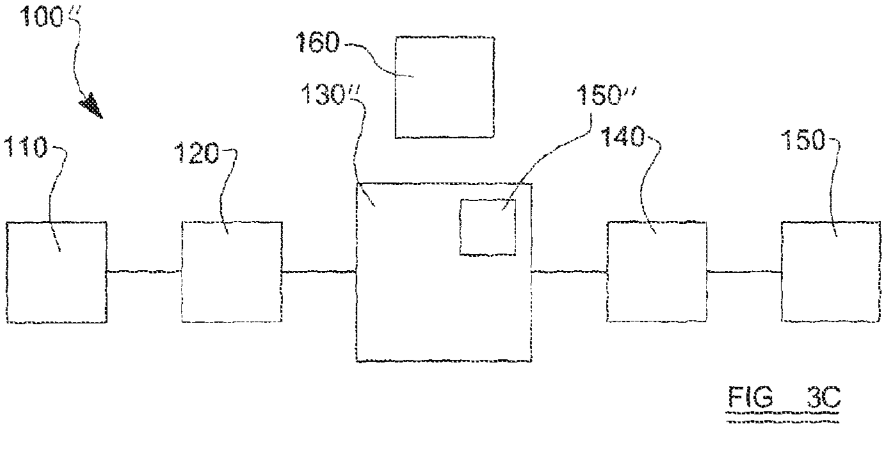
FIG. 3C is a simplified diagram of a TOF/E-Trap mass spectrometer.

FIG. 3C is a simplified diagram of a TOF/E-Trap mass spectrometer 100".

Most features of the TOF/E-Trap mass spectrometer 100" are similar to those of the TOF mass spectrometer 100 and E-Trap mass spectrometer 100' described above. Alike features have therefore been given corresponding reference numerals, and need not be discussed in further details.

The TOF/E-Trap mass spectrometer 100" is preferably configured to operate as either a TOF mass spectrometer or an E-Trap mass spectrometer, e.g. in a manner already described.

The following discussion explains how a mass analyser can be configured so that, in use, a 3D electrostatic field region provided by a set of electrodes guides ions having different initial coordinates and velocities along a single predetermined 3D reference trajectory that curves around the reference axis (e.g. for TOF/E-Trap mass spectrometry) or along one or more closed 3D trajectories that curve around the reference axis (e.g. for E-Trap mass spectrometry).

A "fixed" coordinate system that is generally fixed in relation to the mass analyser may be defined using three mutually orthogonal axes X, Y, Z.

In the drawings, a "fixed" coordinate system is used in which the Y-axis is used as a reference axis, and the X-Y plane including the Y-axis and the X-axis is used as one of the reference planes (see explanation below). In the drawings, a drift path that is locally orthogonal to the reference plane X-Y and that curves around the reference Y-axis is labelled P, a predetermined 3D reference trajectory that curves around the reference Y-axis is labelled R, and a mid-plane that is orthogonal to the reference Y-axis and includes the X axis and the Z axis is labelled X-Z. A drift plane may be defined as any plane that is orthogonal to the reference Y-axis. A drift direction may be defined as a local direction of rotation around the reference Y-axis. Because, the reference Y-axis may be an axis of rotational symmetry for the electrodes, the reference Y-axis may be referred to as a "common" axis of rotational symmetry, or simply a "common" axis.

A "reference ion" coordinate system can also be defined in relation to a reference ion that travels along the predetermined 3D reference path (trajectory) R. In the reference ion coordinate system an X'-axis can be defined as being in the direction of the predetermined reference path (which will in general be the same direction as the velocity of the reference ion). Similarly, the Y-axis can be defined as being locally orthogonal to the X'-axis in the instantaneous reference plane defined by the reference Y-axis and the instantaneous position of the reference ion, said Y-axis thereby pointing in a direction outside a closed orbit lying in the instantaneous reference plane. Similarly, the Z'-axis can be defined as being orthogonal to the X'-axis and the Y'-axis to form a right-hand local coordinate system. The reference ion coordinate system X', Y', Z' can be seen on FIG. 4C and FIG. 4D. As can be seen from FIG. 4C and FIG. 4D, the reference ion coordinate system will in general move and change orientation with respect to the fixed coordinate system.

In case of an O-shaped planar orbit, for example, the reference ion can typically be defined as an ion having, at some point in time during multi-turn motion, "fixed" coordinates $z=Z_{Offset}$, x=0, y corresponding to a position between electrodes (FIG. 4C) and a velocity parallel to the fixed X-axis or around (FIG. 4D)

Figure 2A:
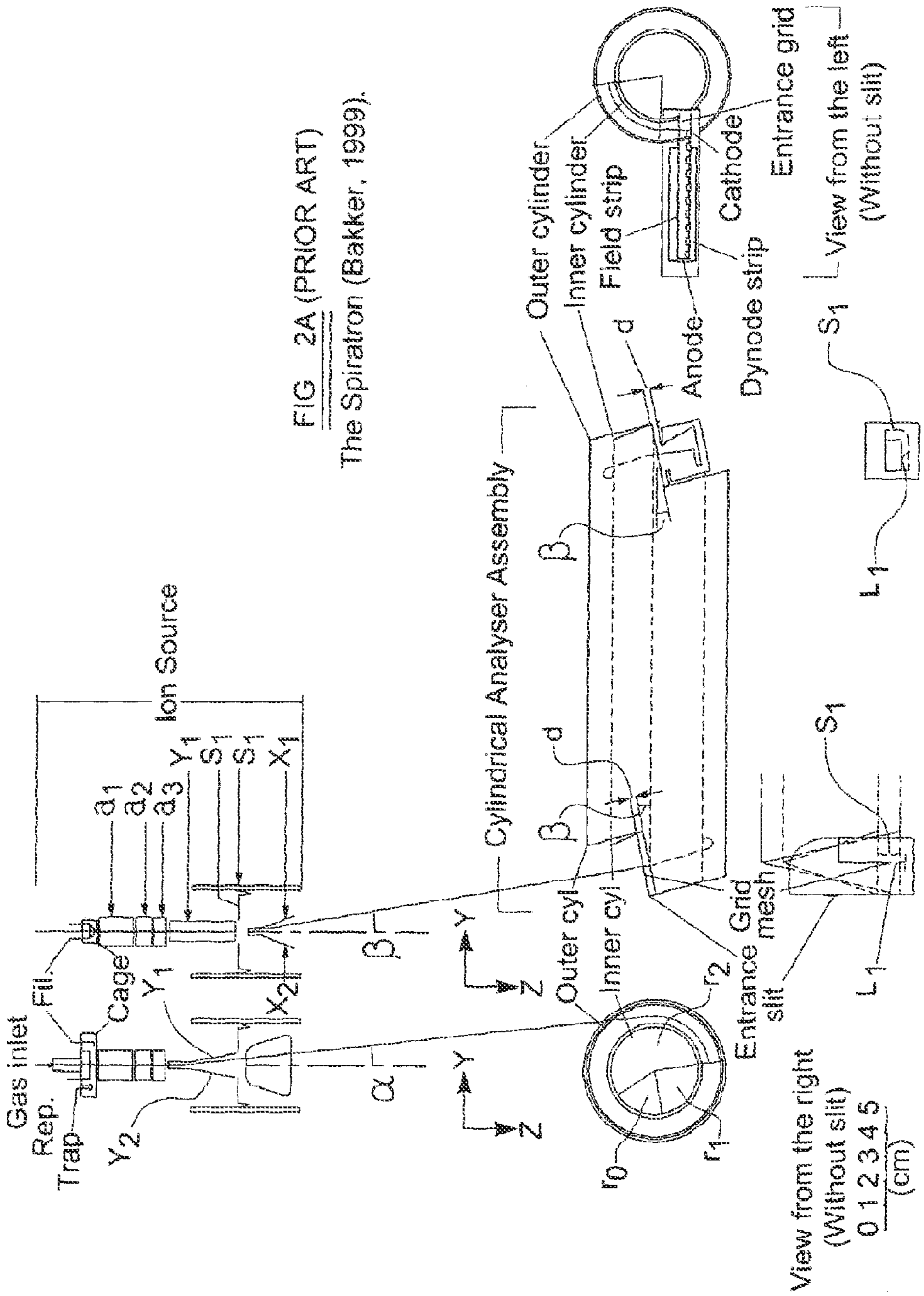
FIG 2A (PRIOR ART)
Figure 2B:
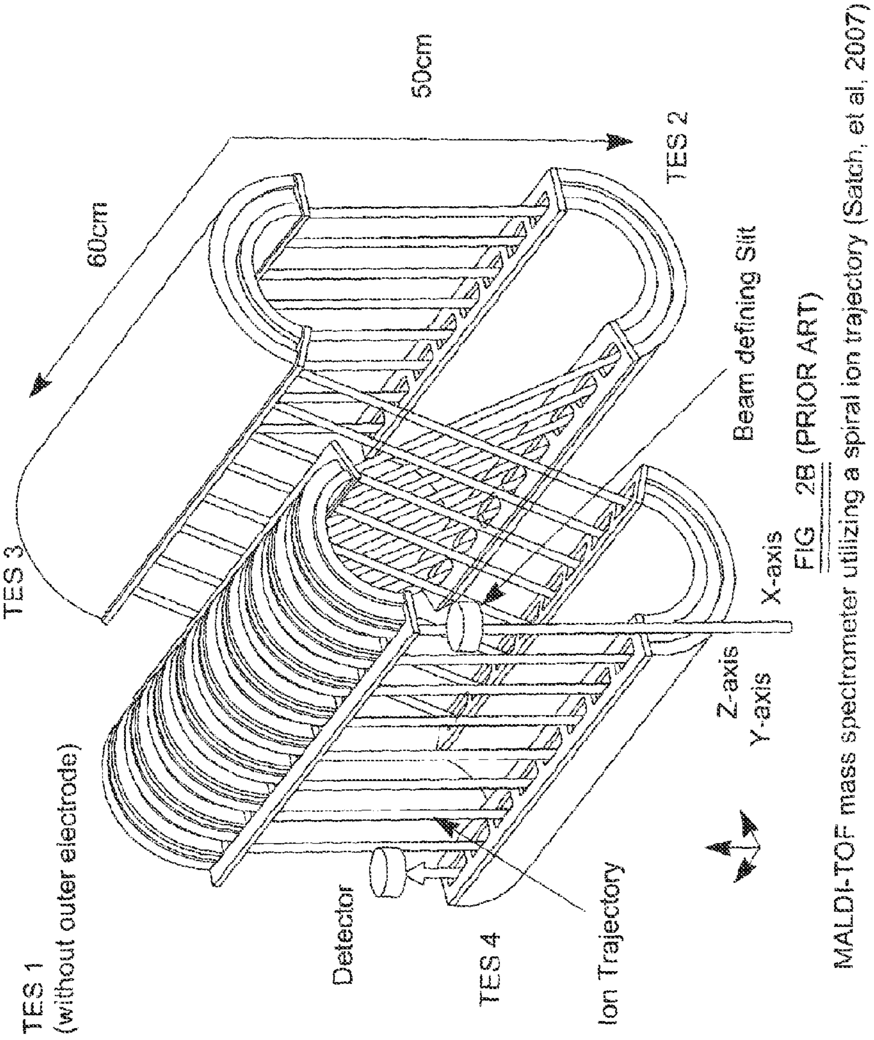
FIG 2B (PRIOR ART)

Aspects of the present invention preferably relates to the formation of a predetermined 3D reference trajectory, preferably an open predetermined 3D reference trajectory, without necessarily being accompanied by a commensurate increase in the volume occupied by the predetermined 3D reference trajectory. The present inventors have realized that electrodes, preferably planar electrodes, forming multi-turn stable and isochronous motion in the reference plane X-Y (which may also be referred to as an "isochronous" plane) could be extended along a drift path P that is locally orthogonal to the reference plane X-Y and that curves around the reference Y-axis, which is preferably a common axis of rotational symmetry (see e.g. FIG. 4A-FIG. 4B). Such a coaxial arrangement of the electrodes differs from extension of the electrodes without curvature realized by Satoh, at al (FIG. 2B) and has an advantage of more compact packing of ion trajectories in the drift direction. Indeed, in case of rotational symmetry in the drift direction, i.e. around the reference Y-axis (see e.g. FIG. 5. Left), the area $S_0$ of a circle circumscribing a star-like projection of the reference trajectory on the drift plane X-Z can be expressed via a drift angle α and characteristic length L as $S_c=(\pi/4)L^2/\cos^2(\alpha/2)$, or $S_c\approx(\pi/4)L^2$ at typically small α, while the area $S_r$ of a rectangle containing a jig-saw like projection of the reference trajectory extended without curvature (FIG. 5, Right) is calculated as $S_r=(\pi/2)L^2 \sin(\alpha)/\alpha$, or $S_r\approx(\pi/2)L^2$ at small α. Factor $S_r/S_c\approx2$ gives reduction of the area covered by the ion trajectories for electrodes extended along a curved drift path P are compared with those extended linearly. At the same time, adjacent vertices in both the geometries with the same characteristic length L and drift angle α are separated by the same distance d=2 L sin(α/2)=La leaving equal opportunities for placing additional electrodes e.g. for focusing, injection and extraction. Reduced area covered by trajectories in the drift plane X-Z results in reduced volume of evacuated space, size and weight e.g. of a MT-TOF MS. In the case that the electrodes extended along a curved drift path P are fully rotationally symmetric about the reference Y-axis, the mechanical design of the electrodes is able to be robust and resistant to mechanical misalignments with feasible mechanical tolerances.

Thus, with reference to the geometry shown in FIG. 4A-4G, a mass analyser for use in a mass spectrometer preferably has a set of electrodes $L_1, L_2, L_3, L_4, S_1, S_2, S_3$ spatially arranged to be capable of providing an electrostatic field in a reference plane X-Y suitable for guiding ions along a closed orbit (FIG. 4C) in the reference plane X-Y, wherein the set of electrodes extend along a drift path P (FIG. 4A) that is locally orthogonal to the reference plane X-Y and that curves at (preferably at a constant radius of curvature) around a reference Y-axis so that, in use, the set of electrodes provide a 3D electrostatic field region. More preferably, the mass analyser is configured (e.g. as described below in more detail) so that, in use, the 3D electrostatic field region provided by the set of electrodes guides ions having different initial coordinates and velocities along a single predetermined 3D reference trajectory R (FIG. 4B) that curves around the reference Y-axis.

Before continuing, it is helpful to further clarify terminology related to planar closed orbits (2d-CO). Voltage settings and geometry of electrodes in plane X-Y can be adjusted to make periodic oscillations of ions around a 2d-CO to be spatially and energy isochronous (FIG. 4C gives a schematic example of an O-shaped 2d-CO). Hereafter such an orbit may be referred to as 'isochronous planar orbit'. In case of rotational symmetry around the reference Y-axis, rotation of the plane X-Y together with lying in it 2d-CO by an arbitrary angle ϕ around Y axis transforms plane X-Y and 2d-CO into, respectively, another plane $X_1$-Y and another planar orbit 2d-$CO_1$ (FIG. 4A). In the drift plane X-Z (FIG. 4D) an ion's motion along a planar closed orbit corresponds to the motion along X axis at Z=0 or any other axis $X_1$ obtained from axis X by its rotation around Y axis. In general, isochronous properties are preferably preserved at such rotations. Hereafter in the document 'planar closed orbit' or 'isochronous planar closed orbit' means one of the plurality of planar dosed orbits obtained from each other by rotation around Y axis, unless specified otherwise.

It is useful to see how a planar closed orbit can be transformed into a predetermined 3D reference trajectory, and how isochronous properties change at such a transformation. A predetermined 3D reference trajectory can be obtained from the planar orbit in plane X-Y by shifting its initial coordinate at x=0 in Z direction from $z_{ref}=0$ to $z_{ref}=\Delta Z_{Offset}$ (FIG. 4D). When an ion moves along such a trajectory inside sector fields it experiences an electric field component E⊥ pushing it in the azimuthal drift direction, so that after half a turn (in case of an O-shaped planar orbit) its position in the plane X-Z may be given by a radius-vector:

$$r_{ref}=(z_{ref}, x_{ref})=(-r^*\cos(\alpha/2), r^*\sin(\alpha/2))$$

with $r=|r_{ref}|=\Delta Z_{Offset}$ and a being a drift angle in azimuthal direction. After every half-turn the ion preferably passes by the reference Y-axis at the minimum distance r never crossing it (FIG. 4B (Right), FIG. 4D). So, after multiple half-turns, a 3D trajectory may be formed (FIG. 5, Left), a projection of which on the drift plane is a star-like with multiple vertices. The drift angle α can be chosen to make the 3-dimentional trajectory either open or closed (3D closed orbit) after a certain number of turns. Summarising, a small offset of the reference trajectory in the drift direction combined with the field curvature in this direction is able to result in required ions drift motion.

While oscillations around a planar closed orbit can be made to have energy and spatial isochronicity by optimizing electrode geometry and voltage settings, oscillations around the predetermined 3D reference trajectory are in general neither spatially, nor energy isochronous at the voltage settings found for the isochronous planar orbits. However, deviations from isochronicity are small at typically small ratios r/L (FIG. 4D). This is explained by small differences in the electric field component $E_{||}$ seen by the planar orbit at z=0 and by the offset trajectory starting at $z=\Delta Z_{Offset}$. By small readjustment of the electrode voltage settings (typically within a few percent) found for the isochronous planar orbit one can attain, for one or more turns, isochronicity with respect to the coordinates $\delta y_0$ and $v_{y0}$ (FIG. 4C) for the predetermined 3D reference trajectory. At the same time, due to the curvature in the drift direction the ions motion in the drift plane X-Z is, in general, non-isochronous with respect to the initial coordinate $\delta z_0$ (FIG. 4D). Such non-isochronicity in the drift direction can in general be effectively minimized at a TOF detector after multiple turns through an entire MT-TOF MS system including Injection and extraction paths. Similarly, energy isochronicity with respect to the longitudinal energy spread (where longitudinal energy is $K_{x0}=mv_{x0}/2$, see e.g. FIG. 4C) in a bunch of ions is preferably achieved at a TOF detector position rather than periodically inside an MT-TOF MS. Such energy isochronicity can be achieved for example by proper readjustment of voltage settings using as initial approximations those found for the isochronous dosed orbits. To achieve full (spatial and energy) isochronicity, however, it is usually necessary to employ drift focussing, which is described in more detail below.

Choice of a particular embodiment of planar electrodes extended with curvature in the drift direction, i.e. along a curved drift path P, can be made by combining various ion-optical and geometry options (FIG. 6-FIG. 12), such as:

a) shape of the planar closed orbit, b) positioning of the planar closed orbit with respect to the reference Y-axis, which is preferably a common axis of rotational symmetry, c) positioning of the predetermined 3D reference trajectory in the direction of the drift path P.

Although the preferred requirement of isochronicity of ions motion may impose certain restrictions on the shape of the planar dosed orbit, it can still vary in quite a wide range. For easiness of fabrication of electrodes it is reasonable to consider in detail only the simplest O-shaped and figure-of-eight shaped (8-shaped) closed orbits (FIG. 6), but other possibilities are possible. Possibilities of positioning of the planar closed orbit with respect to the Y-axis, which is preferably a common axis of rotation can be sorted/categorised according to the number of points at which the reference Y-axis is crossed by the closed orbit. In case there are no such points of crossing (FIG. 6.1) the predetermined 3D reference trajectory lies on a toroidal surface (FIG. 7A). A toroidal arrangement of the electrodes (FIG. 7B) is feasible mechanically, however, it is generally not optimum from the point of view of size of such a system. Other options offer more compact packing of ion trajectories. Those include cases, in which Y axis is crossed by the planar dosed orbit once (FIG. 6.2), twice (FIG. 6.3), or three times (FIG. 5.4). FIG. 7-FIG. 10 give respective examples of simulated reference trajectories and electrode arrangements. Cases with larger number of points of crossing (the reference Y-axis) seem of limited practical use because of added complexity of electrode manufacturing.

The O-shaped and 8-shaped planar closed orbits shown in FIG. 6 are preferably mirror symmetric with respect to both the X-axis and the Y-axis. In general, mirror symmetry of the planar closed orbit with respect to at least one axis is preferred as it can help with attaining of isochronicity of ions motion. Symmetry of the planar closed orbit around axis of rotation Y is highly preferred to avoid very complicated electrode shapes in imaginable cases where such symmetry is absent. Symmetry of the planar closed orbit around the X-axis is in general not required, but it is preferred, as it can help to simplify the mechanical design of the electrodes and can also help to achieve better isochronous properties.

In the drift plane X-Z reference trajectories could either cover the entire drift space (FIG. 7A-FIG. 10A, Right), if the electrodes are fully rotationally symmetric, or occupy only limited sector areas (FIG. 11. FIG. 7A-FIG. 10A, Centre, and FIG. 12). In the latter case the free space not occupied by the trajectories in the drift direction could, for example, be used for placing elements for ion injection and extraction (e.g. an injection interface, an extraction interface), wires, auxiliary mechanical and vacuum elements, etc.

A predetermined 3D reference trajectory in the drift direction is preferably positioned such that vertices of its projection on the drift plane X-Z are equidistant (FIG. 11A, FIG. 11B). This provides maximum separation of adjacent turns in the drift direction and allows employing periodic electrodes for focusing in the drift direction ("drift focussing"). Another preferred positioning of the predetermined 3D reference trajectory in the drift direction is such that it closes after a given number of turns. All the trajectory patterns schematically shown in FIG. 11A, FIG. 11B are closed. With such a trajectory arrangement one is preferably able to switch between single pass of ions in the drift direction and multiple passes in this direction (with mass range limitation) using dedicated switching electrodes (see e.g. FIG. 15E). This helps to give additional flexibility of operating MT-TOF MS in a multi-pass mode in the drift direction.

FIG. 11C shows another possibility of multi-passes in the drift direction without mass range limitation. Here, after each full pass in the drift direction the reference trajectory is not closed, but proceeds to a different next pass so that the trajectory pattern of each next pass in the X-Z plane is slightly rotated by a small angle around the Y-axis with respect to the trajectory pattern of the previous pass. The number of passes in the drift direction may, however, be limited by a minimum distance between adjacent trajectories imposed by injection/extraction requirements.

Although requirements as to stability and isochronicity of planar motion are generally common for all MR-TOF and MT-TOF MS systems, particular means of forming electrostatic fields to achieve those requirements may vary notably. For instance, in the spiral MT-TOF MS [Satoh, et al. J. Am. Soc. Mass Spectrom. 18, 1318-1323, 2007](FIG. 2B) isochronous and focusing properties in bending plane X-Y, as well as focusing in the drift direction Z, are provided by a set of sector field units with a constant toroidal factor c. The toroidal factor is defined as a ratio of the curvature of the equipotential surface in X-Y plane to that in the drift plane seen along the reference orbit. In the spiral MT-TOF MS by Satoh, et al the curvature in the drift direction is created locally inside each sector field unit using the Matsuda plates.

In the MT-TOF MS systems proposed herein, the ratio of the equipotential surface curvatures in X-Y and drift planes is, in general, not constant and may vary along a reference trajectory. For instance, FIG. 4E shows an example shape for the sector field electrodes $S_1$, $S_3$ used in the system of FIG. 4C. The ratio of curvatures may be calculated for those sectors as $R_1/(d+R_1 \sin(\theta))$. While ions move along the reference trajectory this factor changes continuously with angle $\theta$. Such sector fields are known as 'polar-toroidal', and have been employed in energy-angular analysers.

Drift focussing (see definition above) could, for example, be achieved with one of the following:

- separate focusing lenses placed preferably at such azimuthal positions in the drift plane X-Z, where adjacent turns are best separated in the drift direction, preferably near vertices of the star-like projection of the reference trajectory on the drift X-Z plane;
- Incorporating a set of periodic or non-periodic lenses into electrodes of at least one sector field or between sector fields;
- incorporating a set of small electrodes (electrode segments) positioned periodically or non-periodically in a drift direction defined as a local direction of rotation about the reference axis (see e.g. FIG. 13C);
- Splitting a pair of rotationally symmetric electrodes in a number of small segments in the drift direction and applying periodic potential variation in this direction (see e.g. FIG. 13);
- Other means of field variation in the drift direction, periodic or aperiodic.

To achieve high mass resolving powers in the order of 100,000 or higher size of an MT-TOF MS is preferably adequately large. For the proposed MT-TOF systems preferred characteristic lengths L (FIG. 5) are 30 cm (mass resolving power≈40,000-50,000), 60 cm (mass resolving power≈80,000-100,000), >80 cm (mass resolving power>100,000), where mass resolving powers are defined rather relative to each other than precisely as they also depend on injected beam parameters, stability of power supplies, the space charge, etc. A preferred number of turns is in the range from 15 to 60.

An injection interface connecting an external ion source and MT-TOF analyser could, for example, be one of the following:

- a straight injection interface without curvatures, e.g. as shown in FIG. 15A, e.g. including at least one lens 121, at least one element for beam steering in at least one (of the two) transverse directions 122 and at least one fringe field corrector 123;

an injection interface having a curved axis, e.g. as shown in FIG. 15B, e.g. including at least one lens 121, at least one element for beam steering in at least one (of the two) transverse directions 122 and a deflecting field element 124 and optionally a fringe field corrector 123;

said curved interface, e.g. as shown in FIG. 15B, which additionally has at least one fringe field corrector 123; or an injection interface having a curved axis, e.g. as shown in FIG. 15C, e.g. including at least one lens 121, at least one element for beam steering in at least one (of the two) transverse directions 122 and a deflecting field element 126 for deflecting in a plane orthogonal to a Y-axis.

An extraction interface connecting an MT-TOF analyser to an external TOF detector could, for example, be one of the following:

a straight interface without curvatures including at least one fringe field corrector;

an interface, which has a curved axis; or said curved interface, which additionally has at least one fringe field corrector.

A preferred purpose of the fringe field corrector is to compensate for electrostatic field distortions caused by termination of MT-TOF MS electrodes in azimuthal direction in the area where ions enter the analyser or are extracted from the analyser. Timing properties of ion bunches can be worsen when ions pass by such field distorted region during first turn after injection. The fringe field corrector could, for example, be fabricated as a set of wire tracks on a printed circuit board (PCB), each track being at an individual potential; distribution of potentials over wire tracks defined by a resistor chain dividing potential difference between two main electrodes of the corrected sector field; or a high resistance conductive material electrically connected to two main electrodes of the corrected sector field.

Another aspect of the present invention is a possibility of measuring masses of ions with image current detection and e.g. Fourier analysis. As it was pointed out above, a predetermined 3D reference trajectory can be closed into a loop e.g. by the use of pulsed electrodes (see e.g. FIG. 15E). In such a case ions are trapped in a system and undergo multiple passes in the drift direction. To improve signal to noise ratio in an ion trap mode, a pick-up electrode of an image current detector is preferably small and positioned preferably in a place, where ions are well focused in a small spot or spots. In the systems proposed herein, such positions are generally near points where planar dosed orbits cross Y axis (FIG. 6) and where the 3-dimentional reference trajectory is concentrated (FIG. 14A, FIG. 14B, FIG. 4B (Right)).

In an ion trap mode with image current ion detection, there two possible modes of operation of the device depending on drift focusing. In the first mode ions move along a dosed predetermined 3D reference orbit. This mode of operation may require drift focusing, as described above. An ion mass can be defined e.g. by two ways in this mode, e.g. by extracting ion bunches on a TOF detector after a given number of passes in the drift direction and/or with an image current detector. In the second mode ions move in the drift direction along different (i.e. individual) trajectories, and so drift focusing is not required in this mode. Only an image current ion detector can be used for mass measurements in this mode. The preferred characteristic size L of the system running in the ion trap mode with image current detection is 30 cm or less with a preferred number of turn N>1000.

Some further details regarding examples of the invention, including simulation data, will now be discussed.

Referring to FIG. 4C, a preferred embodiment in the case of an O-shaped planar closed orbit preferably comprises electrodes of sectors $S_1$-$S_3$ and lenses $L_1$-$L_4$ rotationally symmetric around Y axis (FIG. 9A-FIG. 9B). Example 3D shapes of such electrodes are shown in FIG. 4E-FIG. 4G. Curvatures of the electrodes $S_1$-$S_3$ are in general different in the drift direction and in the reference plane X-Y.

FIG. 4H illustrates a reference ion coordinate system $X_1'$, $Y_1'$, $Z_1'$ near y=0 and shows that the $Z_1'$ axis is not exactly parallel to axis Z due to a non-zero velocity component in the drift direction.

Simplification of the mechanical design may be achieved by the use of symmetry about the drift plane X-Z. In addition, employment of symmetry can help to reduce higher order time-of-flight aberrations and hence improve mass resolving power. The two halves of the system, from point 0 to point 1 and from point 1 to point 2, are preferably mirror symmetric about axis X or, more generally, about plane X-Z. As it follows from general consideration of symmetric ion-optical systems [J. C. Herrera and E. E. Bliamptis, Rev. Sci. Instr., 1966, 37(2), 183-188] to achieve spatial isochronicity for the planar orbit at point 2 with respect to $\delta y_0$ and $\delta v_{y0}$ at point 0 (FIG. 4C) it is generally sufficient to satisfy only one condition: zero angular dispersion in X direction at point 1. The angular dispersion can be defined as the derivative $dv_{x1}/dK_{x0}$, taken on the dosed orbit, where $v_{x1}$ is an ion's velocity in X direction at point 1 and $K_{xC}$ component of the kinetic energy in X direction at point 0. Geometry parameters of the sectors $S_1$ ($S_3$) and $S_2$ (curvature radii, deflection angles, distance between the sectors in the flight direction, etc.), as well as electrode voltage settings, are preferably chosen so that $dv_{x1}/dK_{x0}=0$. Spatial isochronicity at point 2 with respect to the other coordinates $\delta z_0$ and velocities $\delta v_{z0}$ at point 0 (FIG. 4C) is preferably fulfilled automatically preferably due to the closed orbit being planar. In addition to the spatial isochronicity the system may also be adjusted at point 2 to be isochronous with respect to ions energies $K_{x0}$ at point 0 (energy isochronicity) e.g. by adjusting potentials on the lens electrodes $L_1$-$L_4$ (FIG. 4G). In such a case ions oscillations around the planar closed orbit are preferably fully (i.e. spatial and energy) isochronous.

MT-TOF systems without symmetry about the X-Z drift plane are feasible as well. Due to the preferred rotational symmetry around Y axis there preferably exists mirror symmetry about Y axis in each plane $X_1$-Y (FIG. 4A, right). Respectively, symmetry considerations similar to the above can be used to design an MT-TOF system asymmetric about the X-Z plane and capable of providing full isochronicity over one or more turns.

Figure 1A:
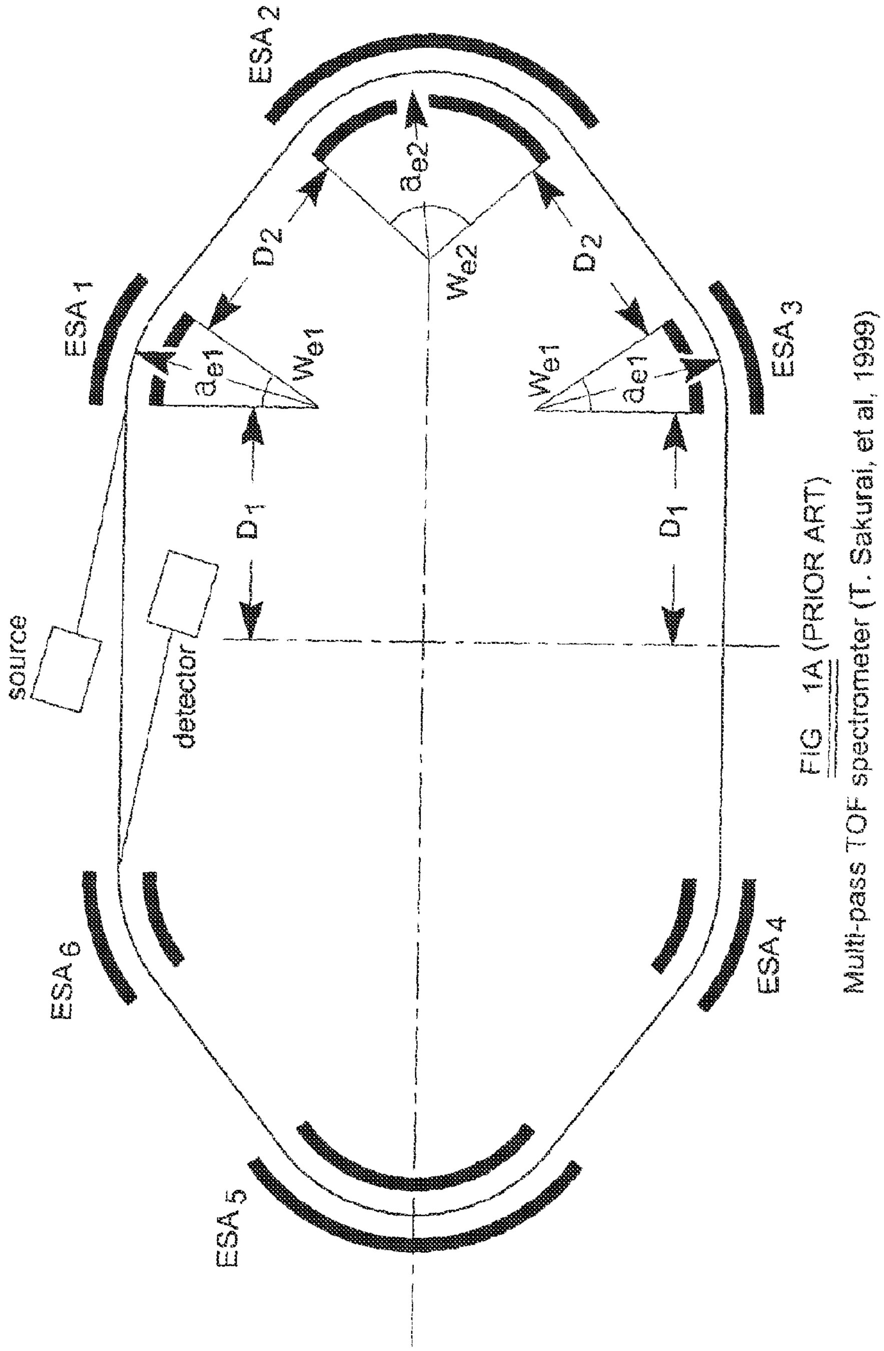
FIG. 1A (PRIOR ART)
Figure 1B:
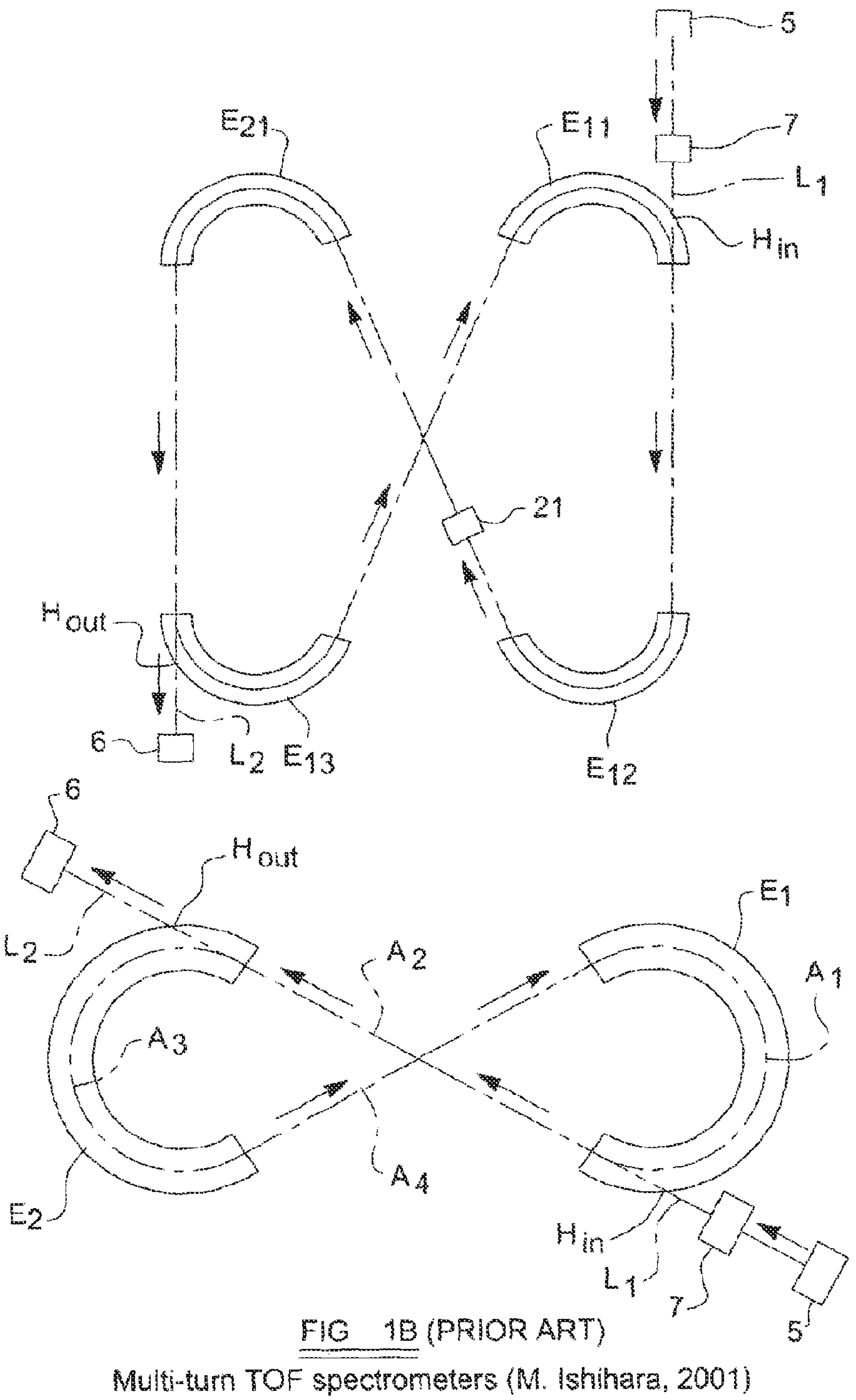
FIG 1B (PRIOR ART)
Figure 1C:
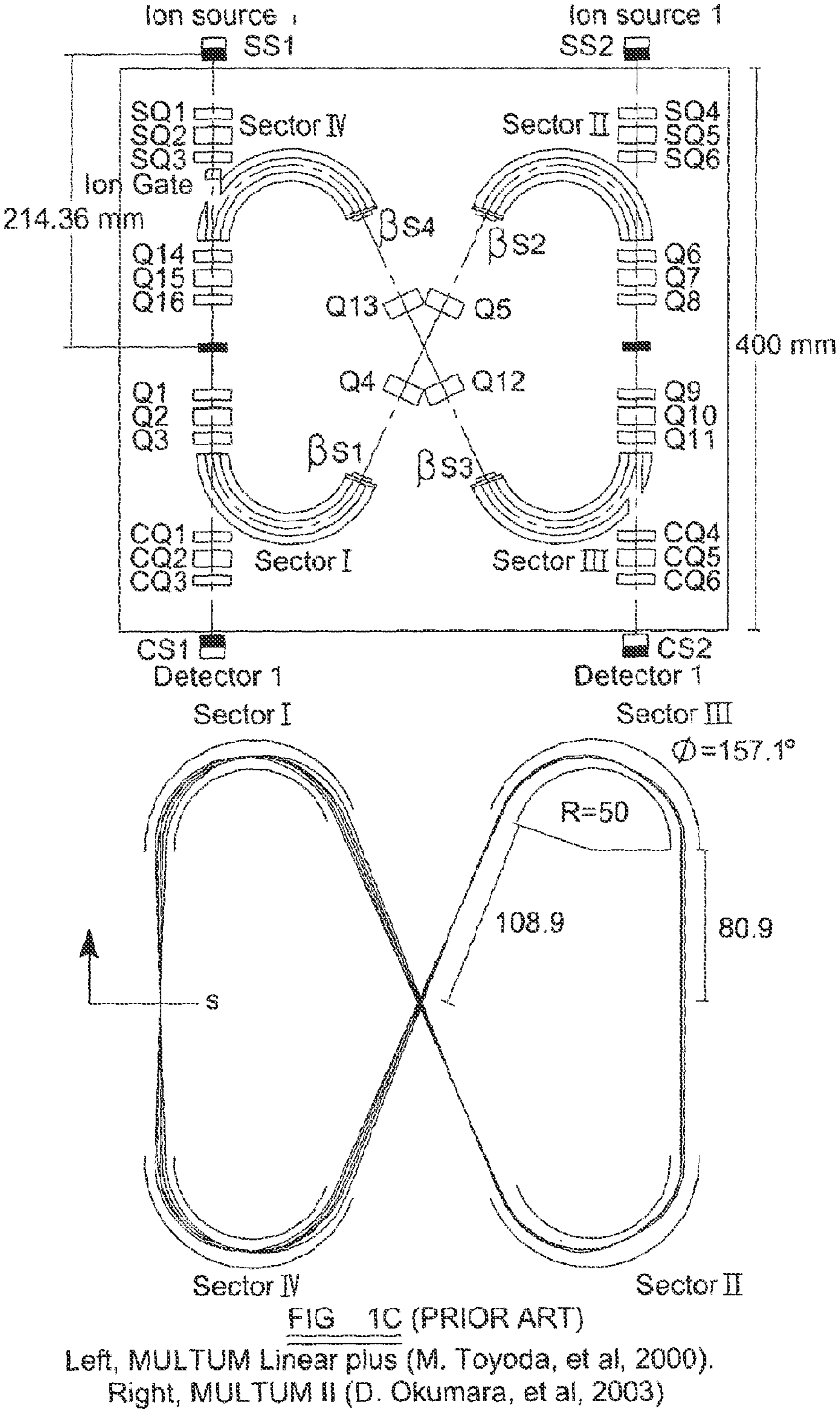
FIG 1C (PRIOR ART)

Unlike the prior art planar design in FIG. 1, the preferred embodiment in FIG. 4C preferably employs lenses $L_1$-$L_4$ (FIG. 4G), voltage settings of which can be used to re-adjust isochronous and transversal focusing properties. Although action of the pair $L_1$-$L_4$ cannot in general be fully decoupled from action of $L_2$, $L_3$ the first pair is preferably mainly used for adjusting lateral focusing of ions with different $\delta y_0$ or $\delta v_{y0}$ around the planar orbit or predetermined 3D trajectory, while the second pair is preferably mainly used for adjusting isochronicity. Availability of such adjustments with $L_1$-$L^4$ is preferred for practical tuning of an instrument since (i) the real dimensions and positioning of the electrodes may be slightly different from those in a computer model, or (ii) a computer model may not be enough accurate, and (iii) preferably it should be possible to adjust the system for different number of turns, and/or different injection and extraction conditions. Focusing action of $L_1$-$L_4$ is preferably the same as that in an Einzel lens, e.g. it is provided by setting a potential on both the electrodes to be either lower or higher than the potential on the reference orbit before and after the lens (FIG. 4C). Employing lenses of different shape or different type is also possible. Table 1 gives an example of geometry parameters realizing the embodiment shown in FIG. 4C.

TABLE 1

Examples of geometry parameters for the preferred embodiment shown in FIG. 3C.

| | |
|---|---|
| Radius of curvature $R_1$ of the planar orbit in sectors $S_1$ and $S_3$, mm | 210 |
| Radius of curvature in the drift direction d of sectors $S_1$ and $S_3$, mm | 132 |
| Deflection angle of $S_1$ and $S_3$ along the planar orbit, deg | 45 |
| Radius of curvature $R_2$ of the planar orbit in sector $S_2$, mm | 87 |
| Deflection angle of $S_2$ along the planar orbit, deg | 90 |
| Distance between $S_2$ and $S_1$ ($S_3$) along the planar orbit, mm | 22 |
| Length of lens $L_1$($L_4$) along the planar orbit, mm | 15 |
| Inner radius of lens L1(L4), mm | 62 |
| Length of lens $L_2$($L_3$) along the planar orbit, mm | 20 |
| Separation of electrodes of $S_1$-$S_3$, $L_1$-$L_4$, mm | 28 |

It is useful to consider a few numerical examples of adjusting isochronous properties of the embodiment with parameters in Table 1 to see which adjustments are feasible and how electrode voltage settings vary from one case to another. Such adjustment cases are summarised in Table 2.

TABLE 2

Example voltage settings for the preferred embodiment shown in FIG. 4C with geometry parameters from Table 1 and ions with kinetic energy 10000 eV. Flight times are given for ions with mass to charge ratio m/q = 1000 Th. The offset of the open 3-d trajectories $\Delta Z_{Offset}$ = 15.9 mm. Focusing in the drift direction is not used in cases 1 and 2.

| | Case | | | |
|---|---|---|---|---|
| | 1 | 2 | 3 | 4 |
| Flight path | 1 turn, internal planar closed orbit | 20.5 turns, internal 3-d open orbit | 20.5 turns, internal 3-d open orbit | 20.5 turns, 3-d open orbit including injection and extraction paths |
| FIG. | — | 14A | — | 14B |
| Isochronicity | Full | Energy and spatial except to $\delta z_0$ | Full | Full |
| ToF, μs | 38.12 | 748.6 | 745.5 | 763.5 |
| $S_{1\ inner}$ ($S_{3\ inner}$), Volt | −1549.4 | −1514.6 | −1519.4 | −1521.4 |
| $S_{1\ outer}$ ($S_{3\ outer}$), Volt | 1004.2 | 1002.0 | 1005.4 | 1006.7 |
| $S_{2\ inner}$, Volt | −2876.0 | −2818.9 | −2825.9 | −2829.6 |
| $S_{2\ outer}$, Volt | 2895.6 | 2833.7 | 2842.4 | 2846.1 |
| $L_1$ ($L_4$), Volt | −847 | −704 | −707 | −707 |
| $L_2$ ($L_3$), Volt | −299 | −319 | −270 | +98 |
| $\Delta V_{drift}$, Volt | 0 | 0 | ±4.9 | ±4.9 |

In the case 1 of Table 2 full (spatial and energy) isochronicity is achieved over 1 turn for the planar closed orbit ($\Delta Z_{Offset}$=0). In the case 2 (FIG. 14A) voltage settings provide energy and partial spatial isochronicity at point 2 after 20.5 turns with respect to initial ions' velocities $\delta v_{y0}$, $\delta v_{z0}$ and coordinates $\delta y_0$ at the start point 1 referenced to a 3-dimensional open trajectory with $\Delta Z_{Offset}$=15.9 mm. Isochronicity with respect to $\delta z_0$ is not maintained. Besides, due to the lack of focusing in the drift direction ions starting with $\delta z_0 \neq 0$ gradually deviate from the reference orbit in the drift direction while they propagate through the system resulting in the beam size growth in this direction with the number of turns (FIG. 14A). To minimize the spread of the flight times, as well as the beam size in the drift direction and hence possible ions losses during extraction, the beam size at the start point 1 in Z-direction is preferably as small as possible. Due to this lack of drift focusing the embodiment in FIG. 4C and other embodiments in FIG. 7-FIG. 10 have limited practical applicability if there are no additional means of focusing in the drift direction. The use of embodiments without drift focusing is limited by cases of sufficiently small beam emittances in the drift direction and sufficiently small multi-turn flight paths. Such systems should preferably have at least one lens in its injection path to minimize the beam size growth during multi-turn motion.

There is a large variety of ways how drift focussing (see definition above) can be achieved. Most generally drift focusing can be provided by periodic or non-periodic variation of the field in the (azimuthal) drift direction. Typically such field variations are substantially weaker than the sector fields guiding ions in the drift plane X-Y. A possibility of adjusting such field variation is preferred, as optimum drift focusing field parameters generally depend on the number of turns and conditions of injection and extraction. Electrodes generating drift focusing potential variation are preferably positioned near vertices of the star-like projection of the reference trajectory on the X-Z drift plane, where adjacent turns of the reference orbit are best separated in the drift direction.

Periodic field variations in the drift direction are preferred as in general they provide better isochronous properties as compared to non-periodic cases. Such variations could be achieved, for example, with one of the following:

Using a set of small electrodes (electrode segments) periodic in the (azimuthal) drift direction (FIG. 13B), wherein a tuneable potential alternating in the drift direction is preferably applied to the electrode segments to adjust drift focusing and isochronous properties related to the drift motion; the periodic electrode segments can for example be either located in the drift space between other electrodes or incorporated into the sector field electrodes or the lens electrodes focusing in X-Y plane. In the latter two cases the said tuneable potential is preferably superimposed over the potentials of the said electrodes.

Modifying geometry of at least one pair of sector field electrodes or lens electrodes such that separation of electrodes in the pair varies periodically in the drift direction.

Incorporating a set of lenses periodic in the drift direction into at least one pair of the sector field electrodes or lens electrodes focusing in X-Y plane, or into a drift space between other electrodes.

Incorporating a set of electrodes producing a non-zero second and/or higher order derivatives of the potential in the drift direction, such derivative being periodic in this direction. Said electrodes can be either incorporated into other electrodes or mounted in the drift space between other electrodes.

Other ways of periodic drift focusing.

Similarly to the periodic drift focusing, non-periodic drift focusing options include one of the following:

Using a set of small electrodes (electrode segments), wherein individual tuneable potentials are applied to the segments to form a slow potential variation in the drift direction to adjust drift focusing and isochronous properties related to the drift motion; or said individual tuneable potentials are applied to selected subsets of said electrode segments to produce local focusing in the drift direction; the electrode segments can be either located in the drift space between other electrodes or incorporated into the sector field electrodes (see e.g. FIG. 13C) or the lens electrodes focusing in X-Y plane. In the latter case the said tuneable potentials are superimposed over the potentials of other said electrodes.

Modifying geometry of at least one pair of sector field electrodes or lens electrodes such that separation of electrodes in the pair gradually varies in the drift direction.

Incorporating at least one lens focusing in the drift direction into at least one pair of the sector field electrodes or lens electrodes focusing in X-Y plane or into a drift space between other electrodes.

Incorporating at least one set of electrodes generating a positive second order derivative of the potential and/or higher order derivatives producing focusing in the drift direction. Such electrodes can be either incorporated into other electrodes or mounted in the drift space between other electrodes.

Other ways of non-periodic drift focusing.

Referring to FIG. 13B, a periodic set of the electrode segments may be preferred as it generally allows one to generate different types of potential variation in the drift direction. By applying individual potentials to selected segments one can achieve either periodic potential variation $\Delta V_{drift}$ on the segments (shown in FIG. 13B), or gradually changing, or localized at some azimuthal positions, etc. In preferred embodiments the segments are incorporated into the electrodes of the sector $S_2$ (FIG. 4F) in the plane of mirror symmetry X-Z at Y=0 (FIG. 4C) where adjacent turns of the reference orbit are best separated in the drift direction. Columns 3 and 4 in Table 2 give two numerical examples illustrating voltage settings at which drift focusing and full isochronicity are achieved in case 2×82 segments of size≈20×17 mm$^2$ (20 mm being extension in Y-direction) are used to generate periodic field variation in the (azimuthal) drift direction superimposed over the potentials of the electrodes $S_2$. Beam focusing in the drift direction can clearly be seen in FIG. 14B showing simulated ion's trajectories. The width of the beam in the drift direction oscillates with the number of turns being limited in the amplitude of such oscillations unlike in the case 2 Table 2 where drift focusing is not used (FIG. 14A). Full isochronicity can also be achieved not only for the internal multi-turn motion from point 2 to point 3 (FIG. 14B), but also including injection and extraction paths prom point 1 to point 4.

Although FIGS. 13A and 13B shows a set of electrode segments positioned periodically in the drift direction, the inventors have found that good results can be achieved with a smaller number of electrode segments (small electrodes, which effectively produce a lens effect) which are positioned non-periodically in the (azimuthal) drift direction.

FIG. 13C shows an outer electrode of the mid-plane sector S2 (see FIG. 4C). In this example, the outer electrode incorporates several small electrodes (electrode segments) positioned non-periodically in the drift plane X-Z to create field variation in the drift direction. In more detail, there are six windows in the outer electrode of the mid-plane sector S2 (although only five can clearly be seen from FIG. 13C). Six drift focusing electrode segments are mounted in these six windows (one per window). The drift focusing electrode segments are preferably isolated from the sector field electrodes of the sector S2 and preferably have a potential (or potentials) from an independent power supply (or several independent power supplies). For the particular example shown in FIG. 13C, there are preferably no drift focusing electrode segments in the inner electrode of the mid-plane sector S2. This is because the inventors have found that drift focusing electrode segments on the outer electrode of a sector can, on their own, provide sufficient drift focusing, without the need for further drift focusing electrode segments on the inner electrode of the sector. An advantage of this is that, in general, it is easier to wire drift focusing electrode segments mounted on an outer electrode compared with drift focusing electrodes mounted on an inner electrode of a sector. In any case, having a reduced number of segment electrodes is usually preferred from the perspective of simplicity.

The above numerical examples are given for illustrative purposes only. To consider more practical cases one has to include into simulations real injection and extraction interfaces including e.g. focusing lenses, beam steering elements and, optionally, deflecting fields. Such interfaces are schematically shown in FIG. 15A-FIG. 15C for the case of injection. In general, they include at least one lens 121 for focussing, at least one element for beam steering 122 and, optionally, deflecting fields 124, 126. Timing properties of an entire system are preferably adjusted to maximize mass resolving power at a detector. There is a certain advantage of optimizing a periodic part of a system (as in FIG. 14A, FIG. 14B) to be energy and spatially isochronous. In such a case timing properties of the rest of the system from an ion source to a TOF detector, excluding a periodic part with multi-turns, can be optimized independently from the periodic part. After the optimization, the periodic part can generally be added at a dedicated position, and a final system is to be slightly readjusted to attain best timing properties at the TOF detector. More generally, a whole system including interfaces and a periodic part is preferably optimized at the TOF detector position. This is useful, if non-spatially isochronous curved interfaces are used (FIG. 15B, FIG. 15C). By optimizing voltage settings of both the periodic part and the interfaces the entire system is preferably able to be adjusted to be spatially and energy isochronous at the TOF detector. For instance, a system comprising periodic part in FIG. 4C, curved injection interface in FIG. 15B and similar (or straight) extraction interface is preferably able to be adjusted to be spatially isochronous. Additionally, energy isochronicity is preferably able to be provided with, for instance, adjusting potentials of the lenses $L_2$-$L_3$. Even more generally, timing properties at a TOF detector is preferably able to be optimized using variable parameters of an entire system including initial beam and ion source parameters.

Summarizing, timing properties of MT-TOF MS are preferably adjusted so that one of the preferred following requirements is satisfied:

multi-turn motion of ions along a 3-dimentional reference trajectory inside MT-TOF is spatially isochronous between two internal start and end points;

multi-turn motion of ions along a 3-dimentional reference trajectory inside MT-TOF is spatially and energy isochronous between two internal start and end points;

motion of ions from a start point to an end point along a predetermined 3D reference trajectory including the multi-turn part of MT-TOF and at least one of the interfaces (injection or extraction or both) is spatially and energy isochronous;

motion of ions satisfies the previous requirements and is energy isochronous to the $2^{nd}$ order of Taylor expansion;

MT-TOF settings are optimized to achieve minimum time of flight spreads at an end point;

In all the above cases a TOF detector is preferably positioned at the end point, while the start point is located at or inside an ion source.

The use of lenses in the injection interface may help to shape beam transversal phase spaces ($\delta y_0$, $\delta v_{y0}$) and ($\delta z_0$, $\delta v_{z0}$) at some point before multi-turns, e.g. to minimize higher order aberrations contributing to spread of flight times after the multi-turns. For example, in the preferred embodiment in FIG. 4C lenses in an injection interface preferably provide minimum $\delta z_0$ (at the expense of large $\delta v_{z0}$) and minimum $\delta v_{y0}$ (at the expense of large $\delta y_0$) at the point 2 in FIG. YB. Or, in other words, lenses of the injection interface preferably provide matching of transversal beam emittances with respective MT-TOF acceptances to achieve minimum spread of flight times at an isochronous point after multi-reflections.

The number of turns and hence the flight time of ions in an MT-TOF can be changed by changing the number of passes in the drift direction or the number of turns per one such a pass or both. A multi-pass mode is preferably used in case of mass measurements with an image current detector. Alternatively, a multi-pass mode could for example be used for TOF mass measurements with a limited mass range. Referring to FIG. 15E, to inject (extract) ions an injection (extraction) part of sector field electrodes is preferably made electrically independent from the main part of the electrodes. Ions are preferably injected or extracted through a small gridded window made in the injection (extraction) parts. During injection, potentials on the injection electrodes preferably allow ions to enter the system through the window. Similarly, during extraction, potentials preferably allow ions to exit the system. To trap ions in an MT-TOF after injection and make them perform multi-passes in the drift direction the injection (extraction) electrodes are preferably switched to the potentials of the main electrodes before ions approach them during their first drift in azimuthal direction.

The electric sector field near the injection or extraction area may be distorted due to termination of the electrodes in azimuthal direction. Ions after one turn after injection (or one turn before extraction) may pass in the region of such distorted field (FIG. 15A). Timing properties of ion bunches can be deteriorated, if the field distortions are high. To compensate for this a fringe field corrector may be placed between trajectories of injected ions and those after one turn. Referring to FIG. 13D, one such corrector can be produced as a set of wire tracks on a printed circuit board (PCB), each track being at an individual potential. Distribution of potentials over the wires could for example be defined by a resistor chain dividing potential difference between the two main sector field electrodes. Another embodiment of a fringe field corrector is a high resistance conductive material electrically connected to the main sector field electrodes.

When a single-pass drift is used then ions are extracted through the first met extraction electrodes, all the potentials on the injection and extraction electrodes are preferably static and allow injection and extraction. In such an embodiment the number of turns can still be varied by changing the offset $\Delta Z_{Offset}$ (FIG. 14A, FIG. 14B) of the injected ions. Referring to FIG. 16A, beam steering elements 122 could be used to vary $\Delta Z_{Offset}$, so that larger number of turns per pass can be achieved at smaller offsets. If periodic drift focusing is used, then period and phase of field variation in the drift direction preferably matches positioning of a new predetermined 3D reference trajectory in azimuthal direction to achieve required focusing effect. As an alternative, at fixed period and phase of the field variation, only a limited number of predetermined 3D reference trajectories matching the field variation may be used, for which drift focusing is achieved.

Referring to FIG. 16B, the ions' drift in azimuthal direction can be reversed with two 'reverse deflectors' 131 preferably placed mirror symmetrically about plane X-Z in the top and bottom parts of the MT-TOF. The deflectors preferably make ions drift clockwise, if before them they were drifting counter clockwise and vice versa. As a result ions pass the azimuthal angle twice in forward and backward directions. Although projections of the 3D reference trajectories on plane X-Z for the forward and backward passes may be the same, or almost the same, in general, the real 3D reference trajectories are different, with the pieces of the trajectory located below the mid-plane at Y=0 during the direct pass being located above the mid-plane at Y=0 on the reverse pass and vice versa.

Alternatively, the drift motion can be reversed with a single pair of deflecting plates 132 placed in the mid-plane at Y=0 (FIG. 16B). However, the use of deflecting plates 132 placed in the (X-Z) mid-plane is not preferred, as it has been found to produce a relatively poor mass resolving power compared with having reverse deflectors 131 placed mirror symmetrically about the X-Z plane.

A mass analyser having the one or more reverse deflectors may be configured to operate in any one or more of the following modes of operation:

- an "OFF" mode in which the one or more reverse deflectors are turned off,
- an "ON" mode in which the one or more reverse deflectors are turned on;
- a "mixed" mode, in which the one or more reverse deflectors are turned off (from an on state) or on (from an off state) part way through a cycle of the mass analyser, so that the drift direction of a first portion of ions produced during the cycle is reversed and a drift direction of a second portion of ions produced during the cycle is not reversed.

A preferred implementation of a "mixed" mode is to turn the one or more reverse deflectors off (from an on state) part way through a cycle of the mass analyser. In this case, the drift direction of a first portion of ions (which will in general be lighter, faster ions) will be reversed whereas the drift direction of a second portion of ions (which will in general be heavier, slower ions) will not be reversed. The second portion of (heavier) ions can therefore be extracted in the forward direction (i.e. a first direction of extraction for non-reversed ions), with the first portion of (lighter) ions being extracted in the reverse direction (i.e. a second direction of extraction for reversed ions). An advantage of a "mixed" mode is that it can be used to shorten the flight path of heavier (i.e. slower) ions (this will usually be at the expense of a reduction in mass resolving power for those ions), which allows for each cycle of the mass analyser to be shorter. In a "mixed" mode, a small portion of ions would usually be lost during switching of the reverse deflectors.

Here, a "cycle" of the mass analyser can be viewed as the period of time during which a bunch of ions (produced by an ion source) passes through the mass analyser.

Referring to FIG. 9C, FIG. 9D, another preferred embodiment with O-type planar closed orbits can be obtained by swapping axes X and Y in FIG. 4C and then rotating the planar electrodes around the new Y axis. Similarly to the embodiment in FIG. 9A, FIG. 9B, it preferably comprises sector electrodes $S_1$ and $S_2$ and lenses $L_1$ and $L_2$ rotationally symmetric around Y axis. To simplify the design the electrodes of sector $S_2$ are preferably made spherically symmetric. Geometry parameters as well as voltage settings are adjusted to make the system spatially and energy isochronous for a predetermined 3D reference trajectory (FIG. 9D).

Referring to FIG. 8A, FIG. 8B and FIG. 10A, FIG. 10B, other preferred embodiments with a figure-of-eight planar dosed orbits can be obtained by rotating respective planar electrodes. To adjust isochronous and focusing properties of such systems they include lens electrodes focusing in the bending direction and the drift direction, analogous to those described above. The embodiments of FIG. 8A, FIG. 8B and FIG. 10A, FIG. 10B have a "waist" in the middle with high density of ions' trajectories. Image current pick-up electrodes could preferably be installed near the waist to minimize their size and hence improve signal-to-noise ratio.

When used in this specification and claims, the terms "comprises" and "comprising", "including" and variations thereof mean that the specified features, steps or integers are included. The terms are not to be interpreted to exclude the presence of other features, steps or integers.

The features disclosed in the foregoing description, or in the following claims, or in the accompanying drawings, expressed in their specific forms or in terms of a means for performing the disclosed function, or a method or process for obtaining the disclosed results, as appropriate, may, separately, or in any combination of such features, be utilised for realising the invention in diverse forms thereof.

While the invention has been described in conjunction with the exemplary embodiments described above, many equivalent modifications and variations will be apparent to those skilled in the art when given this disclosure, without departing from the broad concepts disclosed. It is therefore intended that the scope of the patent granted hereon be limited only by the appended claims, as interpreted with reference to the description and drawings, and not by limitation of the embodiments described herein.

The following statements provide general expressions of the disclosure herein.

A. A multi-turn time-of-flight electrostatic mass analyzer comprising:
- a) a set of planar electrodes forming a two-dimensional electrostatic field in X-Y plane, wherein said electrode set comprises at least one electrostatic sector deflecting ions in said X-Y plane and at least one lens; and
- b) wherein said electrode sets are adjusted to provide a dosed orbit in said X-Y plane, along which ions can move undergoing stable oscillations in said X-Y plane in the direction locally orthogonal [transverse] to said closed orbit; and
- c) wherein said electrode sets are adjusted to provide isochronous motion of ions along said closed orbit in said X-Y plane relative to initial transverse velocities and spatial coordinates of ions to at least first order of Taylor expansion; and
- d) preferably wherein said electrode sets can be adjusted to provide isochronous motion of ions in said X-Y plane relative to initial longitudinal velocities of ions to at least first order of Tailor expansion;
- e) wherein said electrode sets extend in a third drift direction (Z) and curved at constant curvature radii around a common axis in said X-Y plain to form a 3-dimentional field region allowing a slow drift of ions in said Z-direction along an open reference trajectory with drift velocities substantially smaller than velocities of said isochronous periodic motion of ions in said X-Y plane; and
- f) wherein said electrode sets are adjusted to provide isochronicity at an end point of said open reference trajectory relative to longitudinal velocities of ions at a start point of said open reference trajectory to at least first order of Taylor expansion;

B. An analyzer as in statement A, wherein said dosed orbits do not cross said common axis.

C. An analyzer as in statement A, wherein said closed orbits cross said common axis at a single point.

D. An analyzer as in statement A, wherein said closed orbits cross said common axis at two points.

E. An analyzer as in statement A, wherein said closed orbits cross said common axis at three or more points.

F. An analyzer as in any of statements B to E, wherein said planar electrodes and voltage settings have mirror symmetry with respect to a symmetry plane defined by said axis X and said axis Z, said axis Y being said common axis.

G. An analyzer as in statement F, wherein said at least one said electrostatic sector cross said mirror symmetry plane.

H. An analyzer as in any of statements B to G, wherein said planar electrodes are arranged rotationally symmetric around said common axis.

I. An analyzer as in any of statements B to G, wherein said planar electrodes do not form closed field region in said drift direction.

J. An analyzer as in any of statements B to I, wherein said electrode sets are adjusted to provide isochronicity at said end point of said open reference trajectory relative to longitudinal velocities of ions at said start point of said open reference trajectory to at least second order of Taylor expansion;

K. An analyzer as in any of statements A to J, wherein at least one set of electrodes is split in said drift direction into a plurality of smaller electrodes (segments) to provide variation of electrostatic field along said drift direction for the purpose of spatial focusing of ions in said drift direction.

L. An MT-TOF mass spectrometer comprising an electrostatic mass analyzer as in any of statements A to K and further comprising:
- a) at least one ion source; and
- b) means of forming short ion bunches for pulsed injection into said mass analyzer; and
- c) at least one ion detector measuring time of flight of ions; and
- d) interfaces connecting said analyzer with said at least one ion source and said at least one ion detector.

M. An electrostatic ion-trap mass spectrometer comprising an electrostatic mass analyzer as in any of claims A to K and further comprising:
- e) at least one ion source; and
- f) means of forming short ion bunches for pulsed injection into said mass analyzer; and
- g) means of trapping ions in said ion-trap mass spectrometer; and
- h) image current detection means inducing least one image current detector capable of generating mass spectrum; and
- i) an interface connecting said analyzer with said at least one ion source.

N. An electrostatic ion-trap mass spectrometer according to statement M further comprising means of said MT-TOF mass spectrometer according to statement L and capable of measuring time of flight of ions.

The invention claimed is:

1. A mass analyser for use in a mass spectrometer, the mass analyser having:

a set of electrodes including electrodes arranged to form at least one electrostatic sector, the set of electrodes being spatially arranged to be capable of providing an electrostatic field in a reference plane suitable for guiding ions along a closed orbit in the reference plane, wherein the set of electrodes extend along a drift path that is locally orthogonal to the reference plane, wherein the drift path curves around a reference axis included in the reference plane, so that, in use, the set of electrodes provide a 3D electrostatic field region;

wherein the mass analyser is configured so that, in use, the 3D electrostatic field region provided by the set of electrodes guides ions having different initial coordinates and velocities along a single predetermined 3D reference trajectory that curves around the reference axis.

2. A mass analyser according to claim 1, wherein the set of electrodes is configured to provide spatial and/or energy isochronicity for ions travelling along the 3D reference trajectory between a start point of the 3D reference trajectory and an end point of the 3D reference trajectory.

3. A mass analyser according to claim 1, wherein the set of electrodes includes electrodes configured to provide drift focussing to focus ions in the drift direction at one or more locations along the predetermined 3D reference trajectory.

4. A mass analyser according to claim 3, wherein the electrodes configured to provide drift focussing include any one or more of:

focussing lenses;

a set of periodic or non-periodic lenses incorporated into or between electrodes of at least one electrostatic sector;

a set of electrodes positioned periodically or non-periodically in a drift direction defined as a local direction of rotation about the reference axis;

a pair of rotationally symmetric electrodes split into a number of small segments in a drift direction defined as a local direction of rotation about the reference axis; and/or a means of producing an electrostatic field whose potential has a non-zero second order derivative and/or higher order derivatives producing focusing in a drift direction defined as a local direction of rotation about the reference axis.

5. A mass analyser according to claim 1, wherein the closed orbit in the reference plane:

crosses the reference axis at a single point;

crosses the reference axis at two points; or crosses the reference axis at three or more points.

6. A mass analyser according to claim 1, wherein the set of electrodes and voltage settings of the set of electrodes has mirror symmetry with respect to a mid-plane orthogonal to the reference axis.

7. A mass analyser according to claim 1, wherein the set of electrodes include electrodes arranged to form at least one electrostatic sector that crosses the mid-plane.

8. A mass analyser according to claim 1, wherein the mass analyser is configured to have:

a multi pass mode of operation in which ions are guided along a predetermined 3D reference trajectory, which has a closed portion, with the ions repeating the closed portion of the predetermined 3D reference trajectory multiple times; and/or a quasi multi pass mode in which ions are guided along an open predetermined 3D reference trajectory, with the ions repeating a portion of the open predetermined 3D reference trajectory multiple times, with each repeated portion being rotated by a small angle around the reference axis with respect to a previous and/or next repeated portion.

9. A mass analyser according to claim 1, wherein the mass analyser has one or more deflectors configured to, in use, reverse the drift of the ions around the reference axis.

10. A mass analyser according to claim 1, wherein the mass analyser has at least one fringe field corrector configured to compensate for electrostatic field distortions caused by termination of the set of one or more electrodes in an area where ions enter and/or leave the mass analyser.

11. A mass analyser according to claim 10, wherein the or each fringe field corrector includes:

a set of wire tracks on a printed circuit board, each track having a respective individual potential, e.g. with the distribution of potentials over the wire tracks being defined by a resistor chain dividing potential difference between two electrodes of an electrostatic sector whose electrostatic field is to be corrected; or a high resistance conductive material electrically connected to two main electrodes of an electrostatic sector whose electrostatic field is to be corrected.

12. A method of configuring a mass analyser having:

a set of electrodes including electrodes arranged to form at least one electrostatic sector, the set of electrodes being spatially arranged to be capable of providing an electrostatic field in a reference plane suitable for guiding ions along a closed orbit in the reference plane, wherein the set of electrodes extend along a drift path that is locally orthogonal to the reference plane, wherein the drift path curves around a reference axis included in the reference plane, so that, in use, the set of electrodes provide a 3D electrostatic field region;

wherein the method includes:

configuring the mass analyser so that, in use, the 3D electrostatic field region provided by the set of electrodes guides ions having different initial coordinates and velocities along a single predetermined 3D reference trajectory that curves around the reference axis.

13. A method according to claim 12, wherein configuring the mass analyser includes:

adjusting the set of electrodes to provide isochronicity for ions travelling along a closed orbit in the reference plane; and further adjusting the set of electrodes to provide isochronicity for ions travelling along the 3D reference trajectory between a start point of the 3D reference trajectory and an end point of the 3D reference trajectory.

14. A method of operating a mass analyser, the method including:

providing a 3D electrostatic field region using a set of electrodes including electrodes arranged to form at least one electrostatic sector, the set of electrodes being spatially arranged to be capable of providing an electrostatic field in a reference plane suitable for guiding ions along a closed orbit in the reference plane, wherein the set of electrodes extend along a drift path that is locally orthogonal to the reference plane and that curves around a reference axis;

guiding ions having different initial coordinates and velocities along a single predetermined 3D reference trajectory that curves around the reference axis.

15. A mass spectrometer having:

an ion source for producing ions having different initial coordinates and velocities;

a mass analyser;

ions from the mass analyser to an ion detector;

an ion detector for detecting ions produced by the ion source after they have travelled along the single predetermined 3D reference trajectory;

a processing apparatus for acquiring mass spectrum data representative of the mass/charge ratio of ions produced by the ion source based on an output of the ion detector;

wherein the mass analyser has a set of electrodes including electrodes arranged to form at least one electrostatic sector, the set of electrodes being spatially arranged to be capable of providing an electrostatic field in a reference plane suitable for guiding ions along a closed orbit in the reference plane, wherein the set of electrodes extend along a drift path that is locally orthogonal to the reference plane, wherein the drift path curves around a reference axis included in the reference plane, so that, in use, the set of electrodes provide a 3D electrostatic field region;

wherein the mass analyser is configured so that, in use, the 3D electrostatic field region provided by the set of electrodes guides ions having different initial coordinates and velocities along a single predetermined 3D reference trajectory that curves around the reference axis.

16. A mass spectrometer according to claim 15, wherein the injection interface and/or extraction interface include any one or more of:

multipole lenses;

focussing lenses;

deflectors;

for focussing, deflecting, and/or shifting ions produced by the ion source.

17. A mass spectrometer according to claim 15, wherein the ion source includes a vacuum ionisation source or an atmospheric pressure ion source.

18. A mass spectrometer according to claim 15, wherein:

the mass spectrometer is a TOF mass spectrometer;

the ion detector includes a time of flight ion detector for producing an output representative of the time of flight through the mass analyser of ions produced by the ion source; and the processing apparatus is for acquiring mass spectrum data representative of the mass/charge ratio of ions produced by the ion source based on an output of the TOF ion detector.

19. A mass spectrometer according to claim 15, wherein:

the mass spectrometer is an E-Trap mass spectrometer;

the ion detector includes an image current ion detector for producing an output representative of an image current caused by ions produced by the ion source; and the processing apparatus is for acquiring mass spectrum data representative of the mass/charge ratio of ions produced by the ion source based on an analysis of the output representative of an image current caused by ions produced by the ion source.

20. A mass spectrometer according to claim 15, wherein the mass spectrometer includes an injection interface for guiding ions produced by the ion source into the mass analyser, wherein the injection interface is configured to guide ions produced by the ion source to a location within the 3D electrostatic field region that is offset from the reference plane such that the ions are subsequently guided by the 3D electrostatic field along the predetermined 3D reference trajectory.

21. A mass spectrometer according to claim 15, wherein the mass spectrometer includes an injection interface for guiding ions produced by the ion source into the mass analyser.

22. A mass spectrometer according to claim 15, wherein the mass spectrometer includes an extraction interface for guiding ions from the mass analyser to an ion detector.

* * * * *